US009854693B2

United States Patent
Seo et al.

(10) Patent No.: US 9,854,693 B2
(45) Date of Patent: Dec. 26, 2017

(54) REAR COVER AND DISPLAY APPARATUS INCLUDING THE SAME

(71) Applicant: LG Electronics Inc., Seoul (KR)

(72) Inventors: Minji Seo, Seoul (KR); Choongsuk Park, Seoul (KR); Hyeoncheol Song, Seoul (KR); Junki Kim, Seoul (KR); Soohong An, Seoul (KR); Ahreum Lee, Seoul (KR); Gwangwon Lee, Seoul (KR); Jinsu Kim, Seoul (KR); Jihoon Yoon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 279 days.

(21) Appl. No.: 14/156,185

(22) Filed: Jan. 15, 2014

(65) Prior Publication Data
US 2014/0240906 A1    Aug. 28, 2014

(30) Foreign Application Priority Data

| Jan. 24, 2013 | (KR) | 10-2013-0008153 |
| Apr. 25, 2013 | (KR) | 10-2013-0045797 |
| Oct. 1, 2013 | (KR) | 10-2013-0117521 |
| Nov. 21, 2013 | (KR) | 10-2013-0142411 |

(51) Int. Cl.
| H05K 7/00 | (2006.01) |
| H05K 5/00 | (2006.01) |
| H05K 5/03 | (2006.01) |
| A47B 81/06 | (2006.01) |
| G06F 1/16 | (2006.01) |
| H04M 1/02 | (2006.01) |

(52) U.S. Cl.
CPC ............. *H05K 5/03* (2013.01); *A47B 81/06* (2013.01); *G06F 1/1601* (2013.01); *G06F 1/1637* (2013.01); *G06F 1/1652* (2013.01); *H04M 1/0268* (2013.01); *H05K 5/0017* (2013.01)

(58) Field of Classification Search
CPC ........................................................ H05K 5/03
USPC .................................... 361/679.01–679.03
See application file for complete search history.

(56) References Cited

U.S. PATENT DOCUMENTS

| 4,729,183 A | 3/1988 | Tarter et al. |
| 2008/0018631 A1* | 1/2008 | Hioki ............... G02F 1/133305 345/206 |
| 2008/0212271 A1 | 9/2008 | Misawa |
| 2012/0062447 A1 | 3/2012 | Tseng et al. |
| 2012/0262870 A1 | 10/2012 | Leung |
| 2012/0307423 A1* | 12/2012 | Bohn ................... G06F 1/1641 361/679.01 |
| 2013/0155655 A1* | 6/2013 | Lee ......................... H05K 5/03 362/97.1 |

(Continued)

FOREIGN PATENT DOCUMENTS

| CN | 101542627 A | 9/2009 |
| CN | 201741122 U | 2/2011 |
| EP | 1635313 A2 | 3/2006 |

(Continued)

*Primary Examiner* — Jerry Wu
(74) *Attorney, Agent, or Firm* — Dentons US LLP

(57) ABSTRACT

A display apparatus includes a display module for displaying an image, a variable member for varying a shape of the display module, and a rear cover disposed at a rear surface of the display module and varying with the varying shape of the display module.

13 Claims, 36 Drawing Sheets

(56) References Cited

U.S. PATENT DOCUMENTS

2013/0276679 A1* 10/2013 Kroeplien ................. A47F 7/00
                                                        109/73
2014/0003006 A1*  1/2014 Ahn ..................... G06F 1/1679
                                                       361/749

FOREIGN PATENT DOCUMENTS

| EP | 2546720 A2 | 1/2013 |
| EP | 2546721 A2 | 1/2013 |
| JP | 02199497 A | 8/1990 |
| WO | 2012008033 A1 | 1/2012 |

* cited by examiner

FIG. 7
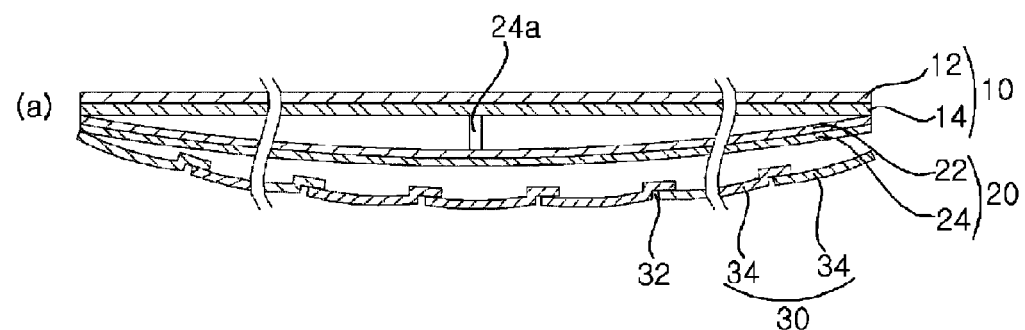
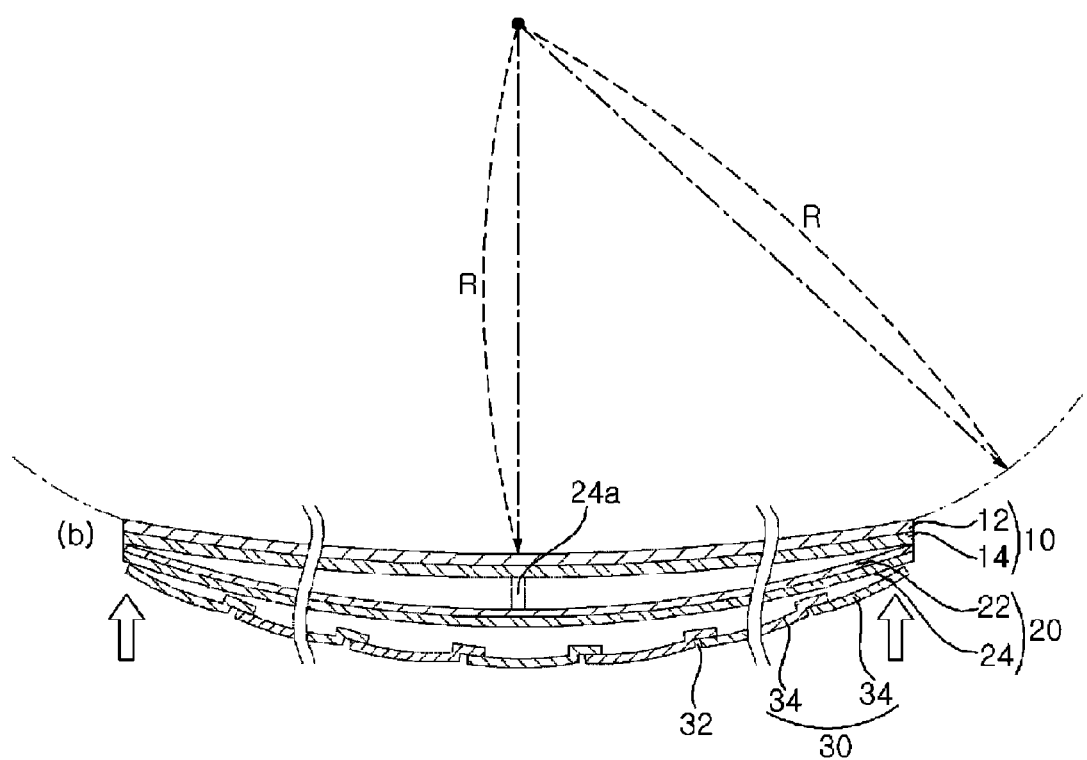

FIG. 21
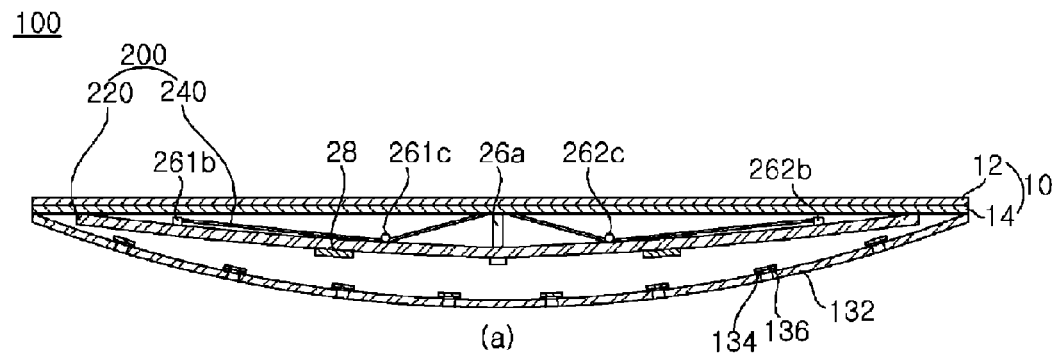
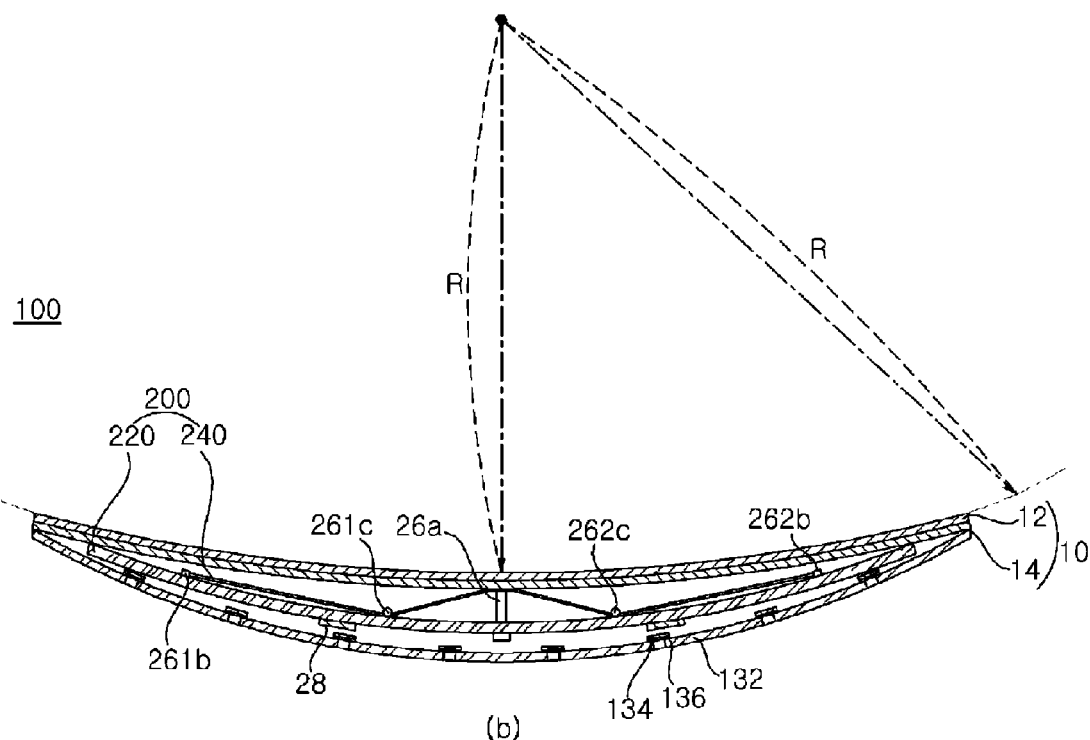

FIG. 34
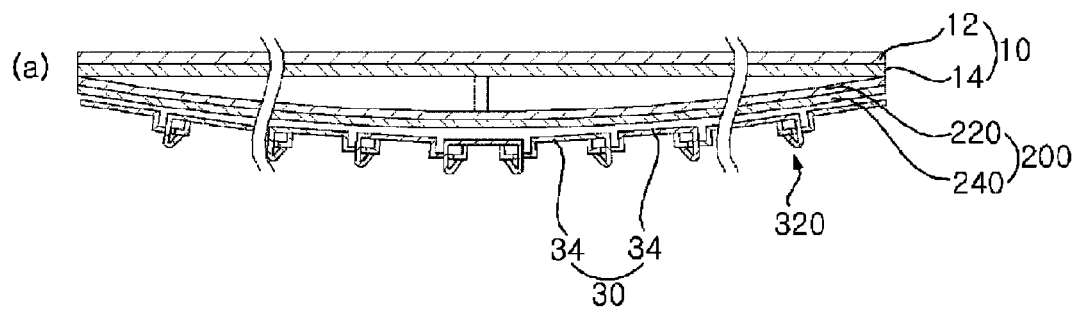
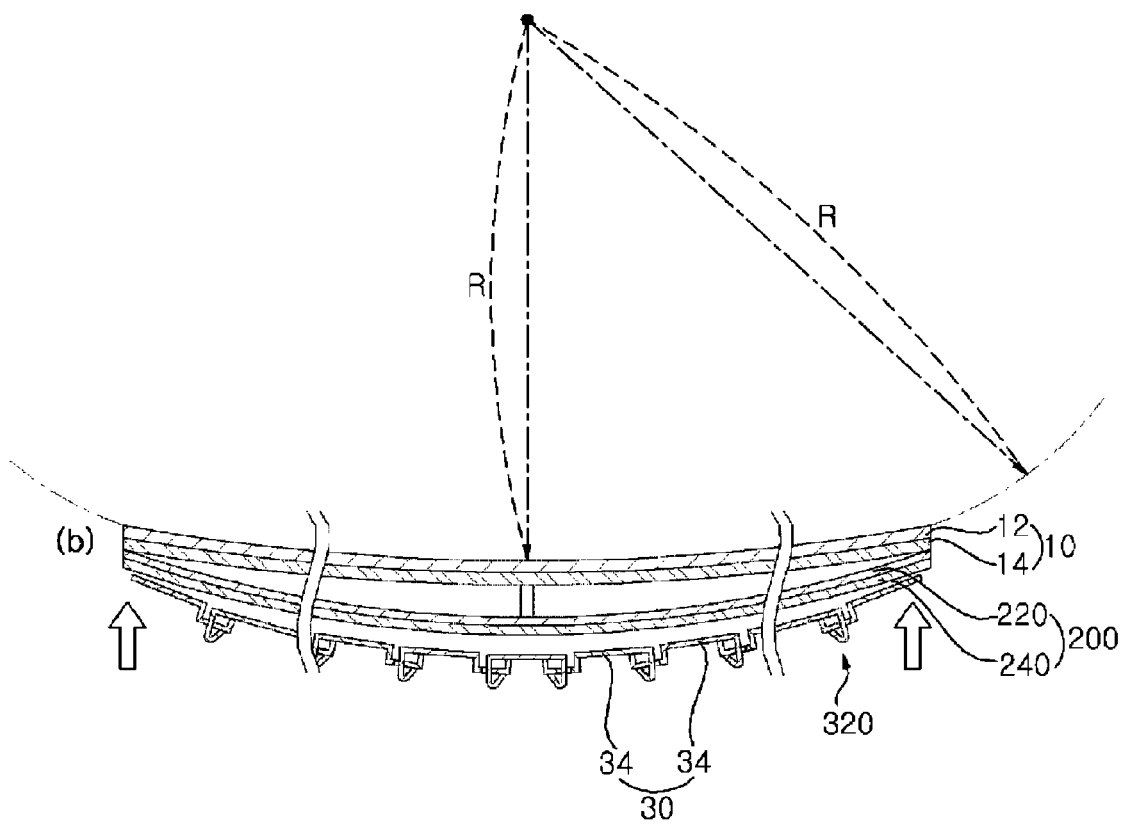

FIG. 43
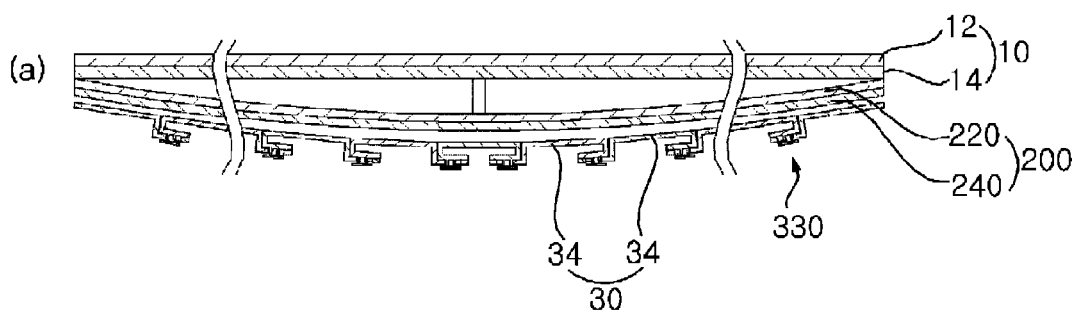
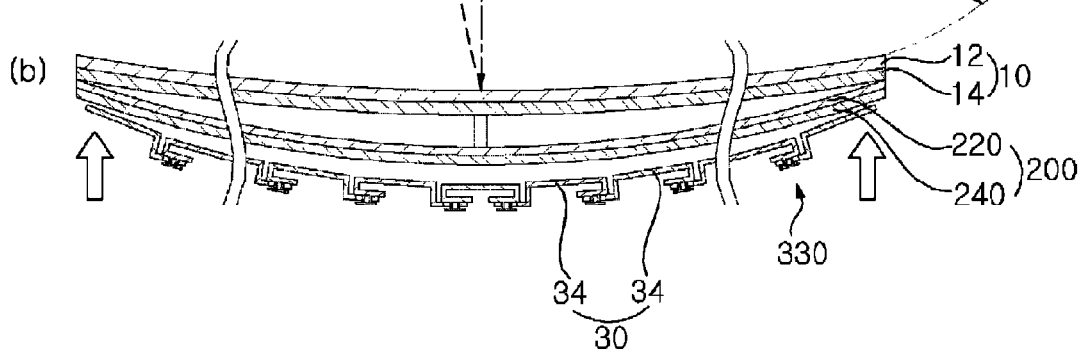

REAR COVER AND DISPLAY APPARATUS INCLUDING THE SAME

CROSS-REFERENCE TO RELATED APPLICATION

This application claims the priority benefit of Korean Patent Application No. 10-2013-0008153, filed on Jan. 24, 2013, Korean Patent Application No. 10-2013-0045797, filed on Apr. 25, 2013, Korean Patent Application No. 10-2013-0117521, filed on Oct. 1, 2013 and Korean Patent Application No. 10-2013-0142411, filed on Nov. 21, 2013, in the Korean Intellectual Property Office, the disclosure of which is incorporated herein by reference.

BACKGROUND

1. Field of the Disclosure

The present disclosure relates to a rear cover and a display apparatus including the same, and more particularly to a rear cover designed to appropriately cover a display module with an improved structure and a display apparatus including the same.

2. Description of the Related Art

Various types of display apparatuses are used to display images. For example, there are various displays such as a liquid crystal display panel, a plasma display panel, and an organic light emitting diode display panel.

In accordance with recent expansion of application fields of display apparatuses, diverse characteristics of display apparatuses have been required in the application fields. In particular, such requirements have been increased in association with characteristics related not only to simple display of images, but also to display of images taking into consideration three-dimensional effects and sensory immersion. In order to meet such various requirements, research is being conducted to provide various display apparatuses having improved structures.

SUMMARY

Therefore, one object is to provide a rear cover easily variable in shape in accordance with an improved structure of a display module, and a display apparatus including the same.

In accordance with one aspect, the above and other objects may be accomplished by the provision of a display apparatus including a display module for displaying an image, a variable member for varying a shape of the display module, and a rear cover disposed at a rear surface of the display module and varying with the varying shape of the display module.

In one aspect, the rear cover comprises a plurality of divided sections defined by divided portions.

In accordance with another aspect, there is provided a rear cover forming a rear surface of a display apparatus, including a plurality of divided sections defined by divided portions.

BRIEF DESCRIPTION OF THE DRAWINGS

The above and other objects, features and other advantages will be more clearly understood from the following detailed description taken in conjunction with the accompanying drawings, in which:

FIGS. 7(a) and 7(b) are views explaining shape variation of the display apparatus according to an exemplary embodiment of the present invention;

FIGS. 21(a) and 21(b) are views explaining shape variation of the display apparatus illustrated in FIG. 17;

FIGS. 34(a) and 34(b) are views explaining shape variation of the display apparatus according to an exemplary embodiment of the present invention;

FIGS. 43(a) and 43(b) are views explaining shape variation of the display apparatus according to an exemplary embodiment of the present invention.

DETAILED DESCRIPTION OF THE PREFERRED EMBODIMENTS

Figure 1:
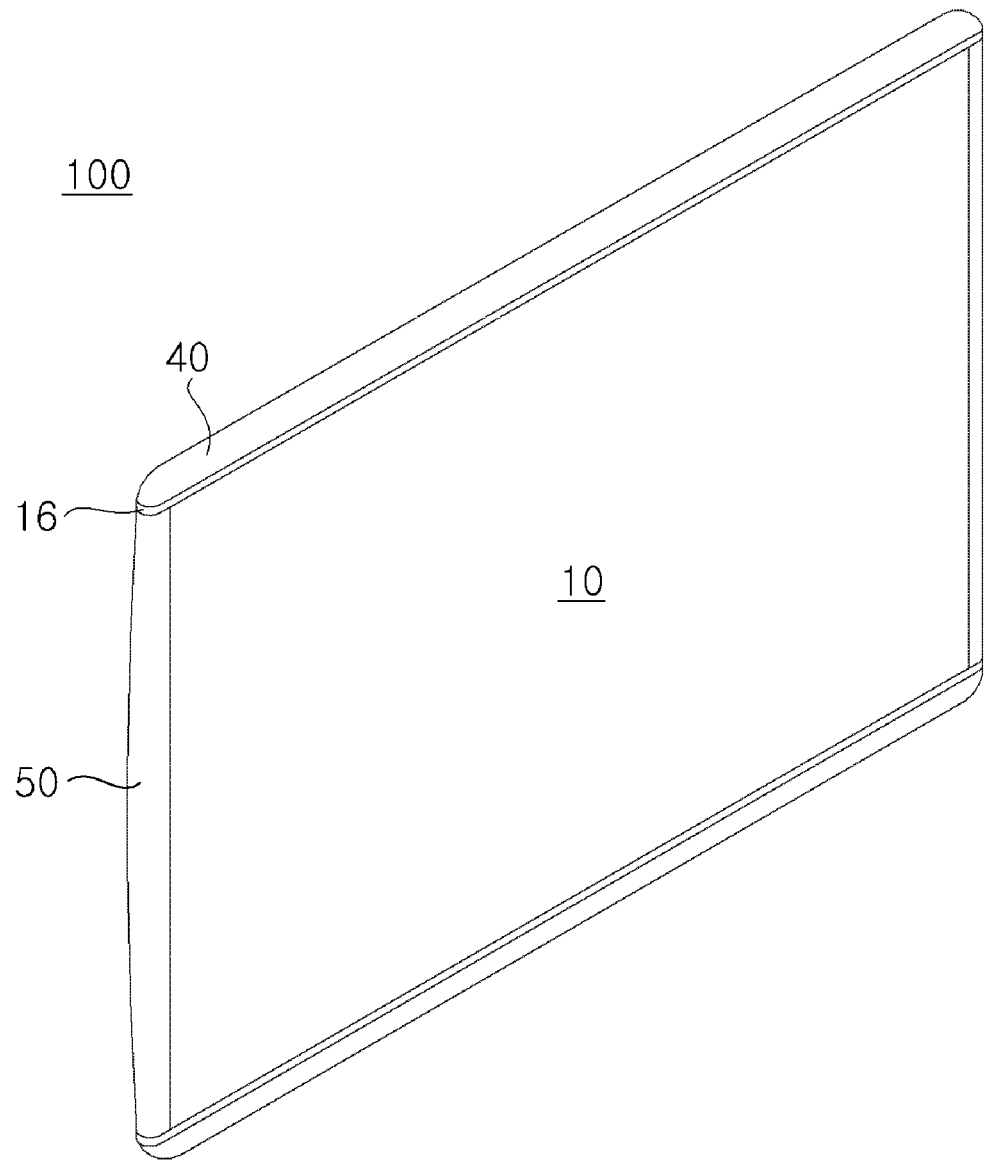
FIG. 1 is a front perspective view of a display apparatus according to an exemplary embodiment of the present invention.

Reference will now be made in detail to preferred embodiments of the present invention, examples of which are illustrated in the accompanying drawings. These embodiments are not intended to limit the present invention. Other embodiments may also be provided.

Constituent elements other than elements constituting essential features of the present invention may be omitted from the drawings, for clarity of description. Like reference numerals refer to like elements throughout. In the drawings, the widths, thicknesses, and etc., of constituent elements may be exaggerated or reduced for clarity and convenience of illustration. The present invention is not limited to the illustrated thicknesses, widths, and etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the embodiments, it will be understood that when a layer (or film), a region, a pad, a pattern or a structure is referred to as being disposed 'on/above/over' another layer, region, pad, pattern or structure, it can be directly in contact with another layer, region, pad, pattern or structure, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Hereinafter, a display apparatus according to an exemplary embodiment of the present invention will be described in detail with reference to the accompanying drawings.

Figure 2:
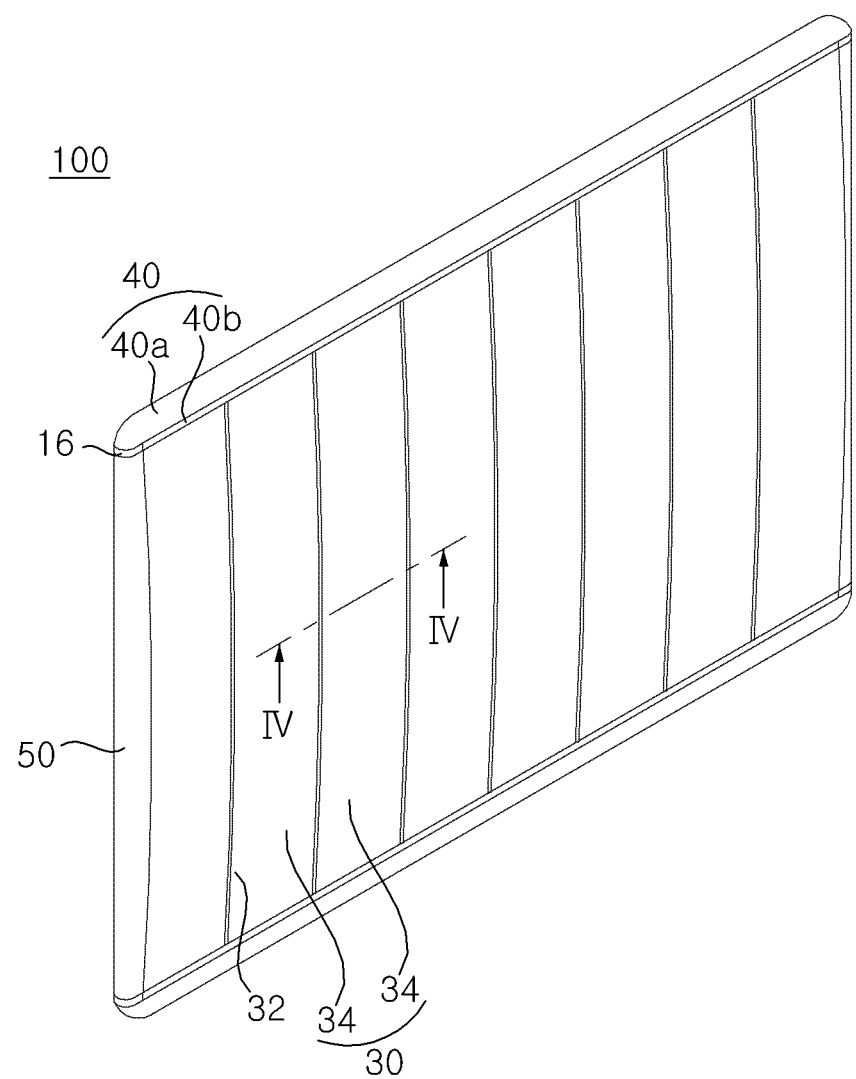
FIG. 2 is a rear perspective view of the display apparatus according to an exemplary embodiment of the present invention.
Figure 3:
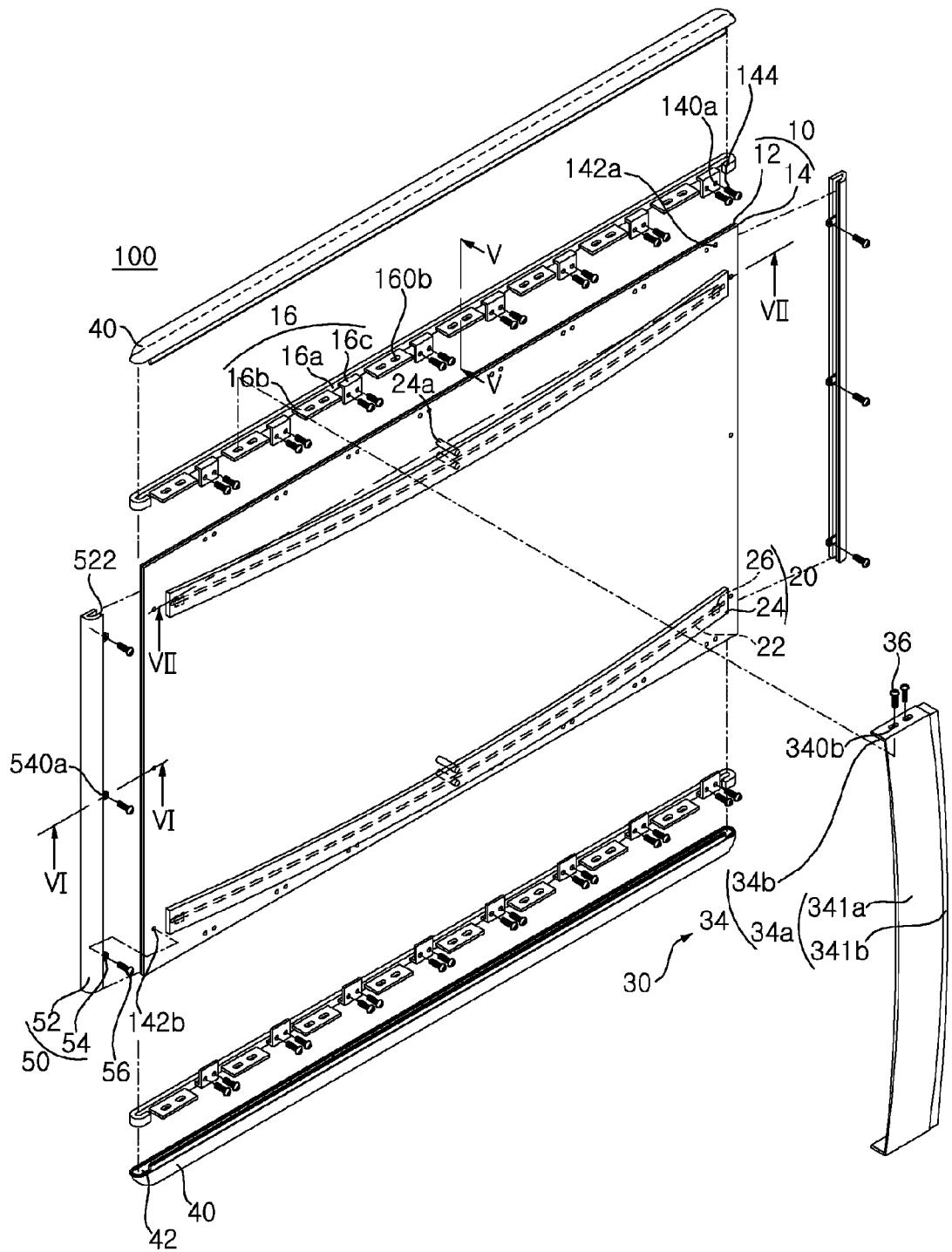
FIG. 3 is an exploded perspective view illustrating a part of the display apparatus according to an exemplary embodiment of the present invention.

FIG. 1 is a front perspective view of a display apparatus according to an exemplary embodiment of the present invention. FIG. 2 is a rear perspective view of the display apparatus according to an exemplary embodiment of the present invention. FIG. 3 is an exploded perspective view illustrating a part of the display apparatus according to an exemplary embodiment of the present invention.

Referring to FIGS. 1 to 3, the display apparatus of the illustrated embodiment, which is designated by reference numeral "100", includes a display module 10 for displaying an image, a variable member 20 for varying the shape of the display module 10, and a rear cover 30 disposed at a rear surface of the display module 10. The rear cover 30 includes a plurality of divided sections 34 defined by divided portions 32. Accordingly, the shape of the rear cover 30 is easily variable when the shape of the display module 10 is varied by the variable member 20. This will be described in more detail.

The display module 10 includes a display panel 12 for displaying an image, a support member 14 disposed at a rear surface of the display panel 12, to support the display panel 12, a panel driver (not shown) fixed to the support member 14, to provide signals for driving of the display panel 12, and first frames 16 respectively disposed at upper and lower edges of the display module 10.

In an exemplary embodiment, the display panel 12 may be a panel not only having various structures and types capable of displaying an image, but also having flexibility, to be varied in shape by the variable member 20.

For example, the display panel 12 may be an organic light emitting display panel using organic light emitting diodes (OLEDs). Such an organic light emitting display panel is a self-luminous display panel in which electrons and holes are combined in a fluorescent or phosphorescent organic thin film when current flows through the organic thin film, thereby generating light. The organic light emitting display panel has various advantages such as high-definition quality capable of providing bright and crisp images, no restriction as to viewing angle, and low power consumption. In particular, the organic light emitting display panel exhibits excellent flexibility in that it can be manufactured through lamination of organic thin films. Of course, the present invention is not limited to such a display panel. For the display panel 12, various display panels having various structures and types may be employed.

The support member 14, which is disposed at the rear surface of the display panel 12, supports the display panel 12. The panel driver and variable member 20 may be fixed to a rear surface of the support member 14. As described above, the panel driver drives the display panel 12. To this end, the support member 14 not only has strength to firmly support the display panel 12, panel driver and variable member 20, but also has flexibility and elasticity to be varied in shape in accordance with variation in the shape of the display panel 12. In order to avoid thermal stress, the support member may have a coefficient of thermal expansion similar to that of the display panel 12.

For example, in an exemplary embodiment, the support member 14 may include a composite material such as reinforced plastic. Here, the composite material is a material obtained by artificially combining two or more kinds of materials, to exhibit excellent characteristics. For example, the support member 14 may include carbon fiber reinforced plastic (CFRP), glass fiber reinforced plastic (GFRP) or the like. In this case, the support member 14 may exhibit not only characteristics of lightness and flexibility by virtue of the plastic, but also high strength, high elasticity and excellent wear resistance by virtue of the fiber type reinforcing material. The support member 14 may be constituted by a single composite material layer or may be constituted by a plurality composite material layers, to exhibit excellent strength.

The support member 14 may be fixed to the rear surface of the display panel 12 by an adhesive (for example, a double-sided tape). Of course, the present invention is not limited to such a fixing method. The display panel 12 and support member 14 may be fixed to each other, using various fixing methods.

The panel driver fixed to the rear surface of the support member 14 includes a circuit board (not shown) including various wirings and elements to provide signals for driving of the display panel 12. The panel driver may be fixed to the support member 14 by a bracket (not shown) or the like. For example, the bracket may be fixed to the support member 14 at a middle portion thereof in order to minimize force required to vary the shape of the display panel 12. Of course, the present invention is not limited to such a structure, and various alternatives may be employed. For example, the panel driver may be partially or completely disposed at the outside of the display module 10.

In an exemplary embodiment, the panel driver may include wirings, elements, and etc., for driving of the variable member 20. This will be described in more detail later.

Respective first frames 16 are disposed along the upper and lower edges of the display panel 12 and support member 14. The first frames 16 not only fix the display panel 12 and support member 14, but also protect the upper and lower edges of the display panel 12 and support member 14. The rear cover 30 to cover the rear surface of the display panel 12, and etc., may be fixed to the first frames 16.

In more detail, each first frame 16 may include a front section 16a disposed at a front surface of the display panel 12, and a protruded fastening section 16b and a bent fastening section 16c extending from a rear surface of the front section 16a.

The protruded fastening section 16b may protrude from the front section 16a rearward from the display module 10 (in this embodiment, the support member 14). The bent fastening section 16c may protrude from the front section 16a rearward from the display module 10 (in this embodiment, the support member 14) while being bent parallel to the display module 10. In this case, the rear cover 30 is fastened to the protruded fastening section 16b by first fastening members 36, whereas the bent fastening section 16c is fastened to the support member 14 by second fastening members 144.

The bent fastening section 16c may be fastened to the support member 14, using various structures or methods. In the illustrated embodiment, screw fastening is employed. That is, screw holes 140a are formed through the bent fastening section 16c, and screw holes 142a corresponding to the screw holes 140a are formed through the support member 14. Accordingly, it is possible to fix the first frames 16 to the support member 14 by fastening the second fastening members 144, which are constituted by screws, to the screw holes 140a and 142a. Of course, the present invention is not limited to such structures, and various methods (for example, fitting, adhesion, or the like) may be employed. Fixing of the first frames 16 and rear cover 30 will be described in more detail later.

In the illustrated embodiment, it is possible not only to stably fix the edges of the display panel 12, but also to provide an aesthetically pleasing appearance, in that each first frame 16 includes the front section 16a disposed at the front surface of the display panel 12. Of course, the present invention is not limited to such a structure, and various alternatives may be employed. For example, the front section 16a may be omitted in order to allow an image to be displayed throughout the entire surface of the display panel 12.

Since each first frame 16 includes the protruded fastening section 16b to fasten the rear cover 30, and the bent fastening section 16c to fasten the support member 14, each can fix both the rear cover 30 and the support member 14. Accordingly, when the shape of the display panel 12 is varied, the support member 14 and rear cover 30 may be varied in shape simultaneously with the display panel 12 in the form of an integrated structure. Thus, it is possible to reduce force required to vary the shape of the display panel 12, and thus to minimize power consumption.

The protruded fastening section 16b includes a plurality of protruded fastening portions spaced from one another by a certain distance. Similarly, the bent fastening section 16c includes a plurality of bent fastening portions spaced from one another by a certain distance. By provision of the plural protruded fastening portions and plural bent fastening portions, it is possible not only to reduce force required to vary the shape of the display module 10, but also to uniformly apply force to the display module 10. That is, if each of the protruded fastening section 16b and bent fastening section 16c has an elongated structure, increased force is required to vary the shape of the section 16b or 16c because the elongated structure functions as a reinforcement. In this case, non-uniform shape variation may occur. In contrast, in the illustrated embodiment, each of the protruded fastening section 16b and bent fastening section 16c is divided into a plurality of portions and, as such, only force to vary each portion of the fastening sections 16a and 16b is required upon varying the shape of the display module 10. Accordingly, it is possible to uniformly vary the shapes of the protruded fastening section 16b and bent fastening section 16c while minimizing force required for shape variation.

The protruded fastening portions 16b and bent fastening portions 16c are alternately formed in a lateral direction of the display module 10. Accordingly, the display module 10 is balanced when the rear cover 30 and support member 14 are fixed to the first frames 16 and, as such, it is possible to prevent application of greater load to one side of the display module 10 with respect to the other side.

Of course, the present invention is not limited to the above-described structures, and the protruded fastening section 16b and bent fastening section 16c may have various structures. In addition, the protruded fastening section 16b and bent fastening section 16c may be provided at a region or element other than the first frame 16. In other words, the structure for fixing to the rear cover 30 and the structure for fixing to the support member 14 may be diversely variable.

The variable member 20 is disposed at the rear surface of the support member 14, to vary the shape of the display panel 12. Various configurations and systems capable of varying the shape of the display module 10 may be applied to the variable member 20.

In an exemplary embodiment, the variable member 20 may include a varying section 22, and a fixing section 24 to fix the varying section 22 to the support member 14. Stopper members 26 may also be disposed at opposite ends of the fixing section 24, respectively.

Various structures or systems capable of exhibiting length or shape variation in accordance with, for example, temperature variation or application of an electrical signal may be applied to the varying section 22. For example, the varying section 22 may have a shape memory alloy elongated in the lateral direction of the display module 10. A shape memory alloy is an alloy utilizing shape memory and super-plasticity properties exhibited in metals exhibiting austenite-martensite transformation. Such a shape memory alloy has different shapes at different temperatures. The varying section 22 is connected to an element included in the panel driver, to drive the variable member 20, for temperature adjustment thereof. In accordance with temperature adjustment, the varying section 22 exhibits length variation (that is, a variation in the rectilinear distance between the opposite ends of the varying section 22), thereby varying the shape of the display panel 12. When a shape memory alloy is employed for the varying section 22, as described above, it is possible to achieve a simple structure of the varying section 22 and thus, easy application of the varying section 22. In addition, there is no noise generated during shape variation of the display module 10.

The varying section 22 may be fixed to the fixing section 24, and the fixing section 24 with the varying section 22 may be fixed to the support member 14. The fixing section 24 may have a laterally-elongated structure in which the varying section 22 is embedded. The fixing section 24 may include a material variable in shape with the varying shape of the display panel 12 while supporting the varying section 22. In this regard, the fixing section may include a single layer or plural layers which include a composite material, for example, reinforced plastic (CFRP, GFRP or the like). Of course, the present invention is not limited to such a structure, and the fixing section 24 may be made of various materials.

Fixing members 24a are disposed at a middle portion of the fixing section 24. Since each fixing member 24a has a certain length, the fixing section 24 may have a greater spacing at the middle portion thereof with respect to the support member 14, than those of other portions thereof. For example, the fixing section 24 may be disposed on the support member 14 while having a round structure in which the middle portion of the fixing section 24 is further protruded in a rearward direction from the display module 10, as compared to other portions of the fixing section 24.

When the fixing section 24 is installed in the form of a round structure in which the middle portion of the fixing section 24 is further protruded in a rearward direction from the display module 10, as compared to other portions of the fixing section 24, it is possible to more easily vary the display panel 12 upon varying the display panel 12 by the varying section 22. That is, as illustrated in the embodiment of FIGS. 7(a) and 7(b), opposite lateral ends of the display panel 12 are forwardly protruded by the variable member 20, to cause the display panel 12 to have a curved surface having a predetermined radius of curvature R in the lateral direction of the display panel 12. In this connection, each fixing member 24a is fixed to the display module 10 in order to cause the fixing section 24 to be further protruded at the middle portion thereof and, as such, the display module 10 can be more easily varied.

When the shape of the display panel 22 is varied by the varying section 22, the stopper members 26 function to retain the varied shape of the display panel 22.

When current is applied to the varying section 22 by the panel driver, to increase the temperature of the varying section 22, the varying section 22 may be varied by bending while being reduced in length such that the opposite ends thereof are forwardly protruded. As a result, the display module 10 may be bent such that the opposite lateral ends thereof are forwardly protruded and, as such the display module 10 may have a predetermined radius of curvature R in the lateral direction thereof in the illustrated embodiment of FIGS. 7(a) and 7(b). In this state, there is no difference in the distance from the eyes of the user to the display panel 12 between the middle and lateral end portions of the display panel 12. Even if there is a distance difference, such difference may be minute. Thus, it is possible to achieve an enhancement in sensory immersion of the user.

Using the stopper members 26, it is possible to maintain the display panel 12 in the varied state. In this case, accordingly, it is possible to minimize power consumption because it is unnecessary to continuously supply current for retention of the varied state.

When it is desired to again return the display panel to its original state, the stopper members 26 are returned to original states thereof or supply of current is cut off. In accordance with such an operation, the length of the varying section 22 is returned to an original length (that is, the rectilinear distance between the opposite ends of the varying section 22 is returned to its original distance) and, as such, the display panel 12 is returned to a flat shape.

In the illustrated embodiment, when the temperature of the varying section 22 is increased, the length of the varying section 22 is reduced, thereby varying the shape of the display panel 12. However, the present invention is not limited to such an embodiment, and various alternatives may be employed. For example, the varying section 22 may be set such that the length of the varying section 22 is increased when the temperature of the varying section 22 increases. In addition, although the variable member 20 has been illustrated as employing the varying section 22 using a shape memory alloy, the varying section 22 may employ various structures and systems such as a motor and a spring member.

The structures and systems of the fixing section 24 and stopper members 26 may be diverse. Although the stopper members 26 have been illustrated as being disposed at opposite ends of the fixing section 24, respectively, the present invention is not limited to such an arrangement. The positions and arrangement of the stopper members 26 may be varied in accordance with the structure and system of the stopper members 26.

Although the display panel 12 has been illustrated as being varied to have a curved surface having a predetermined radius of curvature R in the lateral direction of the display panel 12 as illustrated in the embodiment of FIGS.

7(a) and 7(b), the present invention is not limited thereto, and the display panel 12 may be varied into various shapes. For example, the display panel 12 may be varied to have a curved surface having a curvature in a vertical direction of the display panel 12.

Although the variable member 20 has been illustrated as being disposed at the rear surface of the support member 14 in the illustrated embodiment, the present invention is not limited thereto, and the variable member 20 may be disposed at various positions. For example, the variable member 20 may be disposed between the display panel 12 and the support member 14, within the support member 14, between the support member 14 and the rear cover 30, or at the outside of the rear cover 30, so long as it can provide force capable of varying the shape of the display panel 12.

The rear cover 30 is disposed at the rear surface of the display module 10. The rear cover 30 protects the display module 10, panel driver, and etc., from external impact while providing a space where the panel driver, and etc., are disposed. The rear cover 30 also covers the panel driver, and etc., to prevent an inner configuration of the display module 10 from being outwardly exposed, and also to achieve an enhancement in appearance. For example, the rear cover 30 has a surface gently curved throughout the rear cover 30, to secure a sufficient space and to achieve an enhancement in appearance.

In an exemplary embodiment, the rear cover 30 has a structure capable of coping with variation in the shape of the display module 10. Accordingly, even when the shape of the display module 10 is varied, the rear cover 30 still protects the display module 10 and secures a desired appearance of the display module 10 without interfering with the shape variation of the display module 10.

Figure 4:
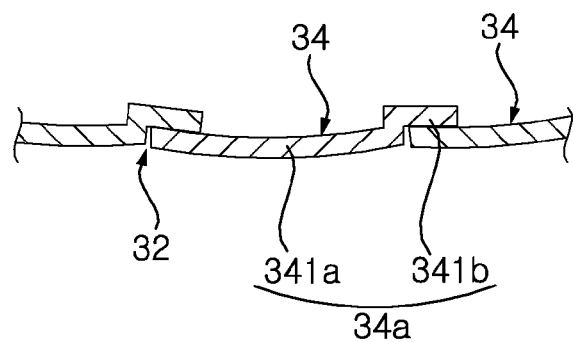
FIG. 4 is a cross-sectional view taken along line IV-IV of FIG. 2.

To this end, in the illustrated embodiment, the rear cover 30 includes a plurality of divided sections 34 defined by divided portions 32. Here, each divided portion 32 may include not only a divided portion which completely divides neighboring divided sections 34 such that the neighboring divided sections 34 are spaced from each other by a certain distance, but also a divided portion which partially divides neighboring divided sections 34 through partial removal of the rear cover 30 in a thickness direction between the neighboring divided sections 34 under the condition that the neighboring divided sections 34 are connected. Hereinafter, the case, in which neighboring divided sections 34 are spaced from each other by a certain distance, will be described with reference to FIG. 4. FIG. 4 is a cross-sectional view taken along line IV-IV of FIG. 2. For reference, the case, in which neighboring divided sections 34 are partially defined by a divided portion formed through partial removal of the rear cover 30 in the thickness direction between the neighboring divided sections 34, will be described in detail later with reference to FIGS. 9 to 12.

Referring to FIGS. 2 to 4, the divided portions 32 of the illustrated embodiment are formed to extend lengthwise direction among a plurality of divided sections 34 to penetrate the rear cover 30 such that the divided sections 34 are spaced from one another by the divided portions 32. When the rear cover 30 includes the plural divided sections 34, as described above, it is possible to reduce force required to vary the shape of the rear cover 30 when the shape of the display module 10 is varied by the variable member 20. When the rear cover 30 does not include the divided portions 32 and, as such, has a single plate structure having a uniform thickness, great force is required to vary the shape of the rear cover 30 because the single plate structure should be wholly varied. Furthermore, the rear cover 30 exhibits increased displacement because the single plate structure is being wholly varied. It may also be difficult to uniformly apply force to all portions of the rear cover 30. In contrast, when the rear cover 30 includes a plurality of divided sections 34, as in the illustrated embodiment, it is possible to deform the rear cover 30, using relatively small force capable of deforming one divided section. In this case, since the displacement of each divided section is small, it is possible not only to more effectively cope with shape variation, but also to achieve uniform shape variation.

For example, when the display module 10 is varied into a curved structure having a predetermined radius of curvature R with respect to the lateral direction of the display module 10, the divided portions 32 may have a shape elongated in a vertical direction crossing the lateral direction. When the display module 10 is varied into a curved structure, as described above, bending force is applied to the rear cover 30 in a lateral direction of the rear cover 30. To this end, in the illustrated embodiment, each divided portion 32 is vertically elongated such that the rear cover 30 is defined into a plurality of laterally-arranged divided sections 34. Thus, the width of each divided section 34, to which lateral bending force is applied, is relatively small and, as such the divided sections 34 can be easily varied.

The divided sections 34 defined by the divided portions 32 may be vertically elongated. Each divided section 34 may include a body 34a having a gently curved surface while forming an appearance of the divided section 34, and fixing ends 34b respectively provided at opposite vertical ends of the body 34a, to be fixed to the first frames 16. Fixing of the fixing ends 34b to the first frames 16 may be achieved by the first fastening members 36. Thus, each divided section 34 is fixed to the first frames 16 by the fixing ends 34b respectively formed at the ends of the divided section 34 opposite to each other in the vertical direction crossing the variation direction of the divided section 34. Since the opposite vertical ends of the divided section 34 are in a fixed state, but opposite lateral ends of the divided section 34 are in a non-fixed state, the divided sections 34 can be easily varied by force applied in a lateral direction thereto.

Figure 5:
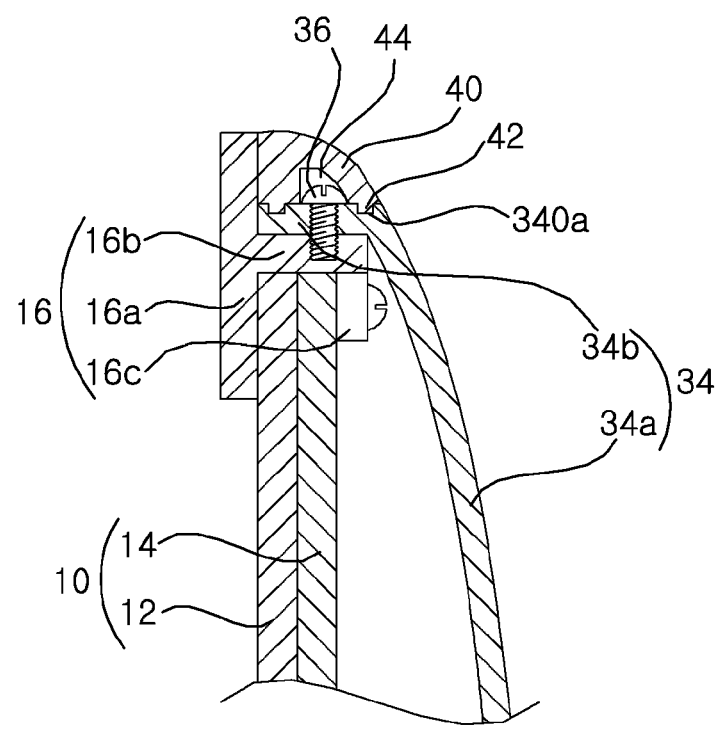
FIG. 5 is a cross-sectional view taken along line V-V of FIG. 3.

For example, referring to FIG. 5, each fixing end 34b may be fastened to the protruded fastening section 16b of the corresponding first frame 16 through screw fastening. In more detail, the fixing end 34b may be formed to extend in parallel to the protruded fastening section 16b and, as such, the fixing end 34b may be disposed on the protruded fastening section 16b. The fixing end 34b may be provided with screw holes 340b at positions corresponding to respective screw holes 160b of the protruded fastening section 16b. Accordingly, it is possible to fasten the fixing end 34b to the protruded fastening section 16b by fastening the first fastening members 36 (for example, screws) to the screw holes 160b and 340b under the condition that the fixing end 34b is disposed on the protruded fastening section 16b. Using the above-described screw fastening structure, it is possible to firmly fix the divided sections 34 to the first frames 16 in a simple manner.

Each of the screw holes 160b and 340b may have a slot structure elongated in the lateral direction of the display module 10. When the display module 10 is varied into a curved structure having a predetermined radius of curvature R in the lateral direction of the display module 10, the width of each divided section 34 and/or the width of each divided portion 32 may be increased. To this end, each of the screw holes 160b and 340b is formed to have a slot structure elongated in the lateral direction of the display module 10 in order to effectively cope with variation in the width of the corresponding divided section 34 and/or variation in the width of the corresponding divided portion 32.

Of course, the present invention is not limited to the above-described structure. The shapes, structures and systems of the protruded fastening section 16*b*, fixing ends 34*b* and first fastening members 36 for fixing of the divided sections 34 may be varied. For example, various methods such as fitting and adhesion may be employed.

In the illustrated embodiment, the plural divided sections 34 have the same width. Here, the "same width" not only includes widths that are physically completely equal to each other, but also includes widths that may be considered to be equal to each other, taking into consideration manufacturing tolerance or the like. When a plurality of divided sections 34 having the same width, as described above, is used, it is possible to form the divided sections 34 in the same process, and to form the rear cover 30, using the divided sections 34 formed in the same process. Accordingly, the manufacturing process is simplified. Of course, the present invention is not limited to the above-described embodiment, and it may be possible to employ divided sections 34 having different widths.

As shown in FIG. 4, the body 34*a* of each divided section 34 includes an outer portion 3411 constituting an outer surface of the rear cover 30, and an overlap portion 3412 extending from the outer portion 3411 toward another divided section 34 neighboring the subject divided section 34, to overlap with the neighboring divided section 34. Accordingly, it may be possible to prevent the user from recognizing, with the naked eye, an increase in the width of each divided portion 32 occurring when the shape of the rear cover 30 is varied.

The overlap portion 3412 of each divided section 34 extends from one side of the divided section 34 toward the neighboring divided section 34 and, as such, a step corresponding to the thickness of the neighboring divided section 34 is formed between an outer surface of the outer portion 3411 of the divided section 34 and an outer surface of the overlap portion 3412. In the illustrated embodiment, the overlap portion 3412 is illustrated as having a thickness equal or similar to that of the body 34*a*. In this case, it is possible to avoid non-uniform variation caused by local application of force to the body 34*a*. Of course, the present invention is not limited to the above-described structure, and the outer portion 3411 and overlap portion 3412 may have various shapes and structures.

The divided sections 34 of the rear cover 30 should include a material having strength enabling the divided sections 34 to constitute the rear surface of the display apparatus 100 while being light in weight and easily shape-variable. The divided sections 34 may include various metals, resins or the like. As metals, aluminum or the like that is light in weight while being suitable for shape variation may be employed. As resins, rubber or the like may be employed.

Again referring to FIG. 5, a covering member 40 may be provided to cover each first frame 16 and corresponding ones of the fixing ends 34*b* of the divided sections 34. The covering member 40 may include a first section 40*a* constituting an upper or lower surface of the covering member 40, and a second section 40*b* extending from the first section 40*a*. The covering member 40 may further include fitting protrusions 42 which will be fitted in fitting grooves 340*a* formed at the rear cover 30, in particular, the fixing ends 34*b* of the divided sections 34. Accordingly, it is possible to stably fix the covering member 40 to the rear cover 30. Additionally using an adhesive, it may be possible to more stably fix the covering member 40. Since the covering member 40 effectively covers regions where the first frame 16 is connected with the divided sections 34, it is possible to avoid problems caused by exposure of those regions and to achieve an enhancement in appearance.

Figure 6:
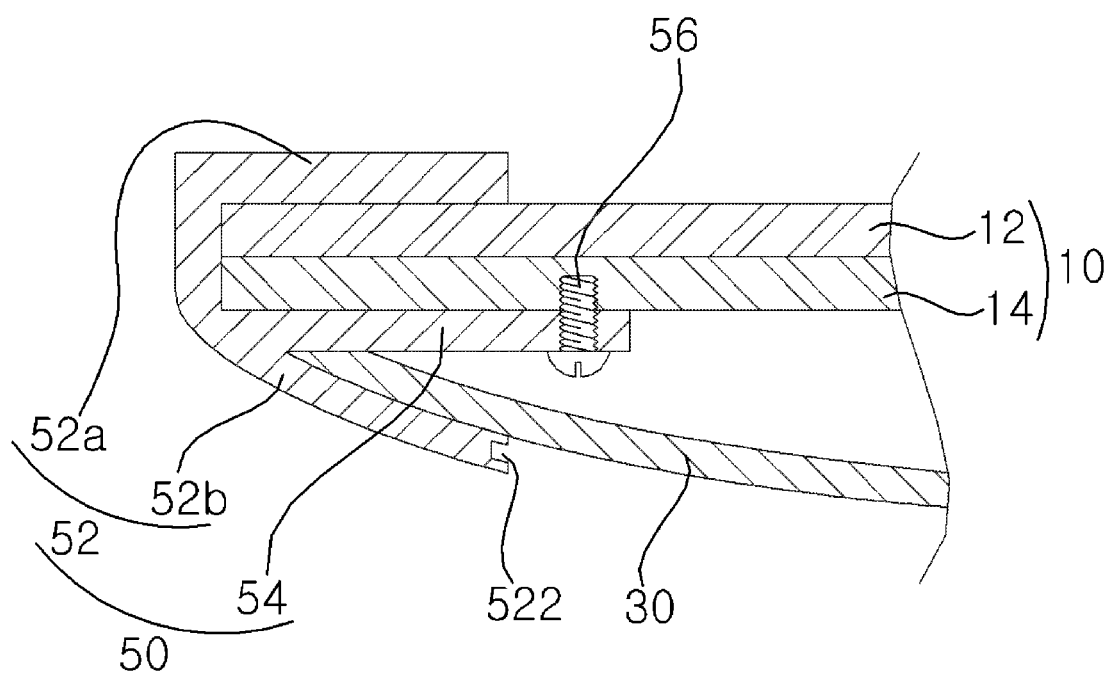
FIG. 6 is a cross-sectional view taken along line VI-VI of FIG. 3.

Second frames 50 may be disposed at left and right edges of the display apparatus 100, to cover the display module 10 and rear cover 30. Each second frame 50 may include an outer section 52 extending from the front surface of the display module 10 to the outer surface of the rear cover 30, and an extension section 54 protruded from the outer section 52. As shown in FIG. 6, each lateral edge of the display module 10 is fitted between the extension section 54 and a front portion 52*a* of the outer section 52 in the corresponding second frame 50. Each lateral edge of the rear cover 30 is also fitted between the extension section 54 and a rear portion 52*b* of the outer section 52 in the corresponding second frame 50. In addition, a groove 522 may be formed at the rear portion 52*b* of the outer section 52 in each second frame 50, to partially receive a corresponding lateral edge of the rear cover 30. Various alternatives may also be employed.

The extension section 54 is fixed to the display module 10 (in this embodiment, the support member 14) by third fastening members 56. For example, in the illustrated embodiment, the second frame 50 is fastened to the support member 14 through screw fastening. In detail, screw holes 540*a* are formed through the extension section 54, and screw holes 142*b* corresponding to the screw holes 540*a* are formed through the support member 14. Accordingly, it is possible to fix the second frame 50 to the support member 14 by aligning the screw holes 540*a* of the extension section 54 and the screw holes 142*b* of the support member 14, and then fastening the third fastening members 56, which are constituted by screws, to the aligned screw holes 540*a* and 142*b*. Thus, it is possible to achieve firm fixing in a simple manner, using screw fastening. Of course, the present invention is not limited to such a method, and other methods such as fitting and adhesion may be employed.

As apparent from the above description, each second frame 50 fixes a plurality of elements at the corresponding lateral side of the display apparatus 10 such that these elements are in an integrated state. Each second frame 50 also prevents inner configurations of the display apparatus from being outwardly exposed, and achieves an enhancement in appearance.

The above-described shape variation of the display apparatus 100 will be described in more detail with reference to FIGS. 7(*a*) and 7(*b*). FIGS. 7(*a*) and 7(*b*) are views explaining shape variation of the display apparatus according to an exemplary embodiment of the present invention. For reference, FIGS. 7(*a*) and 7(*b*) are cross-sectional views taken along line VII-VII of FIG. 3. For simplicity and convenience of description, illustration of the stopper members ("26" in FIG. 3) is omitted from FIGS. 7(*a*) and 7(*b*).

The display module 10 is kept in a flat state, as shown in FIG. 7(*a*), under the condition that there is no force applied to the display module 10. The middle portion of the variable member 20 is fixed by the fixing members 24*a*. Accordingly, the middle portion of the variable member 20 is further protruded in a rearward direction from the display module 10, as compared to the lateral edge portions of the variable member 20. In accordance with this structure, shape variation of the display module 10 can be more easily achieved.

When the user inputs a command for shape variation, the variable member 20 is driven by an element included in the panel driver to drive the variable member 20. For example, in the illustrated embodiment, current flows through the varying section 22 of the variable member 20, to increase the temperature of the varying section 22. The varying section 22, which is made of a shape memory alloy, is reduced in length, thereby applying force to the display module 10 such that the left and right edge portions of the display module 10 are protruded in a forward direction, and the middle portion of the display module 10 is protruded in a rearward direction. As a result, the display module 10 is varied into a curved structure having a uniform radius of curvature R in the lateral direction of the display module 10, as shown in FIG. 7(b). Thus, the display module provides an enhancement in sensory immersion of the user. In this case, the rear cover 30 fixed to the display module 10 is also varied into a curved structure. When the display apparatus 100 is varied into a desired shape, the varied shape is retained by a locking operation of the stopper members 26.

When the user inputs a command to again vary the shape of the display apparatus 100 to return to its original shape, the locking state of the stopper member 26 is released, supply of current to the varying section 22 is cut off, or another current is supplied to the varying section 22. As a result, the varying section 22 is returned to its original state thereof, as shown in FIG. 7(a).

As described above, in the illustrated embodiment, the rear cover 30 can be varied in shape by small force, integrally with the display module 10, because the rear cover 30 includes a plurality of divided sections 34 defined by divided portions 32. Accordingly, it is possible to minimize power consumption for shape variation of the display apparatus 100 while achieving uniform shape variation into a desired shape.

Hereinafter, a display apparatus according to another exemplary embodiment of the present invention and a rear cover included in the display apparatus will be described with reference to the accompanying drawings. With regard to the following embodiments, no description may be given of matters identical or very similar to those of the above-described embodiments, and only the different matters may be described in detail.

Figure 8:
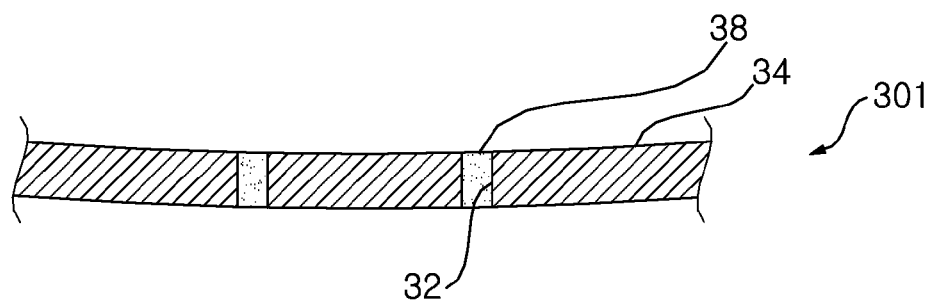
FIG. 8 is a sectional view partially illustrating a rear cover employed in a display apparatus according to another exemplary embodiment of the present invention.

FIG. 8 is a sectional view partially illustrating a rear cover employed in a display apparatus according to another exemplary embodiment of the present invention.

Referring to FIG. 8, the rear cover of the illustrated embodiment, which is designated by reference numeral "301", includes connectors 38 formed at regions corresponding to respective divided portions 32 for dividing the rear cover 301 into the plural divided sections 34. That is, the rear cover 301 has a structure in which the divided sections 34 defined by the divided portions 32 are connected by the connectors 38. The connectors 38 may be made of a material different from the material of the divided sections 34, for example, a material exhibiting excellent elasticity and flexibility, as compared to the material of the divided sections 34. In this case, although the divided sections 34 are connected, the rear cover 301 can be uniformly varied by small force when the shape of the display apparatus is varied.

Each connector 38 may include a resin material. For example, each connector 38 may include silicon resin, rubber or the like. Of course, the present invention is not limited to such a material, and the connectors 38 may include the same material as that of the divided sections 34.

When the plural divided sections 34 of the rear cover 301 are connected by the connectors 38, as described above, the rear cover 301 may have a single structure. In this case, the rear cover 301 may be easily manufactured, using a double injection mold. Thus, the manufacturing process of the rear cover 301 can be simplified. In addition, it may be possible to simplify the structure for fixing the rear cover 301 to the display module 10 by virtue of the single structure of the rear cover 301.

Figure 9:
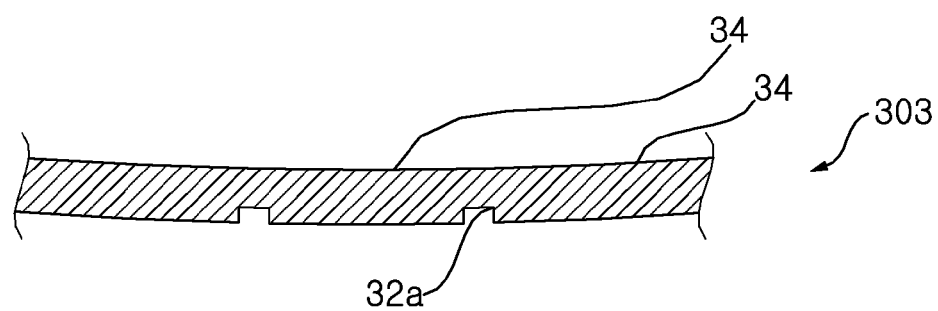
FIG. 9 is a sectional view partially illustrating a rear cover employed in a display apparatus according to another exemplary embodiment of the present invention.
Figure 10:
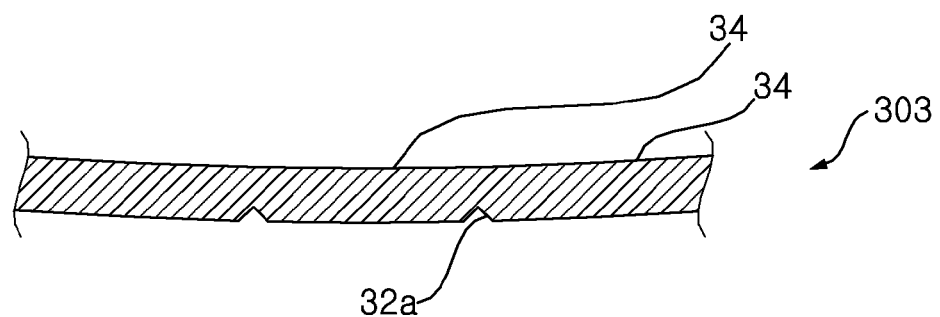
FIG. 10 is a sectional view partially illustrating a rear cover according to an embodiment modified from the embodiment of FIG. 9.
Figure 11:
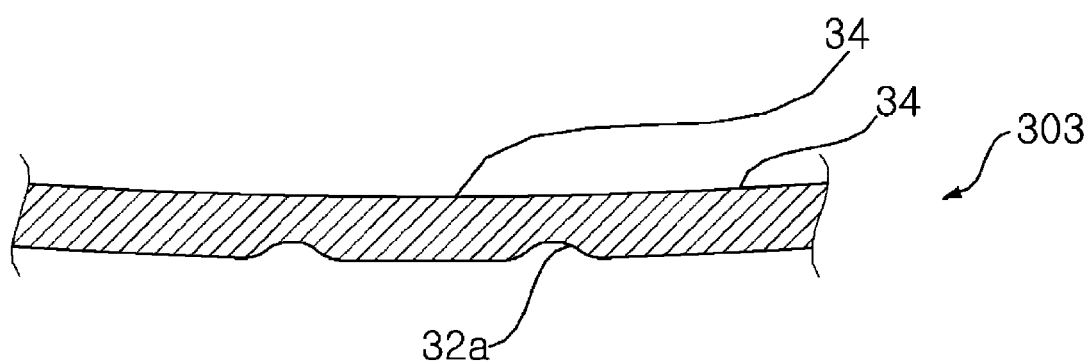
FIG. 11 is a sectional view partially illustrating a rear cover according to another embodiment modified from the embodiment of FIG. 9.

FIG. 9 is a sectional view partially illustrating a rear cover employed in a display apparatus according to another exemplary embodiment of the present invention. FIG. 10 is a sectional view partially illustrating a rear cover according to an embodiment modified from the embodiment of FIG. 9. FIG. 11 is a sectional view partially illustrating a rear cover according to another embodiment modified from the embodiment of FIG. 9.

Referring to FIG. 9, the rear cover of the illustrated embodiment, which is designated by reference numeral "303", includes divided portions 32a each formed by indenting, such as by molding, partially cutting out or removing the rear cover 303 in a thickness direction of the cover 303. That is, each divided portion 32a has the form of a notch, a cavity, a groove, a trench or the like.

In this embodiment, the plural divided sections 34 are defined by the divided portions 32a while remaining in a connected state. Similarly to the above-described cases, in this case, it is possible to reduce force required to deform the rear cover 303 in accordance with partial removal of the rear cover in the form of a certain pattern by the divided portions 32a. When the divided portions 32a are disposed at the outer surface of the rear cover 303, it is possible to more easily vary the rear cover 303, and thus, to more easily vary the display module 10 into a curved structure.

In this embodiment, the divided sections 34 are defined by the divided portions 32a (that is, the divided sections 34 are not completely separated by the divided portions 32a) such that they are in a connected state. In FIG. 9, each divided portion 32a is illustrated as having a quadrangular cross-section. In this case, it is possible to reduce the number of regions where stress is relatively concentrated, and to stably maintain the rear cover 303. Accordingly, even when shape variation occurs repeatedly, it is possible to avoid fatigue fracture of the rear cover 303. Of course, the present invention is not limited to the above-described structure. For example, each divided portion 32a may have a triangular cross-section, as shown in FIG. 10. In this case, it is possible to more easily manufacture the rear cover 303 and to further reduce force required to deform the rear cover 303. Alternatively, as shown in FIG. 11, each divided portion 32a may have a round shape in order to further reduce stress concentration. That is, each divided portion 32a may have various round shapes such as various polygonal shapes, a semicircular shape, a semi-oval shape, and a U shape.

Figure 12:
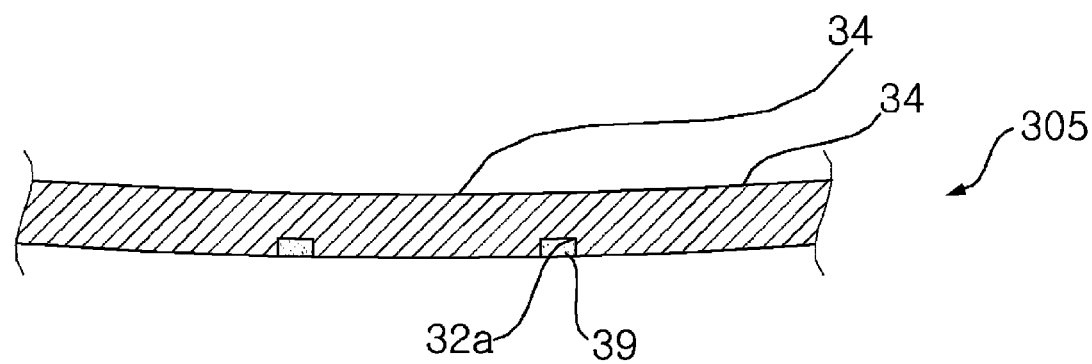
FIG. 12 is a sectional view partially illustrating a rear cover employed in a display apparatus according to another exemplary embodiment of the present invention.

FIG. 12 is a sectional view partially illustrating a rear cover employed in a display apparatus according to another exemplary embodiment of the present invention.

Referring to FIG. 12, the rear cover of the illustrated embodiment, which is designated by reference numeral "305", may include divided portions 32a each formed by partially removing the rear cover 305 in a thickness direction, and fillers 39 filling respective divided portions 32a. The fillers 39 may be made of a material different from the material of the divided sections 34. For example, the fillers 39 may be made of a material exhibiting excellent elasticity and flexibility, as compared to the material of the divided sections 34. In this case, an enhancement in structural stability is achieved by the fillers 39. In addition, the rear cover 305 can be uniformly varied by small force when the shape of the display apparatus is varied. Each filler 39 may include a resin material. For example, each filler 39 may include silicon resin, rubber or the like. Of course, the present invention is not limited to such a material, and the filler 39 may include the same material as that of the divided sections 34.

Figure 13:
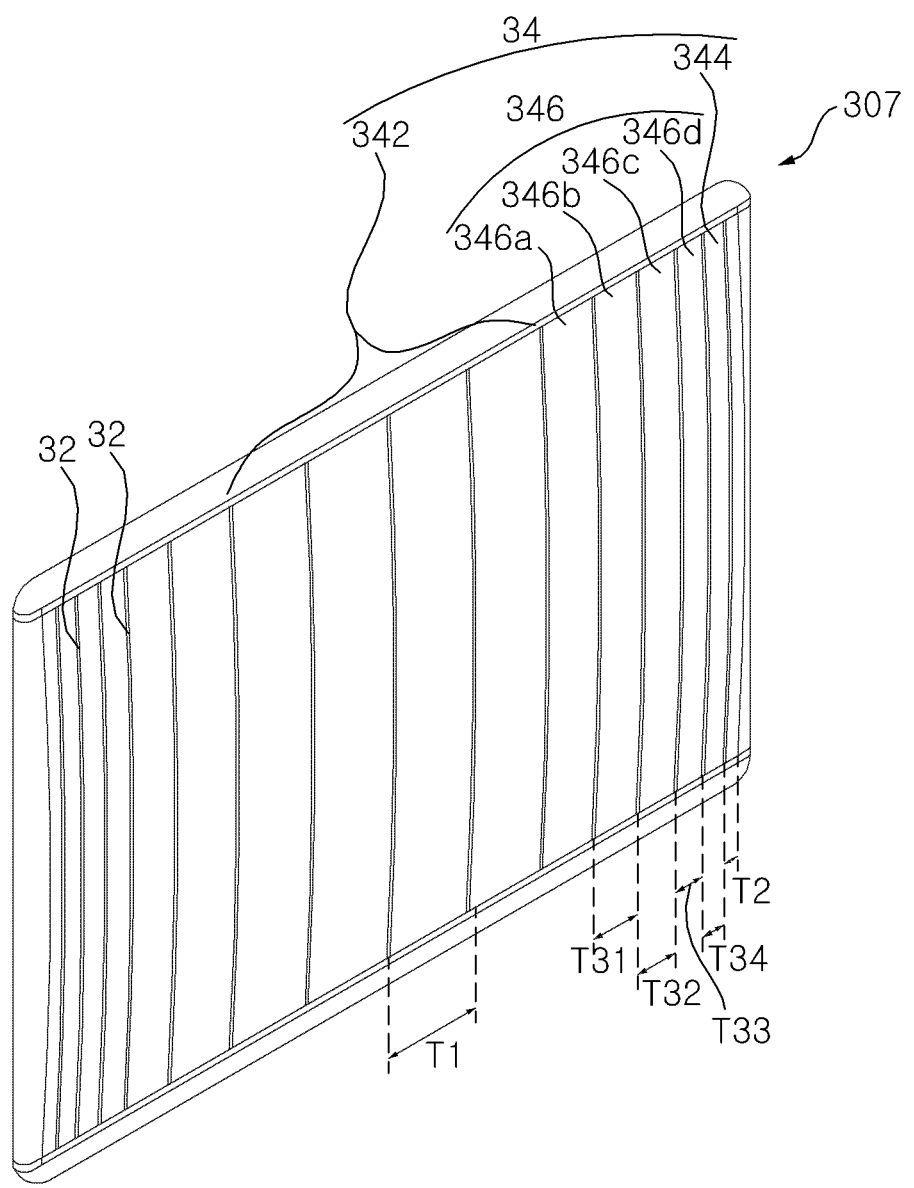
FIG. 13 is a rear perspective view of a rear cover according to another exemplary embodiment of the present invention.

FIG. 13 is a rear perspective view of a rear cover according to another exemplary embodiment of the present invention. For clarity and convenience of illustration, unnecessary portions or elements may be omitted from FIG. 13, and only the plural divided sections 34 may be illustrated in brief.

Referring to FIG. 13, the rear cover of the illustrated embodiment, which is designated by reference numeral "307", may include divided sections 34 having different widths. For example, the divided sections 34 may include first divided sections 342 arranged at the middle portion of the rear cover 34, and second divided sections 344 respectively arranged at the lateral edge portions of the rear cover 34. At least one third divided section 346 may be arranged between a region where the first divided sections 342 are arranged and a region where each second divided section 344 is arranged.

Each first divided section 342 has a width T1 greater than a width T2 of each second divided section 344. On the other hand, the third divided section 346 may have a width smaller than the width T1 of the first divided section 342, but greater than the width T2 of the second divided section 344. When a plurality of third divided sections 346 is provided, they may have gradually-reduced widths, respectively. In the illustrated case, the third divided sections 346 include four third divided sections 346*a*, 346*b*, 346*c*, and 346*d* having widths gradually reduced in the order of a width T31 of the third divided section 346*a* most adjacent to the region of the first divided sections 342, a width T32 of the third divided section 346*b*, a width T33 of the third divided section 346*c*, and a width T34 of the third divided section 346*d* most adjacent to the corresponding second divided section 344. Of course, the present invention is not limited to such conditions, and the number of third divided sections 346 may be varied.

When the divided section width at the edge portions of the rear cover 307 where increased displacement is generated is greatly reduced, as described above, it is possible to minimize force required for shape variation of the rear cover 307. In this case, the first divided sections 342, which have the same or similar widths, are arranged in plural at the middle portion of the rear cover 307. Accordingly, it is possible to further simplify the manufacturing process of the rear cover 307 and to achieve an enhancement in stability at the middle portion of the rear cover 307.

Figure 14:
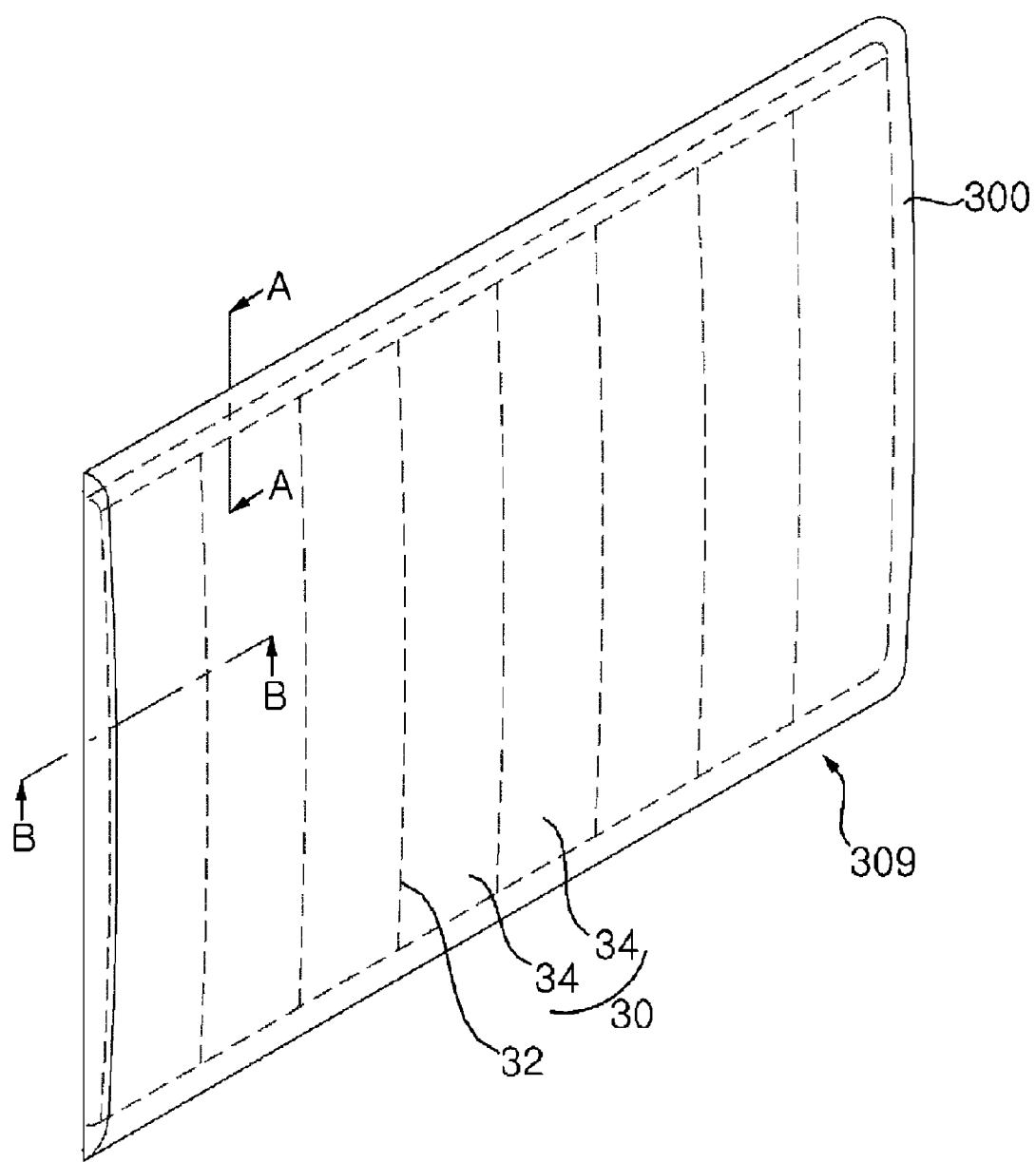
FIG. 14 is a rear perspective view schematically illustrating a rear cover according to another exemplary embodiment of the present invention.
Figure 15:
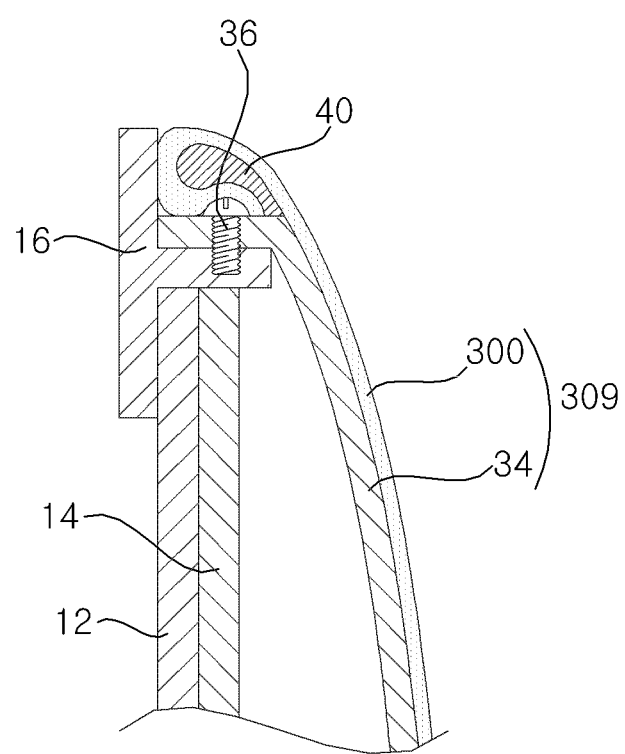
FIG. 15 is a cross-sectional view taken along line A-A of FIG. 14.
Figure 16:
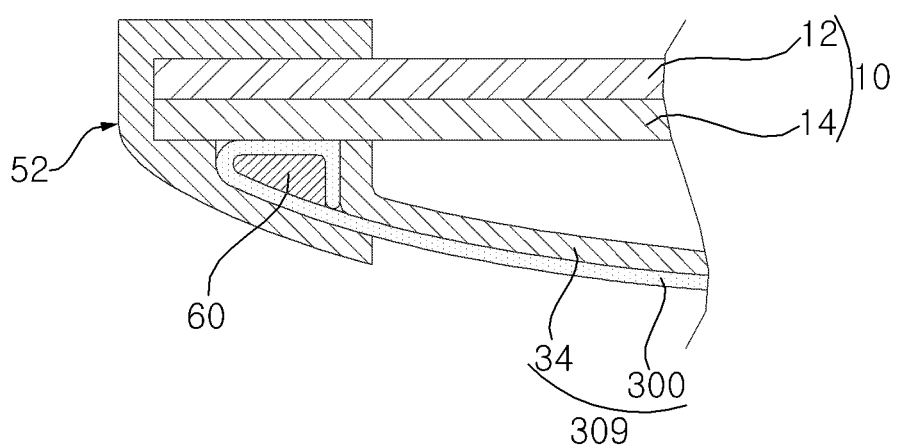
FIG. 16 is a cross-sectional view taken along line B-B of FIG. 14.

FIG. 14 is a rear perspective view schematically illustrating a rear cover according to another exemplary embodiment of the present invention. FIG. 15 is a cross-sectional view taken along line A-A of FIG. 14. FIG. 16 is a cross-sectional view taken along line B-B of FIG. 14.

Referring to FIGS. 14 to 16, the rear cover of the illustrated embodiment, which is designated by reference numeral "309", further includes a fabric member 300 for covering outer surfaces of the plural divided sections 34. The fabric member 300 may include various materials capable of applying certain tension to the plural divided sections while covering the rear cover 309. Of course, the present invention is not limited to such materials, and the fabric member 300 may include a tensionless material that cannot apply tension. By virtue of the fabric member 300, it is possible not only to achieve an enhancement in the structural stability of the rear cover 309 with the plural divided sections 34, but also to achieve an enhancement in aesthetics.

The fabric member 300 may be disposed on the rear cover 30 in accordance with various methods. For example, in the illustrated embodiment, the fabric member 300 is fixed, at upper and lower edges thereof, to the covering member 40 while being fixed, at left and right edges thereof, to respective second frames 50. In this case, the fabric member 300 may be directly fixed to the covering member 40 while enclosing the covering member 40. Alternatively, as shown in FIG. 16, the left and right edges of the fabric member 300 are fixed to guide members 60, respectively, and each of the guide members 60 is then fitted between the outer section 52 of the corresponding second frame 50 and the display module 10 and, as such, the fabric member 300 is fixed to the second frame 50. In a modified embodiment, the fabric member 300 may be attached to the rear cover 309 by an adhesive material or the like. Using various other methods, the fabric member 300 may be fixed to the rear cover 309.

In each of the above-described embodiments, the rear cover can be varied in shape by small force, integrally with the display module, because the rear cover includes a plurality of divided sections defined by divided portions. Accordingly, it is possible to minimize power consumption for shape variation of the display apparatus 100 while achieving uniform shape variation into a desired shape.

Figure 17:
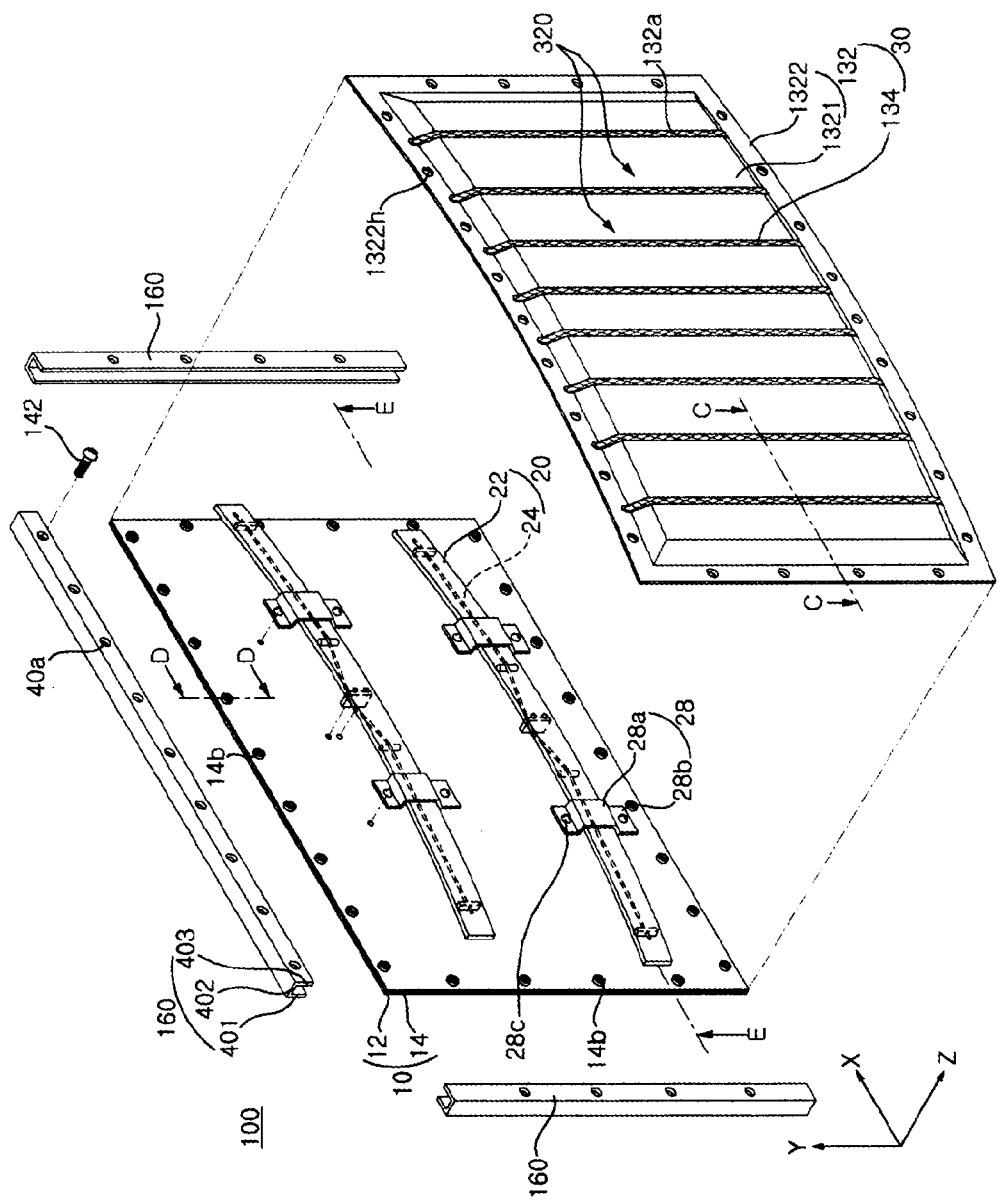
FIG. 17 is an exploded rear perspective view of a display apparatus according to another embodiment of the present invention.
Figure 18:
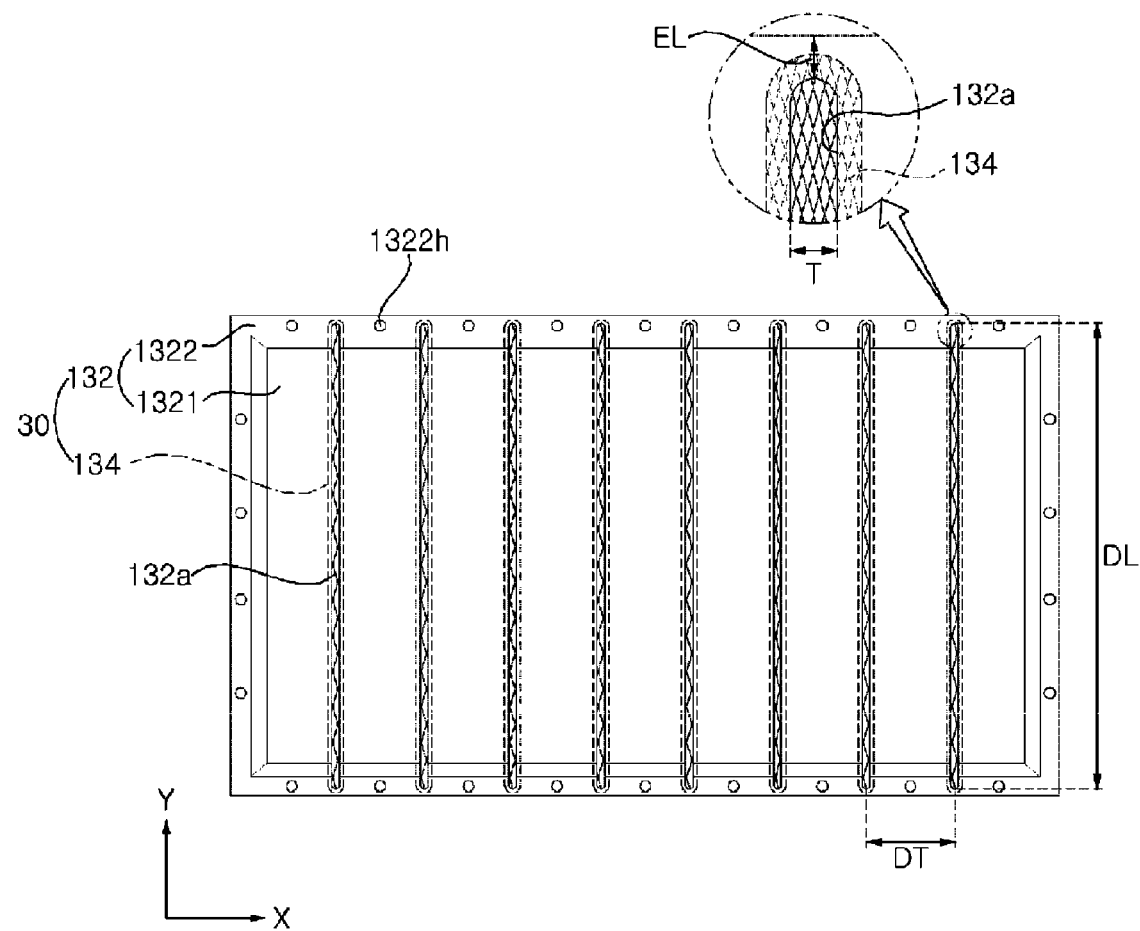
FIG. 18 is a rear plan view illustrating a rear cover illustrated in FIG. 17.
Figure 19:
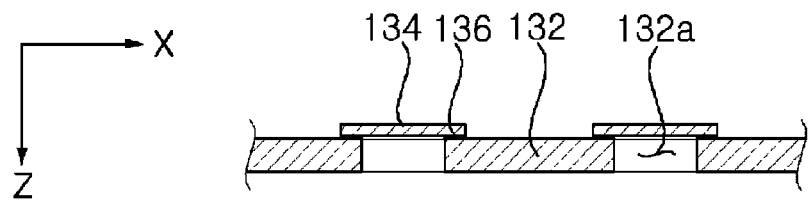
FIG. 19 is a cross-sectional view taken along line C-C of FIG. 17.
Figure 20:
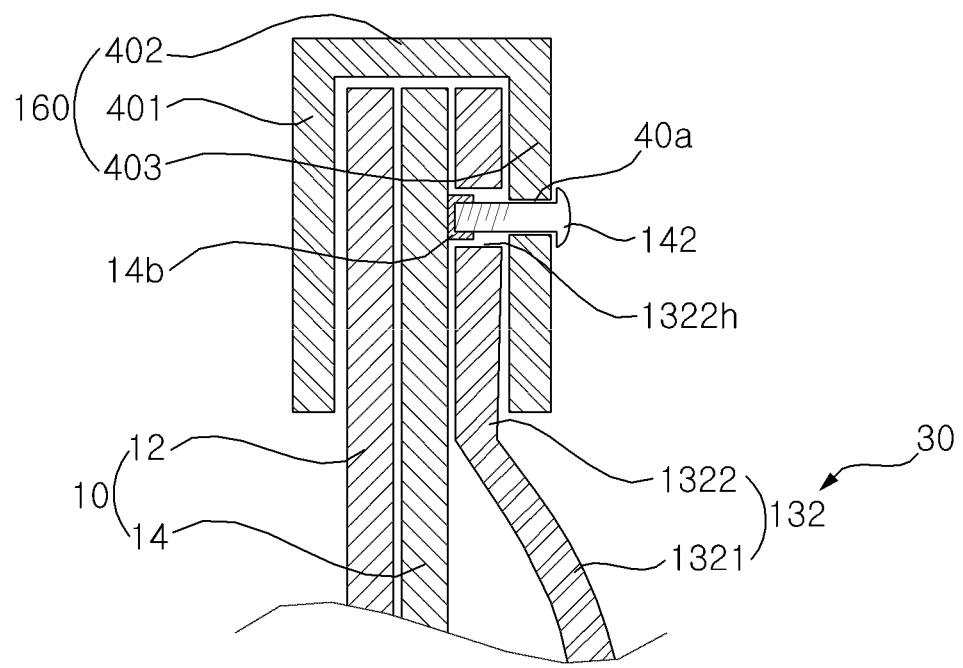
FIG. 20 is a cross-sectional view taken along line D-D of FIG. 17.

FIG. 17 is an exploded rear perspective view of a display apparatus according to another embodiment of the present invention. FIG. 18 is a rear plan view illustrating a rear cover illustrated in FIG. 17. FIG. 19 is a cross-sectional view taken along line C-C of FIG. 17. FIG. 20 is a cross-sectional view taken along line D-D of FIG. 17.

In this embodiment, The varying member 220 may include a first portion 220 fixed to the support member 14 of the display module 10, and a second portion 240 disposed between the support member 14 and the first portion 220. The second portion 240 is fixed, at opposite ends thereof, to opposite ends of the first portion 220, respectively. The varying member 220 may further include guide members 28 to support the first portion 220 at an inner surface of the guide members 28. In this embodiment, it is possible to vary the shape of the display module 10 by varying the distance, for instance, a rectilinear distance between the opposite ends of the second portion 240 fixed to the first portion 220 (hereinafter, referred to as a "connection length").

The first portion 220 may have an elongated band shape. Accordingly, it is possible to more effectively apply force to the display module 10. Of course, the present invention is not limited to such a shape, and the first portion 220 may have various shapes.

The second portion 240 may have a structure elongated in the lateral direction of the display module 10 (for example, a wire structure). The connection length of the second portion 240 may be varied by diverse energy (for example, thermal energy, electrical energy, or mechanical energy).

For example, when the second portion 240 is made of a material variable in shape in accordance with a variation in temperature, it is possible to vary the temperature of the second portion 240 and thus, the connection length of the second portion 240 by supplying thermal energy or electrical energy. In this case, the second portion 240 may include a shape memory alloy. A shape memory alloy is an alloy utilizing shape memory and super-plasticity properties exhibited in metals exhibiting austenite-martensite transformation. Such a shape memory alloy has different shapes at different temperatures. The second portion 240 is connected to an element included in the panel driver, to drive the varying member 220, for temperature adjustment thereof. In accordance with temperature adjustment, the connection length of the second portion 240 may be varied. When the second portion 240 includes a shape memory alloy and, as such, the connection length of the second portion 240 is varied by thermal energy or electrical energy, it is possible to achieve a simple structure of the varying member and thus, easy application of the varying member. In addition, there is no noise generated during shape variation of the display module 10.

Alternatively, it may be possible to vary the connection length of the second portion 240 by mechanical energy supplied from a separate driver (not shown) (for example, a motor) to supply mechanical energy, together with the panel driver. In this case, a part of the second portion 240 is fixed to the motor and, as such, it is possible to vary the connection length of the second portion 240 by winding or unwinding the second portion 240 onto or from a rotating shaft of the motor in accordance with rotation of the motor. In this case, the second portion 240 may be made of a material exhibiting little or no stretchability even under diverse conditions while having high yield strength. When the second portion 240 is stretchable, it is difficult to accurately vary the connection length of the second portion 240. In addition, it is necessary to provide increased mechanical energy. For example, the second portion 240 may include a metal steel wire (for example, a stainless wire), an aramid fiber, a carbon steel wire or the like. Of course, the second portion 240 may be made of various other materials. The driver, which is a motor or the like to supply mechanical energy, may have various configurations capable of varying the shape of the varying member 220. When the driver, which is a motor or the like, varies the shape of the varying member 220, using mechanical energy, it is possible to easily vary the shape of the varying member 220 while accurately controlling the variation degree and variation time of the varying member 220.

The second portion 240 may have a diameter of 0.5 to 10 mm. When the diameter of the second portion 240 is less than 0.5 mm, there may be a problem in that the second portion 240 may snap or deform upon receiving energy from the driver. On the other hand, when the diameter of the second portion 224 exceeds 10 mm, there may be problems of increased costs and complicated configurations because mechanical energy required to vary the connection length of the second portion 240 should be increased. Of course, the present invention is not limited to the above-described embodiment, and the second portion 240 may have various diameters.

Although only one second portion 240 is provided in association with the first portion 220 in the illustrated embodiment, a plurality of second portions 240 may be provided. That is, various alternatives may be employed.

The first portion 220 is fixed, at a central region thereof, to the display module 10 (for example, the support member 14) such that it cannot move at the central region. In this case, the first portion 220 is movable at opposite end regions thereof. Since the first portion 220 is movable at the opposite end regions thereof while being fixed at the central region thereof, the shape of the first portion 220 is variable.

The second portion 240 is fixed, at opposite ends thereof, to respective opposite ends of the first portion 220 and, as such, the distance between the opposite ends of the second portion 240 becomes the connection length of the second portion 240. The opposite ends of the second portion 240 may be fixed to respective opposite ends of the first portion 220 by an end fixing member 26b. The fixing member 26b may include a first end fixing member 261b for fixing one end of the second portion 240 to one end of the first portion 220, and a second end fixing member 262b for fixing the other end of the second portion 240 to the other end of the first portion 220.

In accordance with the above-described structures, the second portion 240 may have a shape similar to "W". In accordance with this shape, it is possible to prevent problems as to interference while obtaining maximum bending moment.

The first portion 220 may be movably held by the guide members 28 fixed to the support member 14. Accordingly, it is possible to movably hold the first portion 220 while preventing the first portion 220 from being downwardly bent.

Each guide member 28 includes an upper portion 28a spaced from the support member 14, to form a predetermined space therebetween, and side portions 28b bent from the upper portion 28a, to be disposed adjacent to the support member 14. The side portions 28b are fixed to the support member 14 by fastening members 28c. For example, fixing of each guide member 28 to the support member 14 may be achieved by mounting PEM nuts (not shown) to the support member 14, and fastening the fastening members 28c, which may be screws or the like, to the PEM nuts through fastening holes formed at the side portions 28b. Using the PEM nuts and screws as described above, it is possible to easily and simply achieve fastening. Of course, the present invention is not limited to the above-described structures, and various fixing methods and structures may be employed for fixing of the side portions 28b to the support member 14.

Since the distance between the first portion 220 and the display module 10 increases gradually toward the central region, the guide member 28 may be formed such that each upper portions 28a thereof has a height increasing gradually toward the central region. In this case, the first portion 220 may be freely laterally movable while being effectively supported by the guide members 28.

When the connection length of the second portion 240 varies, as described above, the shape of the first portion 220 is varied. When the shape of the first portion 220 varies, the first portion 220 applies force to the display module 10, thereby causing the shape of the display module 10 to be correspondingly varied. Thus, the first portion 220 is a portion which is varied in shape by force received from the second portion 240, thereby varying the shape of the display module 10. In this regard, the first portion 220 may include a material having flexibility and excellent strength. In addition, the material of the first portion 220 may be lightweight in order to reduce the weight of the display apparatus 100.

In an exemplary embodiment, the varying member 220 may be elongated in one direction (for example, a lateral direction of the display apparatus 100). When the connection length of the second portion 240 is reduced, the first portion 220 is bent such that the opposite end regions thereof protrude forward with respect to the central region. As a result, the display module 10 is deformed into a curved structure having a predetermined radius of curvature in the lateral direction of the display module 10. In this state, there is no difference in the distance from the eyes of the user to the display panel 12 between the middle and lateral end portions of the display panel 12. Even if there is a distance difference, such difference may be minute. Thus, it is possible to achieve an enhancement in sensory immersion of the user. Of course, the present invention is not limited to the above-described embodiment. For example, the varied shape of the varying member 220 may be different from the above-described shape and, as such, the varied shape of the display module 10 may also be different from the above-described shape.

In this embodiment, the rear cover 30 may include a cover body 132 including a plurality of divided sections 320 defined by divided portions 132a. The divided sections 320 are connected to form an integrated structure.

Since the plural divided sections 320 of the cover body 132 are connected to form an integrated structure in this embodiment, it is possible to simplify the structure for fixing the rear cover 30 to the display module 10. In addition, the time and cost required in processes for manufacture, transportation, and fixing of the cover body 132 are reduced. That is, when a plurality of divided sections 320 are separately prepared, manufacture and transportation of the divided sections 320 and assembly of the divided sections 320 to the display module 10 should be carried out in a separate manner. As a result, the time and cost required in the above processes are increased. In this embodiment, however, it is possible to minimize the time and cost required in processes for manufacture, transportation, and fixing of the cover body 132 because the cover body 132 has an integrated structure.

For example, in this embodiment, each divided portion 132a formed at the cover body 132 has ends respectively spaced apart from corresponding longitudinal edges of the cover body 132. That is, each divided portion 132a is formed to have a closed space within the cover body 132. In this case, each divided portion 132a has an island shape. Accordingly, the cover body 132 may have an integrated or connected structure having a uniform thickness in a region where the divided portions 132a are not formed.

Each divided portion 132a may be constituted by a hole, a slit, or the like, which is formed through the cover body 132. Accordingly, the cover body 132 is partially physically divided by the divided portions 132a and, as such, it is possible to minimize the force required for shape variation of the rear cover 30. Of course, the present invention is not limited to the above-described structure. The divided portions 132a may be formed without penetrating through the cover body 132. This will be described in detail later with reference to FIG. 26.

Each divided portion 132a may have various planar shapes capable of allowing easy shape variation of the rear cover 30. For example, as described above, the divided portions 132a may have a shape elongated in a vertical direction crossing a lateral direction of the display module 10 when the display module 10 is varied into a curved structure with respect to the lateral direction thereof.

In this case, each divided portion 132a may be spaced, at ends thereof, from corresponding longitudinal edges of the cover body 132 while being vertically elongated, as described above. In this case, the edge of each divided portion 132a may form a closed loop. In more detail, each divided portion 132a has a uniform line width T through the entirety thereof while being round at opposite ends thereof (to have curved surfaces having, for example, a semicircular shape). In this case, it is possible to reduce concentration of stress at opposite ends of each divided portion 132a. Accordingly, it is possible to prevent the cover body 132 from being damaged in a region between each end of each divided portion 132a and the corresponding edge of the cover body 132 due to concentration of stress at the end of the divided portion 132a. Of course, the present invention is not limited to the above-described structure. Each divided portion 132a may have various shapes. In particular, when the shape of the display module 10 is varied by operation of the variable member 20, the shape of each divided portion 132a may be correspondingly varied.

The line width T of each divided portion 132a may be about 1 to 5 mm. When the line width T of each divided portion 132a is smaller than about 1 mm, it may be difficult to greatly reduce the force required to achieve shape variation of the cover body 132. On the other hand, when the line width T of each divided portion 132a is greater than about 5 mm, the strength of the cover body 132 may be reduced. The rear cover 30 may also have degraded appearance due to the divided portions 132a. Of course, the present invention is not limited to the above-described line width T of each divided portion 132a. The line width T of each divided portion 132a may be varied in accordance with the size of the display module 10, the bending strength of the display module 10, shape variation of the display module 10, and etc.

The distance EL between each end of each divided portion 132a and the corresponding edge of the cover body 132 adjacent to the end may be determined to allow the cover body 132 to have an integrated structure while allowing the divided portion 132a to have a sufficient length. For example, the distance EL between each end of each divided portion 132a and the corresponding edge of the cover body 132 adjacent to the end may be about 5 to 20 mm. When the distance EL is smaller than about 5 mm, the corresponding portion of the cover body 132 may be damaged due to concentration of stress thereon. On the other hand, when the distance EL is greater than about 20 mm, the length of the divided portion 132a may be insufficient and, as such, great force may be required for shape variation of the rear cover 30. Of course, the present invention is not limited to the above-described condition. The distance EL may be varied in accordance with the size of the display module 10, the bending strength of the display module 10, shape variation of the display module 10, and etc.

In this embodiment, plural divided portions 132a are provided to achieve more easy shape variation of the rear cover 30. For example, the distance DT between adjacent two divided portions 132a (namely, the width of each divided section 320) may be 10 to 30% of the total lateral length of the cover body 132. When the distance DT between the adjacent divided portions 132 is smaller than 10% of the total lateral length, the strength of the rear cover 30 may be reduced and, as such, it may be difficult to effectively protect the display module 10 by the rear cover 30. On the other hand, when the distance DT between the adjacent divided portions 132 is greater than 30% of the total lateral length, great force may be required for shape variation of the rear cover 30 upon performing shape variation of the display module 10. Of course, the present invention is not limited to the above-described condition. The distance DT may be varied in accordance with the size of the display module 10, the bending strength of the display module 10, shape variation of the display module 10, and etc.

In this embodiment, the distance DT between the adjacent divided portions 132a is illustrated as being uniform throughout the rear cover 30. However, the present invention is not limited to the above-described condition. The distance DT between the adjacent divided portions 132a may be non-uniform. This will be described in detail with reference to FIG. 25.

In this embodiment, the divided portions 132a are formed at corresponding positions, respectively, while having the same length EL. That is, ends of the plural divided portions 132a disposed adjacent to one longitudinal edge of the cover body 132 (for example, the upper edge in the drawing) are spaced apart from the upper edge of the cover body 132 by the same distance. Similarly, ends of the plural divided portions 132a disposed adjacent to the other longitudinal edge of the cover body 132 (for example, the lower edge in the drawing) are spaced apart from the lower edge of the cover body 132 by the same distance. Accordingly, it may be possible to achieve an enhancement in symmetry characteristics of the cover body 132 while forming divided portions 132a having a sufficient length DL and, as such, an enhancement in stability of the cover body 132 may be achieved.

The cover body 132 may be made of various materials capable of protecting the display module 10 from external impact or the like while enabling the display apparatus 100 to have a desired strength. For example, the cover body 132 may be made of metal (for example, aluminum) or resin. The cover body 132 may have various thicknesses. For example, the cover body 132 may have a thickness of about 1.0 to 2.5 mm. Of course, the present invention is not limited to the above-described condition.

When the divided portions 132a are formed to penetrate through the cover body 132, as in this embodiment, the rear cover 30 may further include cover members 134 to cover through holes formed by the divided portions 132a, respectively. The cover member 134 may be made of various materials capable of the through holes formed by the divided portions 132a. For example, the cover members 134 may be made of a material such as fabric. In this case, the cover members 134 may be made of various fabric materials having stretchable characteristics (for example, fabric including polyurethane such as spandex). In this case, the cover members 134 may easily cope with shape variation of the rear cover 30. Of course, the present invention is not limited to the above-described materials. The cover members 134 may be made of fabric having stiffness (for example, nylon-based fabric or metallic fabric). In this case, each cover member 134 may be arranged such that the weaving direction thereof extends diagonally and, as such, is easily varied in shape upon shape variation of the rear cover 30. By the cover members 134, it is possible to prevent external contaminants from entering the through holes of the divided portions 132a. In addition, an enhancement in appearance is achieved because the divided portions 132a are hidden by the cover members 134.

Each cover member 134 may have a thickness of about 0.1 to 1.0 mm. When the thickness of the cover member 134 is smaller than about 0.1 mm, the cover member 134 may not effectively prevent introduction of external contaminants. On the other hand, when the thickness of the cover member 134 is greater than about 1.0 mm, the cost of the material of the cover member 134 may increase. In addition, the thickness of the display apparatus 100 may be unnecessarily increased. Such numerical limitation is only for illustrative purpose. The present invention is not limited to such numerical limitation. Accordingly, the cover member 134 may have various thicknesses.

In this embodiment, the rear cover 30 is illustrated as including a plurality of cover members 134 to correspond to respective divided portions 132a. Since the area of each divided portion 132a is small, the corresponding cover member 134 may be disposed only in a region where the divided portion 132a is formed and, as such, the material used to form the cover member 134 may be reduced. Of course, the present invention is not limited to the above-described condition. Cover members 134 may be formed to completely cover the rear cover 30. This will be described later with reference to FIG. 27.

The cover members 134 may be disposed at an inner surface of the rear cover 30 (namely, toward the display module 10. In this case, it is possible to prevent degradation of appearance caused by external exposure of the cover members 134. The cover members 134 may be fixed to the cover body 132 by an adhesive layer 136. For the adhesive layer 136, various materials may be used. For example, a double-sided tape may be used for convenient use. Thus, in this embodiment, the cover members 134 may be stably fixed, using a simple method. Of course, the present invention is not limited to the above-described structure. Various structures and methods capable of fixing the cover members 134 to the cover body 132 may be applied.

The cover body 132 may be constituted by a body portion 1321 and a flange portion 1322. The body portion 1321 substantially forms an outline while having a gently curved surface. The flange portion 1322 is a portion to connect the cover body 132 to the display module 10 and/or a frame 160 while being disposed at a peripheral edge of the body portion 1321.

At the flange portion 1322, fixing members having various structures for connection of the cover body 132 to the display module 10 and/or the frame 160 may be formed or arranged. For example, formation of first fastening holes 1322h at the flange portion 1322 is illustrated in the drawings. The first fastening holes 1322h may be formed to be uniformly spaced apart from one another. For example, each first fastening hole 1322h may be formed at the upper and lower edges of the cover body 132 at a position corresponding to a central portion of the associated divided section 320 (namely, a position corresponding to a central region between the associated adjacent divided portions 132a). Accordingly, it is possible to prevent concentration of stress at the divided portions 132a and, as such, an enhancement in stability of the cover body 132 is achieved. In addition, the divided sections 320 may be stably fixed. Fixing structures for the display module 10, flange portion 1322, and frame 160 will be described in more detail with reference to FIGS. 17 and 20.

Referring to FIGS. 17 and 20, first fastening members 14b are mounted to the support member 14 of the display module 10 at positions corresponding to the first fastening holes 1322h, respectively. For example, each first fixing member 14b may be a PEM nut.

The frame 160 surrounds the display module 10 and flange portion 1322. The frame 160 is formed with second fastening holes 40a at a portion thereof covering a rear surface of the flange portion 1322. For example, the frame 160 includes a front portion 401 disposed at a front surface of the display module 10, a side portion 402 to cover peripheral edges of the display module and flange portion 1322, and a rear portion 403 disposed at a rear surface of the flange portion 1322. The second fastening holes 40a may be formed at the rear portion 403. The second fastening holes 40a may be formed at positions corresponding to the first fastening holes 1322h of the flange portion 1322, respectively.

Second fastening members 142 may be fastened to respective first fastening members 14b. This fastening may be achieved by inserting the second fastening members 142 through the first fastening holes 1322h and second fastening holes 40a, respectively, under the condition that the display module 10 and flange portion 1322 are disposed at the inside of the frame 160. For the second fastening members 142, various structures enabling the second fastening members 142 to respective first fastening members 14b may be applied. For example, screws, bolts, or the like may be used.

In this case, it is possible to easily and firmly fix the display module 10, flange portion 1322, and frame 160 by the first and second fastening members 142, which have simple structures. Of course, the present invention is not limited to the above-described structures. The shapes, structures, and fastening methods of the first and second fastening members 14b and 142 may be diversely varied. For example, various methods such as fitting and adhesion may be employed.

The first and second fastening holes 1322h and 40a may be formed to be laterally elongated. When the display module 10 is varied in shape to have a curved surface having a certain curvature in the lateral direction of the display module 10, the divided sections 320 may be stretched and/or the line width of each divided portion 132a may be increased. To this end, the first and second fastening holes 1322h and 40a are formed to be laterally elongated in order to effectively cope with width variation of the divided sections 320 and/or divided portions 132a.

In this embodiment, each divided portion 132a extends to a portion of the flange portion 1322. In this case, it is possible to prevent the flange portion 1322 from functioning as a reinforcement and, as such, it is possible to prevent the flange portion 1322 from suppressing shape variation of the rear cover 30. Accordingly, shape variation of the rear cover 30 may be more easily achieved.

The above-described shape variation of the display apparatus 100 will be described in more detail with reference to FIGS. 21(*a*) and 21(*b*). For reference, FIGS. 21(*a*) and 21(*b*) are cross-sectional views taken along line E-E of FIG. 17.

The display module 10 is kept in a flat state, as shown in FIG. 21(*a*), under the condition that there is no force applied to the display module 10. When the user inputs a command for shape variation of the display module 10, the display module 10 is varied into a curved structure having a certain curvature (for example, a curved structure having a uniform radius of curvature R) in the lateral direction of the display module 10, as shown in FIG. 21(*b*). Thus, the display module 10 has a curved structure capable of providing an enhancement in sensory immersion of the user. In this case, the curved shape is retained by stopper members (not shown). When the user inputs a command to again vary the shape of the display apparatus 100 to return to a flat state, the variable member 20 is returned to its original state and, as such, does not apply force to the display module 10. Accordingly, the display module 10 is returned to a flat state, as shown in FIG. 21(*a*).

In this embodiment, the rear cover 30 can be varied in shape by small force, integrally with the display module 10, because the rear cover 30 includes a plurality of divided sections 320 defined by divided portions 132a. Accordingly, it is possible to minimize power consumption for shape variation of the display apparatus 100 while achieving uniform shape variation into a desired shape. Each divided portion 132a is spaced, at each end thereof, from the associated longitudinal edge of the rear cover 30 while forming a closed space. Accordingly, the plural divided sections 320 have a connected structure and, as such, the rear cover 30 has an integrated structure. As a result, enhanced structural stability of the rear cover 30 is provided during manufacture, transportation, and assembly of the rear cover 30. In addition, it is possible to reduce the cost and time required for manufacture, transportation, and assembly of the rear cover 30.

Figure 22:
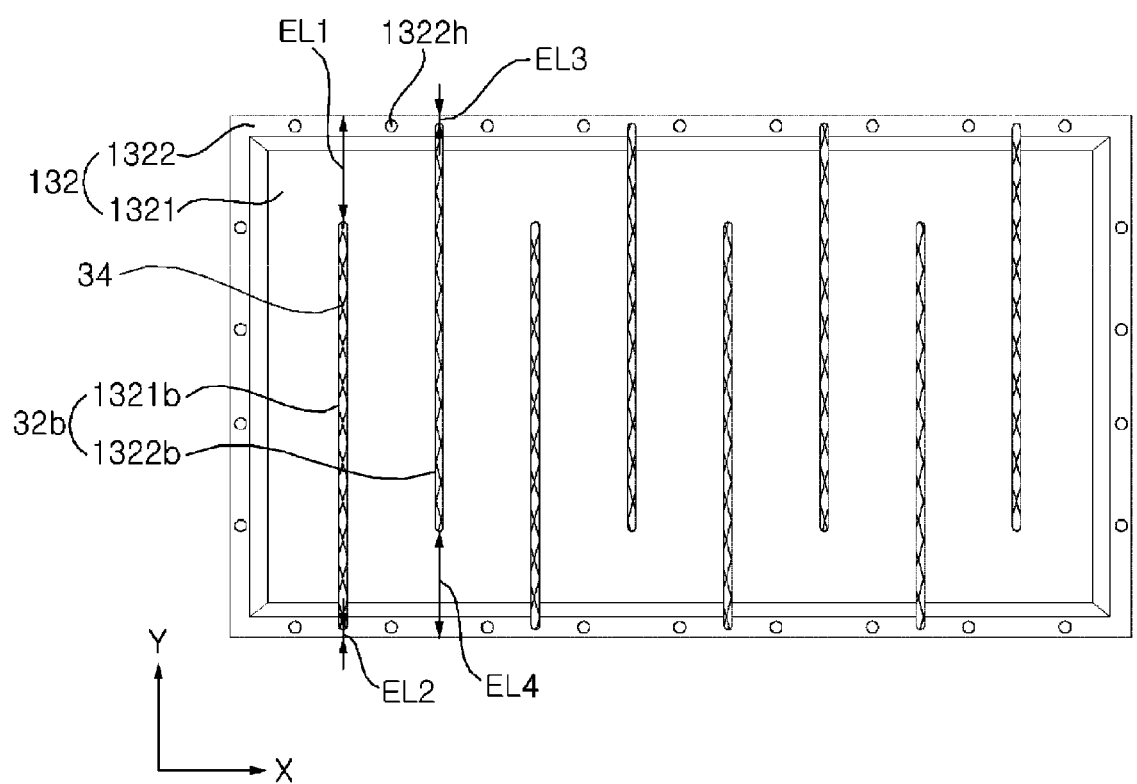
FIG. 22 is a rear plan view of a display apparatus according to another embodiment of the present invention.

FIG. 22 is a rear plan view of a display apparatus according to another embodiment of the present invention.

Referring to FIG. 22, in this embodiment, the rear cover 30 includes parallel divided portions 32b each including a first divided portion 1321b and a second divided portion 1322b formed at different positions while being parallel.

The first divided portion 1321b is formed to be positioned near one longitudinal edge of the rear cover 30 (the lower edge in FIG. 22). That is, the distance EL1 between one end of the first divided portion 1321b and one longitudinal edge of the rear cover 30 is greater than the distance EL2 between the other end of the first divided portion 1321b and the other longitudinal edge of the rear cover 30. In this case, the other end of the first divided portion 1321b extends to the flange portion 1322 formed at the other longitudinal edge of the rear cover 30.

The second divided portion 1322b is formed to be positioned near the other longitudinal edge of the rear cover 30 (the upper edge in FIG. 22). That is, the distance EL3 between one end of the second divided portion 1322b and one longitudinal edge of the rear cover 30 is smaller than the distance EL4 between the other end of the second divided portion 1322b and the other longitudinal edge of the rear cover 30. Accordingly, it is possible to easily achieve shape variation of the rear cover 30 by the first and second divided portions 1321b and 1322b while achieving an enhancement in strength of the rear cover 30 through reduction of the total area of the divided portions 32b. In this case, one end of the second divided portion 1322b extends to the flange portion 1322 formed at one longitudinal edge of the rear cover 30.

In this case, the distance EL1 between one end of the first divided portion 1321b and one longitudinal edge of the rear cover 30 may be approximate to the distance EL4 between the other end of the second divided portion 1322b and the other longitudinal edge of the rear cover 30. Similarly, the distance EL2 between the other end of the first divided portion 1321b and the other longitudinal edge of the rear cover 30 may be approximate to the distance EL3 between one end of the second divided portion 1322b and one longitudinal edge of the rear cover 30. That is, the first divided portions 1321b and second divided portions 1322b may be symmetrically formed with respect to the center of the rear cover 30. In this case, it is possible to reduce the total area of the divided portions 32b while securing excellent symmetry of the rear cover 30.

Figure 23:
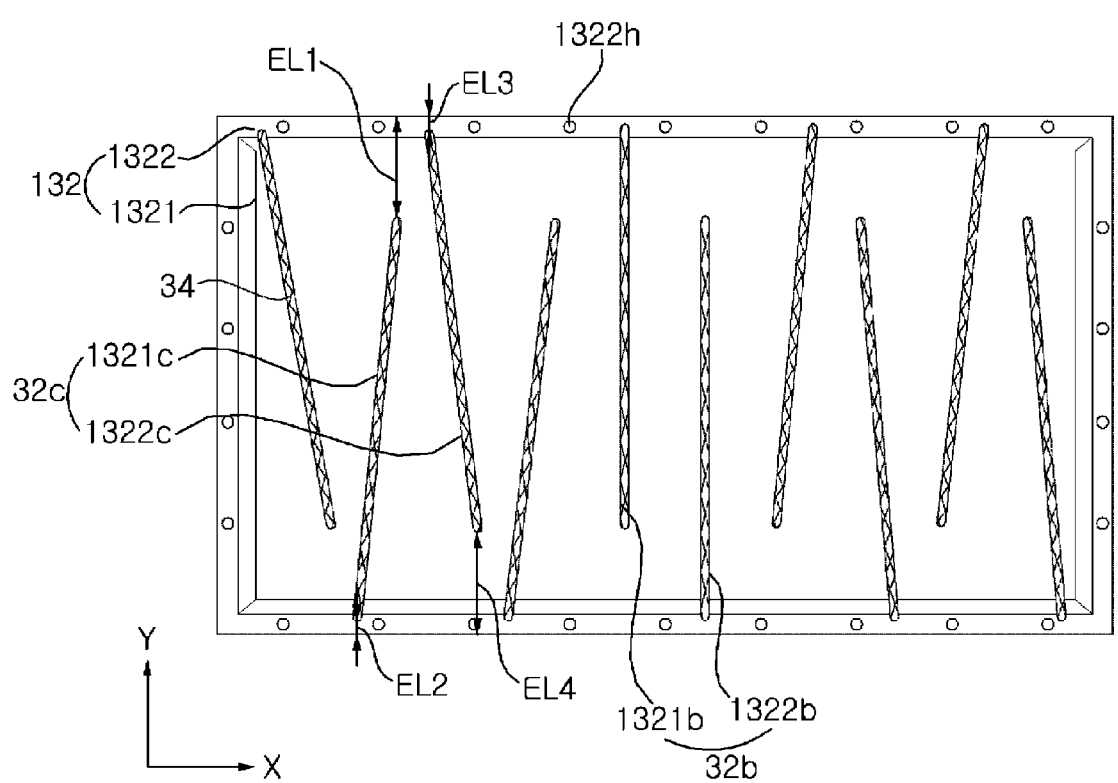
FIG. 23 is a rear plan view of a display apparatus according to another embodiment of the present invention.

FIG. 23 is a rear plan view of a display apparatus according to another embodiment of the present invention.

Referring to FIG. 23, in this embodiment, the rear cover 30 includes parallel divided portions 32b each including a first divided portion 1321b and a second divided portion 1322b formed at different positions while being parallel to lateral edges of the rear cover 30, and inclined divided portions 32c each including a third divided portion 1321c and a fourth divided portion 1322c. Since the parallel divided portions 32b have been described with reference to FIG. 22, no further description thereof will be given. Accordingly, only the inclined divided portions 32c will be described in detail.

Each inclined divided portion 32c is inclinedly formed such that an end portion of the inclined divided portion 32c spaced away from the facing longitudinal edge of the rear cover 30 is directed toward the center of the rear cover 30. This will be described in more detail.

The third divided portion 1321c is formed to be disposed near one longitudinal edge of the rear cover 30 (the lower edge in FIG. 23). That is, the distance EL1 between one end of the third divided portion 1321c and one longitudinal edge of the rear cover 30 is greater than the distance EL2 between the other end of the third divided portion 1321c and the other longitudinal edge of the rear cover 30. In this case, the other end of the third divided portion 1321c extends to the flange portion 1322 formed at the other longitudinal edge of the rear cover 30. In addition, the third divided portion 1321*c* is inclined such that one end of the third divided portion 1321*c* is closer to the center of the rear cover 30 than the other end of the third divided portion 1321*c*.

The fourth divided portion 1322*c* is formed to be positioned near the other longitudinal edge of the rear cover 30 (the upper edge in FIG. 23). That is, the distance EL3 between one end of the fourth divided portion 1322*c* and one longitudinal edge of the rear cover 30 is smaller than the distance EL4 between the other end of the fourth divided portion 1322*c* and the other longitudinal edge of the rear cover 30. Accordingly, it is possible to easily achieve shape variation of the rear cover 30 by the third and fourth divided portions 1321*c* and 1322*c* while achieving an enhancement in strength of the rear cover 30 through reduction of the total area of the divided portions 32*c*. In this case, one end of the fourth divided portion 1322*c* extends to the flange portion 1322 formed at one longitudinal edge of the rear cover 30. In addition, the fourth divided portion 1322*c* is inclined such that the other end of the fourth divided portion 1322*c* is closer to the center of the rear cover 30 than one end of the fourth divided portion 1322*c*.

In this case, the distance EL1 between one end of the third divided portion 1321*c* and one longitudinal edge of the rear cover 30 may be approximate to the distance EL4 between the other end of the fourth divided portion 1322*c* and the other longitudinal edge of the rear cover 30. Similarly, the distance EL2 between the other end of the third divided portion 1321*c* and the other longitudinal edge of the rear cover 30 may be approximate to the distance EL3 between one end of the fourth divided portion 1322*c* and one longitudinal edge of the rear cover 30. That is, the third divided portions 1321*c* and fourth divided portions 1322*c* may be symmetrically formed with respect to the center of the rear cover 30. In this case, it is possible to reduce the total area of the divided portions 32*b* and 32*c* while securing excellent symmetry of the rear cover 30.

In this embodiment, the parallel divided portions 32*b* are disposed toward a central portion of the rear cover 30, whereas the inclined divided portions 32*c* are disposed outside the parallel divided portions 32*b*. In this case, accordingly, the rear cover 30 may be easily varied into a desired shape throughout the entirety thereof when the display module 10 is varied in shape to have certain radii of curvature in vertical and lateral directions.

Figure 24:
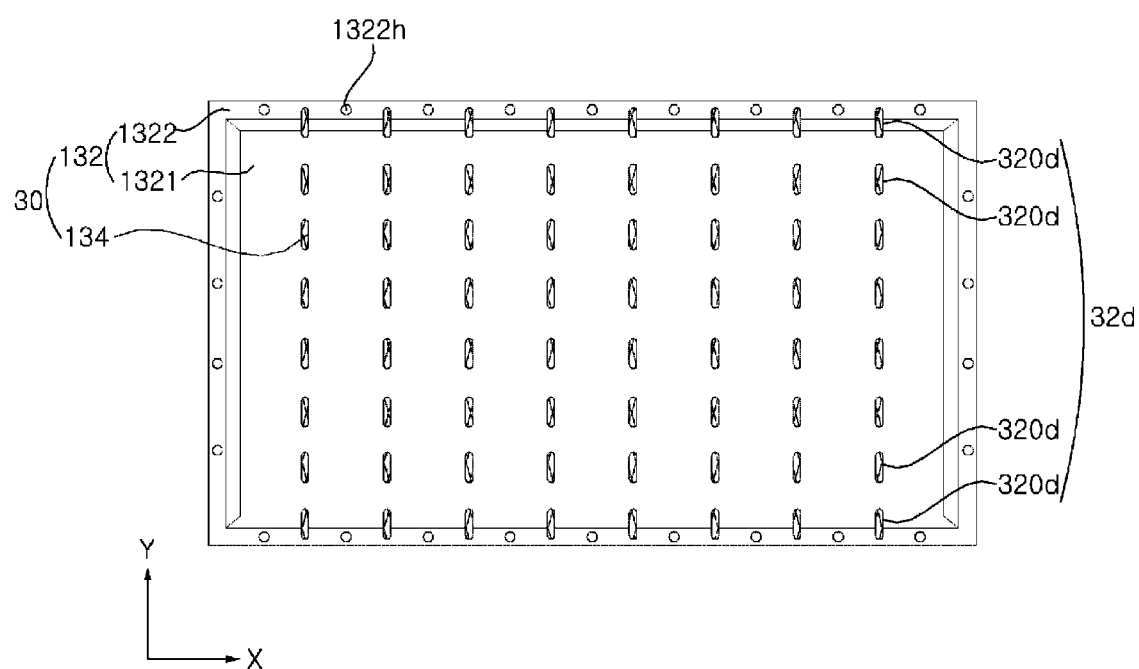
FIG. 24 is a rear plan view of a display apparatus according to another embodiment of the present invention.

FIG. 24 is a rear plan view of a display apparatus according to another embodiment of the present invention.

Referring to FIG. 24, in this embodiment, the rear cover 30 includes divided portions 32*d* each including a plurality of divided portions 320*d*. That is, each divided portion 32*d* does not have an elongated shape, but has a plurality of spaced divided portions 320*d*. In this case, the total area of the divided portions 32*d* can be reduced and, as such, it is possible to effectively cope with shape variation of the rear cover 30 while increasing the strength of the rear cover 30.

Figure 25:
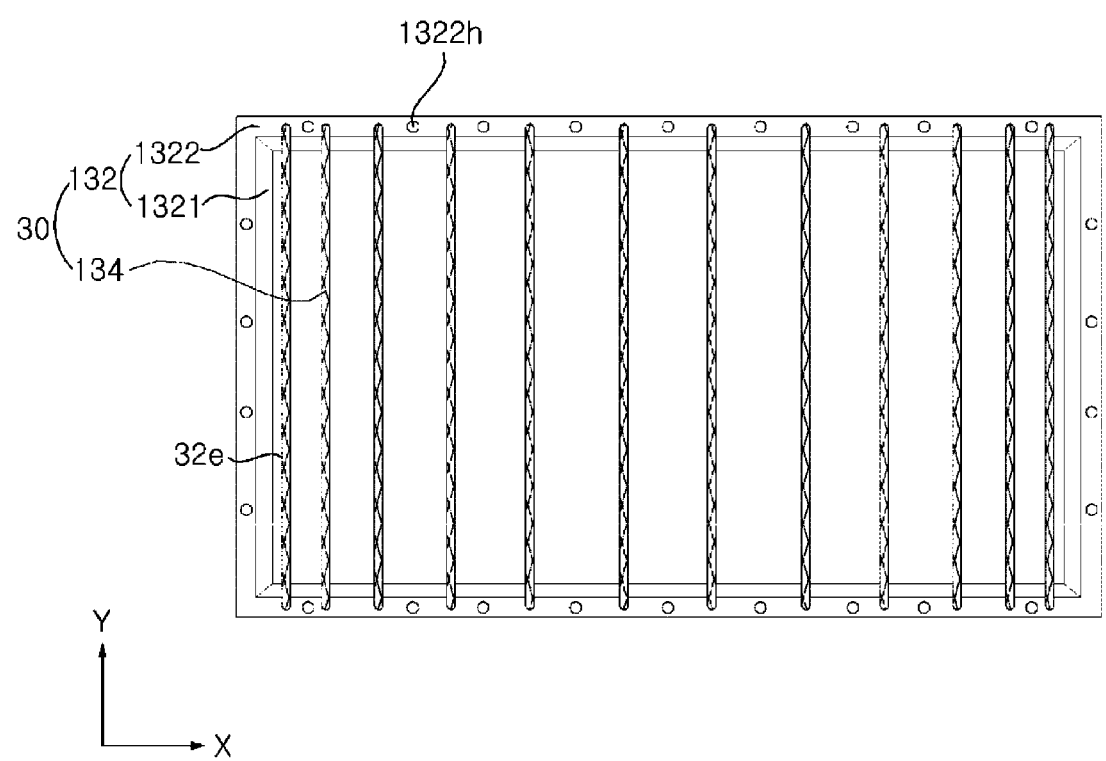
FIG. 25 is a rear plan view of a display apparatus according to another embodiment of the present invention.

FIG. 25 is a rear plan view of a display apparatus according to another embodiment of the present invention.

Referring to FIG. 25, divided portions 32*e* are illustrated. In this embodiment, the spacing of the divided portions 32*e* may be non-uniform such that the space at each lateral portion of the rear cover 30 is smaller than the spacing at the central portion of the rear cover 30. For example, the spacing of the divided portions 32*e* is uniform at the central portion of the rear cover 30 and, as such, plural divided sections 320 having the same width or similar widths are arranged at the central portion of the rear cover 30. In a region other than the central portion of the rear cover 30, the spacing of the divided portions 32*e* may be gradually reduced. In this case, accordingly, the divided sections 320 may have reduced widths in the lateral portions of the rear cover 30 where greater shape variation occurs and, as such, it is possible to minimize force required for shape variation of the rear cover 30.

Figure 26:
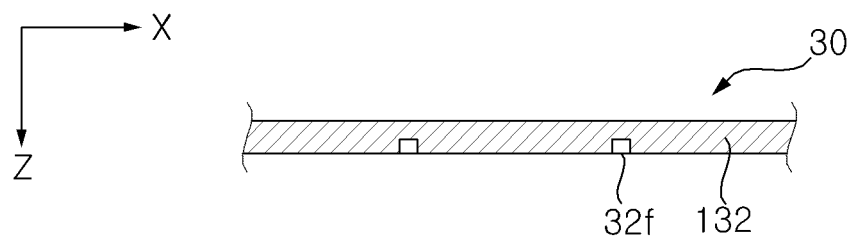
FIG. 26 is a sectional view illustrating a portion of a rear cover included in a display apparatus according to another embodiment of the present invention.

FIG. 26 is a sectional view illustrating a portion of a rear cover included in a display apparatus according to another embodiment of the present invention.

Referring to FIG. 26, divided portions 32*f* are illustrated. In this embodiment, each divided portion 32*f* is formed by cutting out or removing a thickness portion of the rear cover 30. That is, each divided portion 32*f* may have the form of a notch, a cavity, a groove, a trench or the like.

In this embodiment, plural divided sections 320 are defined by the divided portions 32*f* while remaining in a connected state. Similarly to the above-described cases, in this case, it is possible to reduce force required to deform the rear cover 30 in accordance with partial removal of the rear cover 30 in the form of a certain pattern by the divided portions 32*f*. When the divided portions 32*f* are disposed at the outer surface of the rear cover 30, it is possible to more easily vary the rear cover 30, and thus, to more easily vary the display module 10 into a curved structure.

In this embodiment, the divided sections, which are divided by the divided portions 32*f*, are not completely separated from one another such that they are in a connected state. In FIG. 26, each divided portion 32*f* is illustrated as having a quadrangular cross-section. In this case, it is possible to reduce the number of regions where stress is relatively concentrated, and to stably maintain the rear cover 30. Accordingly, even when shape variation occurs repeatedly, it is possible to avoid fatigue fracture of the rear cover 30. Of course, the present invention is not limited to the above-described structure. For example, each divided portion 32*f* may have a triangular cross-section. In this case, it is possible to more easily manufacture the rear cover 30 and to further reduce force required to deform the rear cover 30. Alternatively, each divided portion 32*f* may have a round shape in order to further reduce stress concentration. That is, each divided portion 32*f* may have various round shapes such as various polygonal shapes, a semicircular shape, a semi-oval shape, and a U shape.

Figure 27:
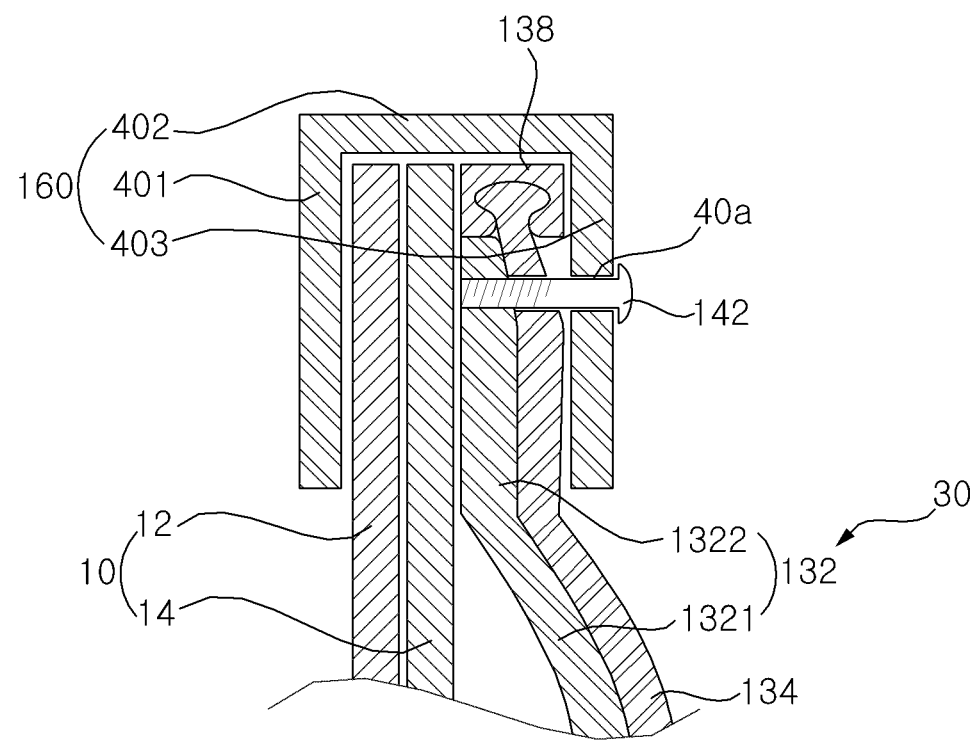
FIG. 27 is a sectional view partially illustrating a display apparatus according to another embodiment of the present invention.

FIG. 27 is a sectional view partially illustrating a display apparatus according to another embodiment of the present invention. FIG. 27 illustrates a portion corresponding to the portion illustrated in FIG. 5.

Referring to FIG. 27, a single cover member 134 is illustrated. In this embodiment, cover members corresponding to respective divided portions are not provided. In this embodiment, the single cover member 134 covers the entirety of the cover body 132. By virtue of the cover member 134, it is possible not only to achieve an enhancement in the structural stability of the rear cover 30 with the plural divided sections 320, but also to achieve an enhancement in aesthetics.

The cover member 134 may be disposed on the rear cover 30 in accordance with various methods. For example, the cover member 134 is illustrated as being disposed at the outer surface of the rear cover 30 in FIG. 27. However, the present invention is not limited to the above-described arrangement. The cover member 134 may be disposed at the inner surface of the rear cover 30, similarly to those of the above-described embodiments.

For example, in the illustrated embodiment, the longitudinal edges of the cover member 134 are fitted in guide members 138, respectively, and each of the guide members 60 is then fitted between the cover body 132 and the frame 160. In this state, the support member 14, rear cover 30, and frame 160 are fastened and, as such, the cover member 134 is fixed within the frame 160. In a modified embodiment, the cover member 134 may be attached to the cover body 132 by an adhesive material or the like. Using various other methods, the cover member 134 may be fixed to the cover body 132.

Figure 28:
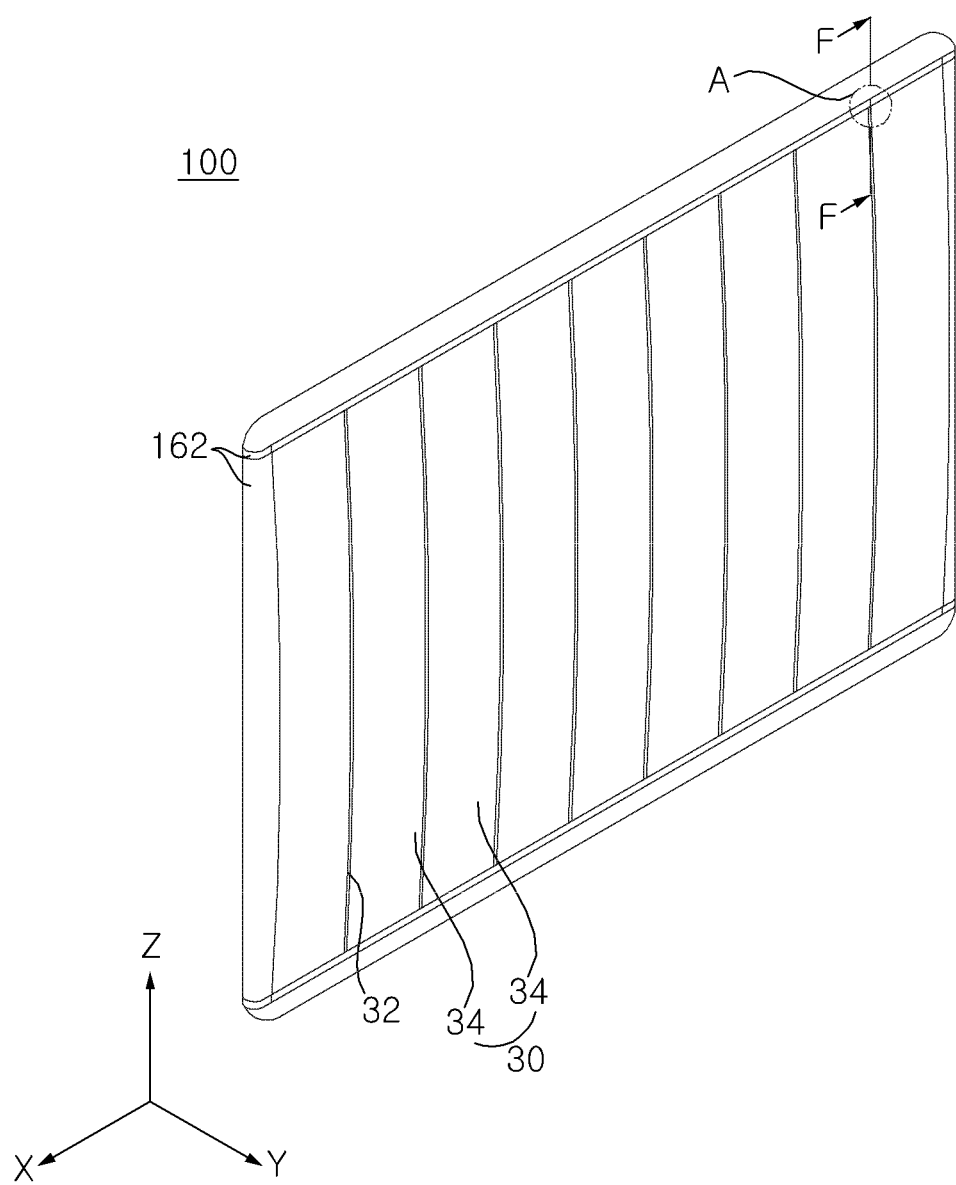
FIG. 28 is a rear perspective view schematically illustrating a display apparatus according to an exemplary embodiment of the present invention.
Figure 29:
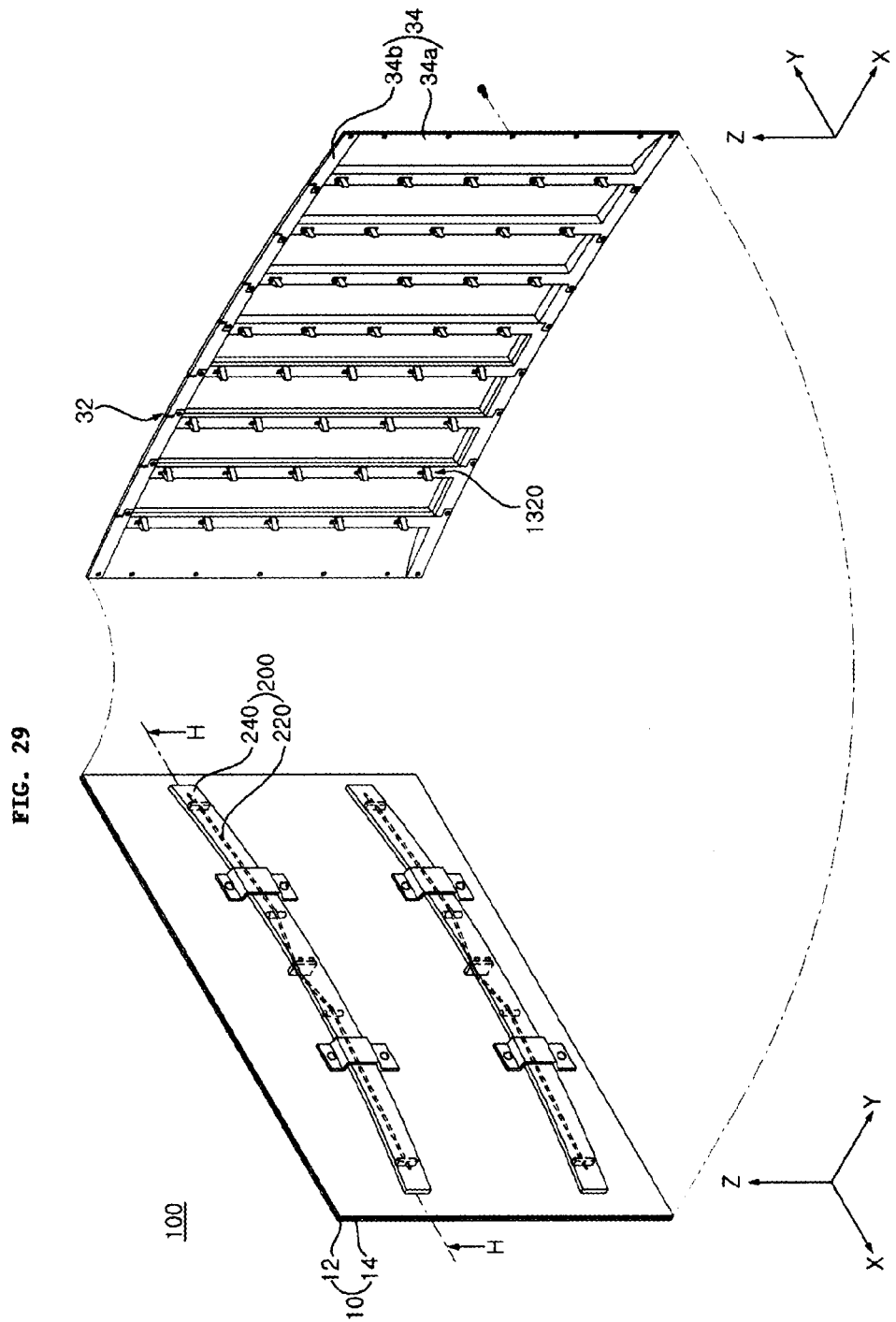
FIG. 29 is an exploded perspective view partially illustrating the display apparatus according to the embodiment illustrated in FIG. 28.

FIG. 28 is a rear perspective view schematically illustrating a display apparatus according to an exemplary embodiment of the present invention. FIG. 29 is an exploded perspective view partially illustrating the display apparatus according to the embodiment illustrated in FIG. 28.

Referring to FIGS. 28 and 29, a rear cover 30 is illustrated. In this embodiment, the rear cover 30 includes a plurality of divided sections 34. Divided portions 32 completely divide adjacent ones of the divided sections 34. Referring to FIG. 29, the plural divided sections 34, which are separately formed, are connected by fasteners 1320 and, as such, the rear cover 30 has an integrated structure. In this embodiment, the plural divided sections 34 are illustrated as being directly connected by the fasteners 1320. However, the present invention is not limited to the above-described structure. The divided sections 34 may be connected by means of another configuration disposed between adjacent ones of the divided sections 34. This will be described later in more detail with reference to FIGS. 38 and 39.

The divided sections 34 defined by the divided portions 32 may be vertically elongated. Each divided section 34 may include a body 34a having a gently curved surface while forming an appearance of the divided section 34, and fixing ends 34b respectively provided at opposite vertical ends of the body 34a, to be fixed to frames 162. Fixing of the fixing ends 34b to the frames 162 may be achieved by first fastening members 236. Thus, each divided section 34 is fixed to the frames 162 by the fixing ends 34b respectively formed at the ends of the divided section 34 opposite to each other in the vertical direction crossing the variation direction of the divided section 34. Since the opposite vertical ends of the divided section 34 are in a fixed state, but opposite lateral ends of the divided section 34 are in a non-fixed state, the divided sections 34 can be easily varied by force applied in a lateral direction thereto.

Figure 30:
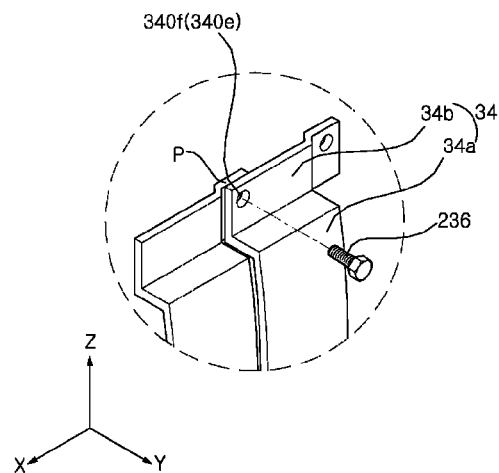
FIG. 30 is an enlarged perspective view corresponding to a portion A of FIG. 28, illustrating a fixing end portion of the rear cover in an enlarged state.
Figure 31:
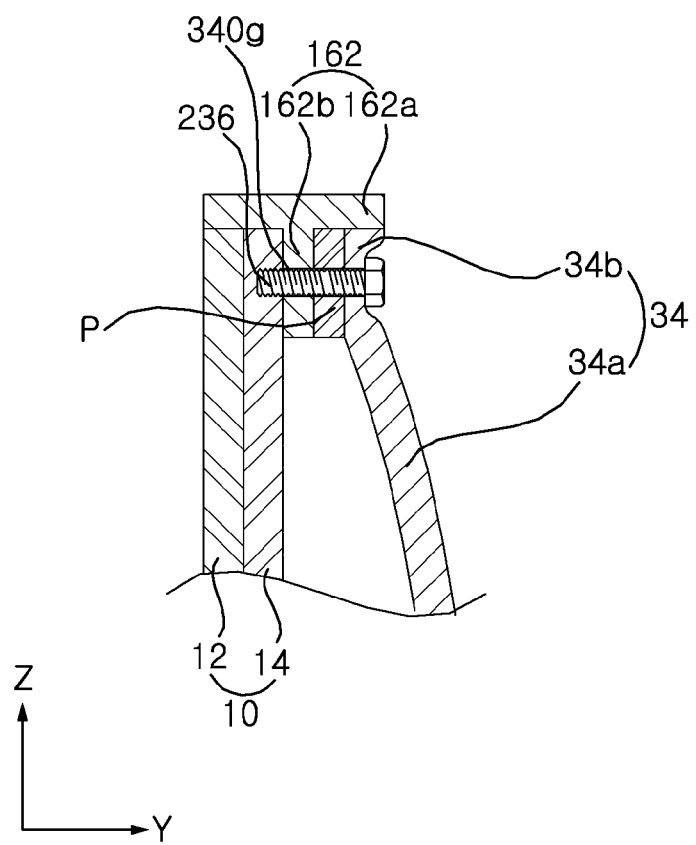
FIG. 31 is a cross-sectional view taken along line F-F of FIG. 28.

Hereinafter, the structure of each fixing end 34b and the structure for fixing the corresponding fixing end 34b and frame 162 in the display apparatus 100 according to this embodiment will be described in more detail with reference to FIGS. 30 and 31. FIG. 30 is an enlarged perspective view corresponding to a portion A of FIG. 28. FIG. 30 illustrates a fixing end portion of the rear cover in an enlarged state. FIG. 31 is a cross-sectional view taken along line F-F of FIG. 28.

For example, each fixing end 34b is formed to be further protruded toward the display module 10 than toward the body 34a (in more detail, toward a second frame portion 162b of the corresponding frame 162 disposed at the rear surface of the display module 10). The fixing end 34b is parallel with the second frame portion 162b, to closely contact the second frame portion 162b. Accordingly, the fixing end 34b may be stably fixed. The body 34a is spaced apart from the display module 10 and, as such, a sufficient space to receive the variable member 20, panel driver, and etc. may be formed between the body 34a and the display module 10. Of course, the present invention is not limited to the above-described structure. Each divided section 34 may have various structures.

Each fixing end 34b of each divided section 34 may have a protrusion P formed at one lateral end portion of the fixing end 34b in order to overlap with the neighboring divided section 34. Accordingly, the protrusion P formed at the fixing end 34b of one divided section 34 overlaps with the fixing end 34b of the divided section 34 neighboring the subject divided section 34. A screw hole 340e is formed through the protrusion P formed at each fixing end 34b of each divided section 34. A screw hole 340f corresponding to the screw hole 340e is also formed at the neighboring divided section 34 overlapping with the protrusion P at a position corresponding to the screw hole 340e. A screw hole 340g is also formed through the second frame portion 162b at a position corresponding to the screw hole 340e. The neighboring two divided sections 34 may be fixed to the second frame portion 162b through fastening of a first fastening member 236 (for example, a screw) through the screw holes 340g, 340e, and 340f. Accordingly, the spaced two divided sections 34 may be stably fixed to the frame 162. Through the screw fastening structure, it is possible to simply and firmly fix the upper and lower ends of each divided section 34 to the frames 162. In the drawing, the first fastening member 236 is illustrated as being fastened to the support member 14 after penetrating through the frame 162. However, the present invention is not limited to the above-described structure. That is, various modifications may be implemented. For example, the first fastening member 236 is fastened only to the frame 162 without being fastened to the support member 14.

The portion of the protrusion P of the fixing end 34b where the screw hole 340e to be coupled with the first fastening member 236 is formed may have a concave structure when viewed at the rear side (namely, to be protruded toward the display module 10). In this case, accordingly, when the first fastening member 236 is fastened through the screw holes 340g, 340e, and 340f, the surface of the fixing end 34b, at which the first fixing member 236 is not disposed, may be flush with the surface of the first fixing member 236. As a result, it is possible to prevent the first fixing member 236 from appearing as being protruded.

The screw holes 340g, 340e, and 340f may be formed to be laterally elongated. When the display module 10 is varied in shape to have a curved surface having a predetermined radius of curvature R in the lateral direction of the display module 10, the divided sections 34 may be stretched and/or the width of the divided portions 32 may be increased. To this end, the screw holes 340g, 340e, and 340f are formed to be laterally elongated in order to effectively cope with width variation of the divided sections 34 and/or divided portions 32.

Of course, the present invention is not limited to the above-described structure. The structure for fixing the rear cover 30 and frames 162 may be diversely varied. For example, various methods such as fitting and adhesion may be employed for fixing of the rear cover 30 and frames 162. Again referring to FIG. 29, in this embodiment, the plural divided sections 34 are illustrated as having the same width. Here, the "same width" not only includes widths that are physically completely equal to each other, but also includes widths that may be considered to be equal to each other, taking into consideration manufacturing tolerance or the like. When a plurality of divided sections 34 having the same width, as described above, is used, it is possible to form the divided sections 34 in the same process, and to form the rear cover 30, using the divided sections 34 formed in the same process. Accordingly, the manufacturing process is simplified. Of course, the present invention is not limited to the above-described embodiment, and it may be possible to employ divided sections 34 having different widths.

Figure 32:
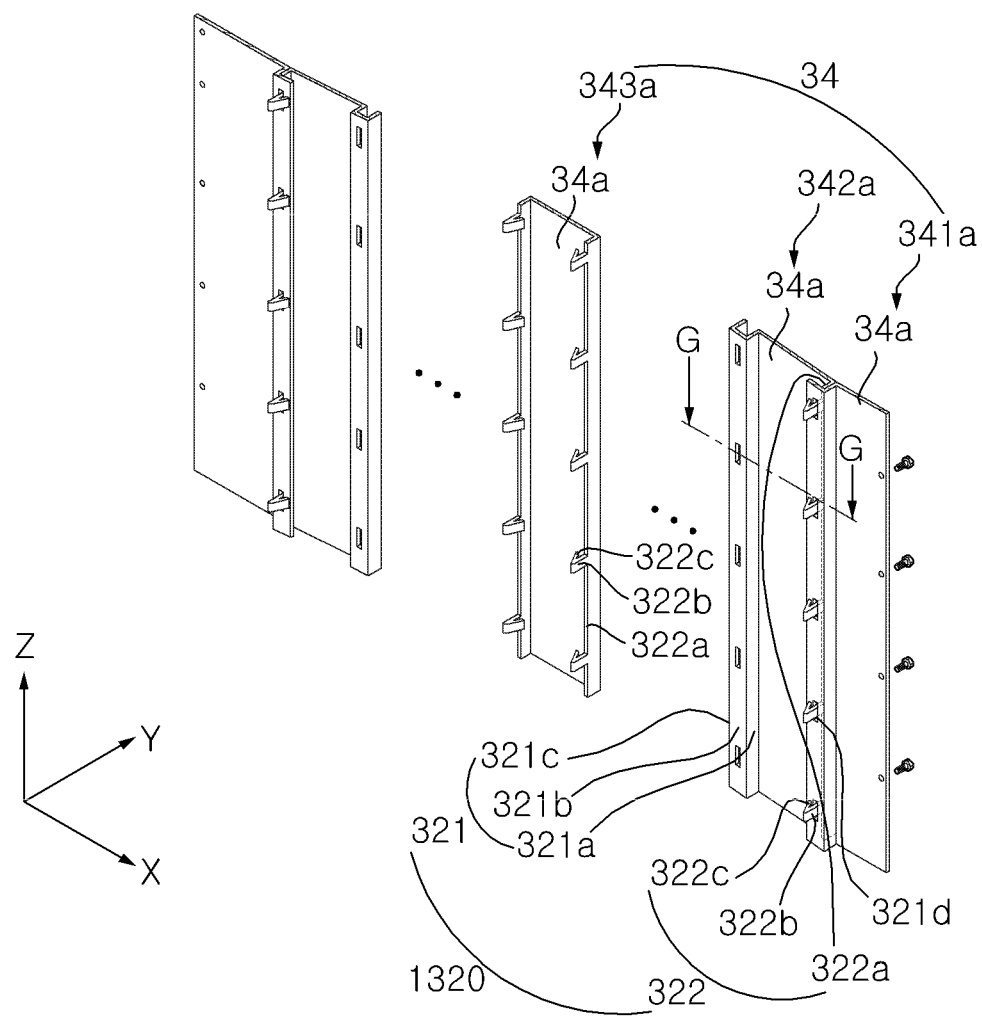
FIG. 32 is a perspective view illustrating a body of a divided section illustrated in FIG. 29.
Figure 33:
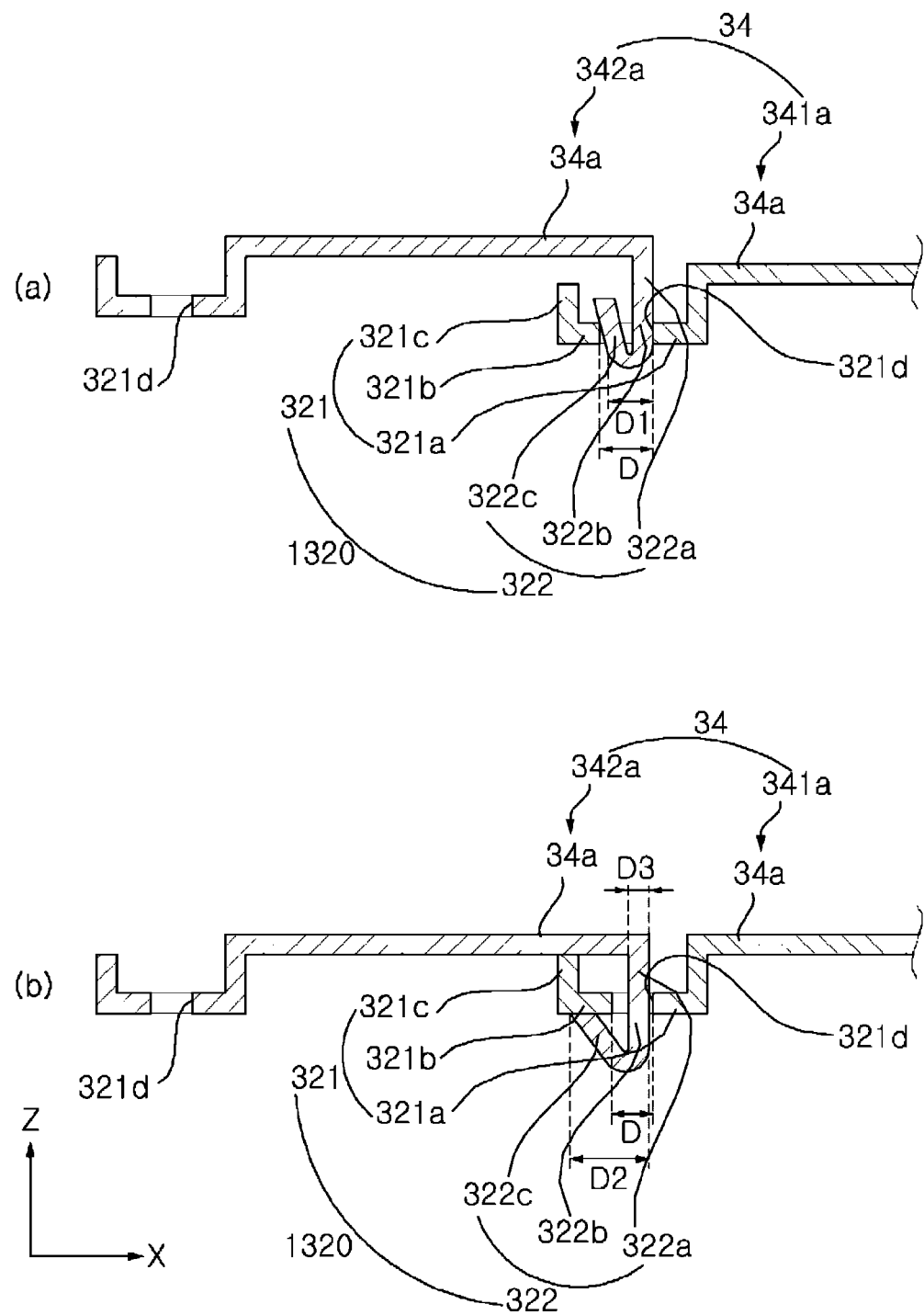
FIGS. 33(a) and 33(b) are cross-sectional views taken along line G-G of FIG. 32.

Adjacent lateral ends of the neighboring divided sections 34 (in more detail, the neighboring bodies 34a) may be connected while being movable with respect to each other. The structure for fixing the body 34a by the fasteners 1320 will be described in more detail with reference to FIGS. 32 and 33. FIG. 32 is a perspective view illustrating the body of the divided section illustrated in FIG. 29. FIGS. 33(a) and 33(b) are cross-sectional views taken along line G-G of FIG. 32.

Referring to FIGS. 32, 33(a) and 33(b), each divided section 34 (in more detail, the body 34a) may be formed with fasteners 1320, to be fastened to the neighboring divided section 34. For example, when it is assumed that two neighboring divided sections 34 are referred to as a first divided section 341a and a second divided section 342a, respectively, a first fastening portion 321 is formed at the first divided section 341a, and a second fastening portion 322 is formed at the second divided section 342a. Accordingly, the first divided section 341a and second divided section 342a may be fastened to each other by the first and second fastening portions 321 and 322.

In this embodiment, the first fastening portion 321 protrudes from one side of the first divided section 341a toward the second divided section 342a. The first fastening portion 321 may be provided with fastening holes 321d. In more detail, the first fastening portion 321 includes a first protrusion part 321a protruding from one side of the first fastening portion 321 adjacent to the second divided section 342a toward the display module 10, and an overlap part 321b extending from the first protrusion part 321a in a bent state, to overlap with the second divided section 342a. A plurality of uniformly spaced fastening holes 321d is formed at the overlap part 321b. The first fastening portion 321 may further include an extension part 321c extending from an end of the overlap part 321b in a rearward direction in a bent state or toward the second divided section 342a.

The overlap part 321b may extend from a position not overlapping with the second divided section 342a by the first protrusion part 321a, to cover a portion of the second divided section 342a. The overlap part 321b is fastened with the second fastening portion 322 by the fastening holes 321d. The overlap part 321b also functions to hide the gap formed between the first divided section 341a and the second divided section 342a when the first and second divided sections 341a and 342a move away from each other, in order to prevent the gap from being recognized at the outside. The extension part 321c functions to support the second divided section 342a and, as such, prevents the second divided section 342a from being bent toward the overlap part 321b. For example, an end of the extension part 321c may contact the second divided section 342a and, as such, may support the second divided section 342a.

The second fastening portion 322 may include a second protrusion part 322a protruding from an end of the second fastening portion 322 adjacent to the first divided section 341a toward the display module 10, and latches 322b-322c extending from the second protrusion part 322a at positions corresponding to the fastening holes 321d, respectively. In more detail, each latch 322b-322c may include a first latch part 322b extending from the second protrusion part 322a toward the display module 10, and a second latch part 322c extending from the first latch part 322b away from the display module 10 in a direction inclined with respect to the display module 10.

In this case, the distance between the outer edges of the first and second latch parts 322b and 322c in each latch 322b-322c may be relatively small at a first end of the latch 322b-322c where the first and second portions 322b and 322c are connected (namely, a portion of the latch 322b-322c adjacent to the display module 10). That is, each latch 322b-322c may have a first width D1 at the first end thereof. On the other hand, the distance between the outer edges of the first and second latch parts 322b and 322c in each latch 322b-322c may be relatively great at a second end of the latch 322b-322c opposite to the first end (namely, a portion of the latch 322b-322c near the body 34a or second protrusion part 322a). That is, each latch 322b-322c may have, at the second end thereof, a second width D2 greater than the first width D1. The distance between the outer edges of the first and second latch parts 322b and 322c in each latch 322b-322c may be gradually increased as the latch 322b-322c extends from the first end toward the second end.

In this case, the first width D1 may be smaller than a width D of each fastening hole 321d. The second width D2 may be equal to or greater than the width D of the fastening hole 321d. The width D of the fastening hole 321d may be greater than a thickness D3 of the first latch part 322b. The second width D2 may be greater than the width D of the fastening hole 321d.

As illustrated in FIGS. 33(a) and 33(b), it is possible to fasten the first and second divided sections 341a and 341b to each other by forcibly fitting the latches 322b-322c of the second fastening portion 322 into the corresponding fastening holes 321d of the first fastening portion 321. In this case, fitting force is applied toward the display module 10 in a state in which the second divided section 342a is disposed at the rear surface of the first divided section 341a. That is, each latch 322b-322c may be easily inserted into the corresponding fastening hole 321d because the first width D1 of the latch 322b-322c is equal to or smaller than the width D of the fastening hole 321d, as illustrated in FIG. 33(a). When fitting force is applied to the latch 322b-322c, the second latch part 322c is pushed to move toward the first latch part 322b and, as such, the distance between the second latch part 322c and the first latch part 322b is narrowed. As a result, the latch 322b-322c passes through the fastening hole 321d, as illustrated in FIG. 33(b). After passing through the fastening hole 321d, the second latch part 322c is moved away from the first latch part 322b and, as such, is recovered to have the second width D2. Since the second width D2 is greater than the width D of the fastening hole 321d, the second latch part 322c is disposed at the overlap part 321b and, as such, functions to prevent the latch 322b-322c from being separated from the fastening hole 321d. Since the thickness D3 of the first latch part 322b is smaller than the width D of the fastening hole 321d, the first latch part 322b is laterally movable while having a certain clearance within the fastening hole 321d.

Since the first latch part 322b is movable by a predetermined distance within the fastening hole 321d, the distance between the first divided section 341a and the second divided section 342a is increased or decreased during shape variation of the display module 10 under the condition that the first and second divided sections 341a and 342a are stably fastened to each other. Accordingly, it is possible to effectively cope with a variation in the distance between divided sections 34 and a variation in the width of each divided portion 32.

The plural divided sections 34 are firmly connected in accordance with fastening of the first and second fastening portions 321 and 322 and, as such, the rear cover 30 has an integrated structure. In this case, each of the divided sections 34 disposed at respective outermost lateral sides may be provided, at an outer edge thereof, with fixing parts (for example, screw holes) for fixing of the divided section 34 to the frame 160. The first fastening portion 321 or second fastening portion 322 may be provided at an inner edge of the outermost divided section 34. The divided section 34, which is centrally disposed, namely, a central divided section 343a, is provided, at each lateral edge thereof, with one of the first and second fastening portions 321 and 322. Each of the divided sections 34 disposed between the central divided section 343a and each outermost divided section 34 may be provided, at one lateral edge thereof, with the first fastening portion 321 while being provided, at the other lateral edge thereof, with the second fastening portion 322. In accordance with the above-described structures, it is possible to connect the plural divided sections 34 in order to form an integrated structure.

FIG. 32 illustrates that the first fastening portion 321 is provided at the inner edge of each outermost divided section 34, the second fastening portion 322 is provided at each lateral edge of the central divided section 343a, and each of the divided sections 34 disposed between the central divided section 343a and each outermost divided section 34 is provided, at outer edge thereof, with the second fastening portion 322 while being provided, at the inner edge thereof, with the first fastening portion 321. In this case, it is possible to assembly the rear cover 30 by sequentially fastening the divided sections 34, starting from each outermost divided section 34, and then fastening the central divided section 343c to the fastened structures. Accordingly, the manufacturing process is simplified. In addition, enhanced structural stability is obtained because the divided sections 34 have a symmetrical structure with respect to the central divided section 343c. Furthermore, it is possible to easily manufacture the rear cover 30 having the plural divided sections 34, using a family mold.

The divided sections 34 of the rear cover 30 should include a material having strength enabling the divided sections 34 to constitute the rear surface of the display apparatus 100 while being light in weight and easily shape-variable. The divided sections 34 may include various metals, resins or the like. As metals, aluminum or the like that is light in weight while being suitable for shape variation may be employed. As resins, rubber or the like may be employed. In this embodiment, the first and second fastening portions 321 and 322 may be formed to be integrated with the corresponding divided section 34, to constitute portions of the divided section 34. In this case, it is possible to simplify the structure and manufacturing process, as compared to the case in which separate fasteners 1320 are used. Of course, the present invention is not limited to the above-described conditions. Various modifications may be possible. For example, fasteners 1320 are manufactured to be separate from the divided sections 34, and are subsequently fixed to the divided sections 34.

The above-described shape variation of the display apparatus 100 will be described in more detail with reference to FIGS. 34(a) and 34(b). FIGS. 34(a) and 34(b) are views explaining shape variation of the display apparatus according to an exemplary embodiment of the present invention. For reference, FIGS. 34(a) and 34(b) are cross-sectional views taken along line H-H of FIG. 29.

The display module 10 is kept in a flat state, as shown in FIG. 34(a), under the condition that there is no force applied to the display module 10. When the user inputs a command for shape variation of the display module 10, the display module 10 is varied into a curved structure having a certain curvature (for example, a curved structure having a uniform radius of curvature R) in the lateral direction of the display module 10, as shown in FIG. 34(b). Thus, the display module 10 has a curved structure capable of providing an enhancement in sensory immersion of the user. In this case, the rear cover 30 fixed to the display module 10 is also varied in shape to have a curved surface. Since the divided sections 34 are connected by the fasteners 1320 under the condition that the distance between the neighboring divided sections 34 or the distance between the adjacent divided portions 32 is easily adjustable, shape variation of the rear cover 30 can be easily achieved. When the user inputs a command to again vary the shape of the display apparatus 100 to return to its original shape, the locking state of the stopper member is released, or supply of current to the varying section 22 is cut off. As a result, the varying section 22 is returned to its original state thereof, as shown in FIG. 34(a).

As described above, in the illustrated embodiment, the rear cover 30 can be varied in shape by small force, integrally with the display module 10, because the rear cover 30 includes a plurality of divided sections 34 defined by divided portions 32. Accordingly, it is possible to minimize power consumption for shape variation of the display apparatus 100 while achieving uniform shape variation into a desired shape. In this case, the rear cover 30 has an integrated structure because the plural divided sections 34 are connected by the fasteners 1320. Accordingly, it is possible to simplify the structure of the rear cover 30 while achieving easy handling of the rear cover 30.

Hereinafter, a display apparatus according to another exemplary embodiment of the present invention and a rear cover included in the display apparatus will be described with reference to the accompanying drawings. With regard to the following embodiments, no description may be given of matters identical or very similar to those of the above-described embodiments, and only the different matters may be described in detail.

Figure 35:
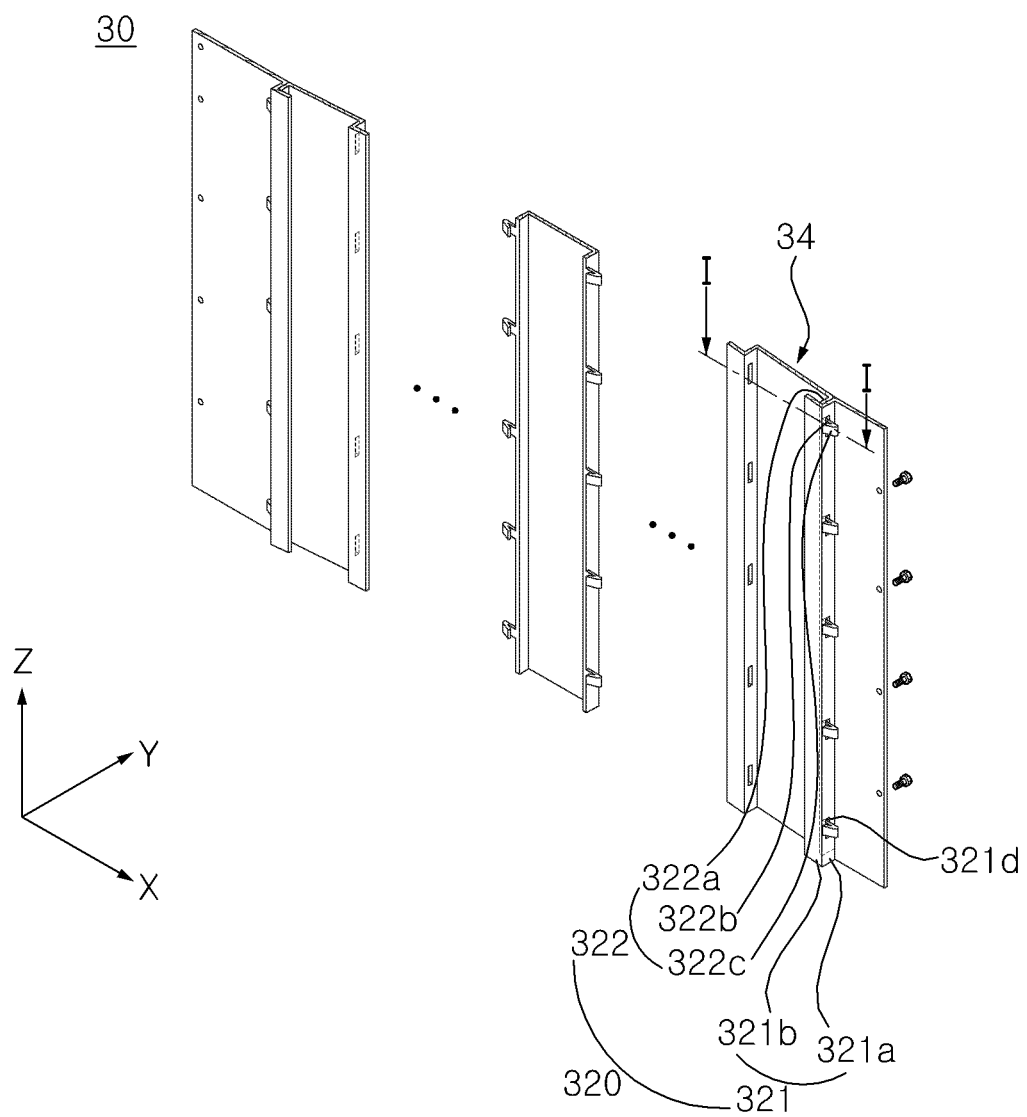
FIG. 35 is a perspective view partially illustrating a rear cover employed in a display apparatus according to another exemplary embodiment of the present invention.
Figure 36:
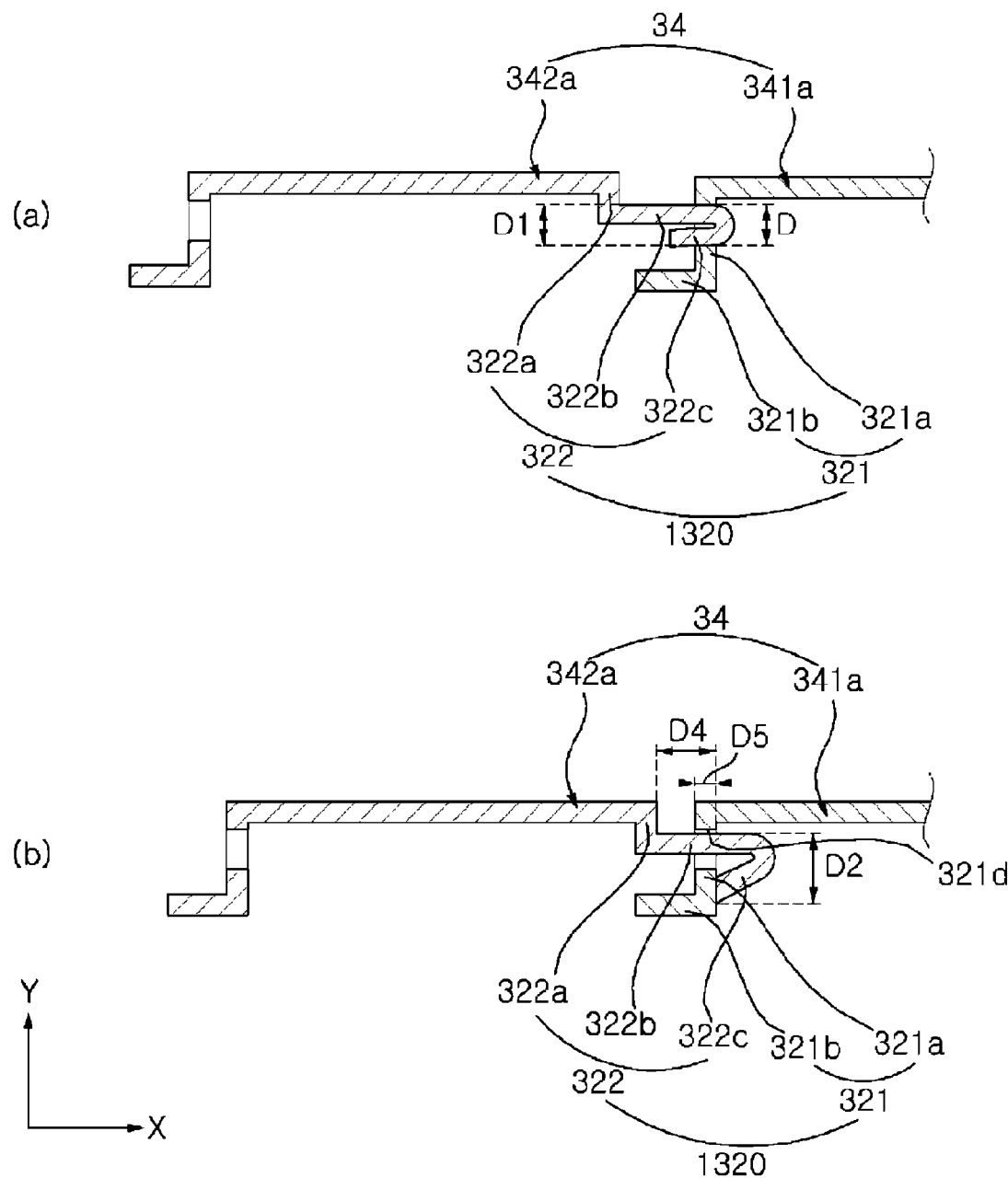
FIGS. 36(a) and 36(b) are cross-sectional views taken along line I-I of FIG. 35.

FIG. 35 is a perspective view partially illustrating a rear cover employed in a display apparatus according to another exemplary embodiment of the present invention. FIGS. 36(a) and 36(b) are cross-sectional views taken along line I-I of FIG. 35. For reference, FIG. 35 concretely illustrates a portion of the display apparatus corresponding to that of FIG. 6.

Referring to FIG. 35, the first fastening portion 321 in the rear cover 30 according to this embodiment includes a first protrusion part 2321a and an overlap part 2321b. Fastening holes 321d are formed through the first protrusion part 2321a. The first protrusion part 2321a and overlap part 2321b are identical or similar to those of the above-described embodiment, no detailed description thereof will be given. Alternatively, the first fastening portion 321 may further include an extension part ("321c" in FIG. 6) extending from an end of the overlap part 321b in a rearward direction in a bent state or toward the body of the divided section 34.

The second fastening portion 322 includes a second protrusion part 2322a and latches 2322b-2322c. The second protrusion part 2322a is identical or similar to that of the above-described embodiment, no detailed description thereof will be given. In this embodiment, each latch 2322b-2322c may include a first latch part 2322b extending from the second protrusion part 2322a in a bent state, to cross (for example, perpendicularly crossing) the first and second protrusion parts 2321a and 2322a of the first and second fastening portions 321 and 322, and a second latch part 2322c extending from the first latch part 2322b in a bent state in a direction inclined with respect to the first latch part 2322b. In this case, the first latch part 2322b may protrude in an outward direction of the second divided section 342a. The first and second latch parts 2322b and 2322c in this embodiment are identical or similar to those of the above-described embodiment, except that the extension directions of the first and second latch parts 2322b and 2322c differ from those of the above-described embodiment. Accordingly, the different matters will be mainly described.

For shape variation of the rear cover 30 in the above-described structure, it is necessary to provide a clearance in a direction that the divided sections 34 are spaced away from each other. To this end, the length difference D4 between the first latch part 2322b and the second latch part 2322c may be greater than the thickness D5 of the first protrusion part 2321a of the first fastening portion 321. In this case, accordingly, the divided sections 34 are be laterally movable by a distance corresponding to the length difference D4 between the first latch part 2322b and the second latch part 2322c.

The distance between the outer edge of the first latch part 2322b and the outer edge of the second latch part 2322c at the side of first ends of the first and second latch parts 2322b and 2322c (namely, at the side where the first and second latch parts 2322b and 2322c) has a first width D1 that is relatively small. On the other hand, the distance between the outer edge of the first latch part 2322b and the outer edge of the second latch part 2322c at the side of second ends of the first and second latch parts 2322b and 2322c (namely, at the side near the second protrusion part 2322a) has a second width D2 greater than the first width D1. The distance between the outer edge of the first latch part 2322b and the outer edge of the second latch part 2322c may be gradually increased in a direction from the first ends to the second ends.

The first width D1 may be equal to or smaller than the width D of each fastening hole 321d. The second width D2 may be greater than the width D of the fastening hole 321d.

As illustrated in FIGS. 36(a) and 36(b), it is possible to fasten the first and second divided sections 341a and 341b to each other by forcibly fitting the latches 2322b-2322c of the second fastening portion 322 into the corresponding fastening holes 321d of the first fastening portion 321. In this case, fitting force is applied in a direction parallel to the display module 10 in a state in which the second divided section 342a is disposed at one side of the first divided section 341a, in order to move the second divided section 342a toward the first divided section 341a.

In this case, each latch 322b-322c may be easily inserted into the corresponding fastening hole 321d because the first width D1 of the latch 322b-322c is equal to or smaller than the width D of the fastening hole 321d, as illustrated in FIG. 36(a). When fitting force is applied to the latch 322b-322c, the second latch part 322c is pushed to move toward the first latch part 322b and, as such, the distance between the second latch part 322c and the first latch part 322b is narrowed. As a result, the latch 322b-322c passes through the fastening hole 321d, as illustrated in FIG. 36(b). After passing through the fastening hole 321d, the second latch part 322c is moved away from the first latch part 322b and, as is such, recovered to have the second width D2. Since the second width D2 is greater than the width D of the fastening hole 321d, the second latch part 322c is disposed at the overlap part 321b and, as such, functions to prevent the latch 322b-322c from being separated from the fastening hole 321d.

In accordance with the above-described configuration, the first and second divided sections 341a and 342a are stably fastened to each other while allowing the distance between the first and second divided sections 341a and 342a to be variable. In this embodiment, the fastening holes 321d are formed through the first protrusion part 321a crossing (for example, perpendicularly crossing) the display module 10, and the latches 322b-322c are fitted into respective fastening holes 321d. Accordingly, the bodies of the first and second divided sections 341a and 342a are stably fixed at certain positions, respectively and, as such, it is possible to prevent a phenomenon in which at least one of the first and second divided sections 341a and 341b is biased toward the display module 10 or protrudes rearward.

Figure 37:
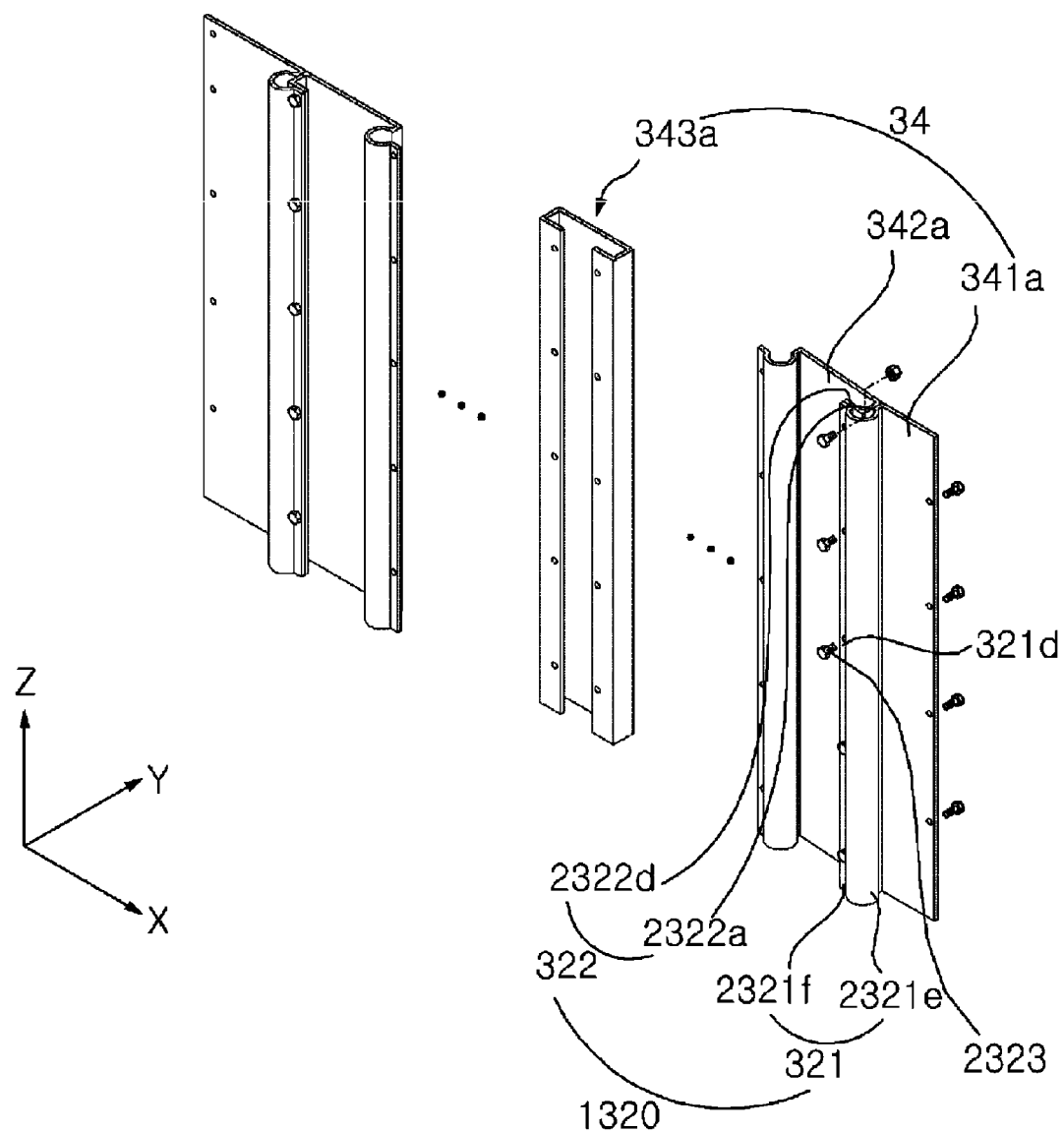
FIG. 37 is a perspective view partially illustrating a rear cover employed in a display apparatus according to another exemplary embodiment of the present invention.

FIG. 37 is a perspective view partially illustrating a rear cover employed in a display apparatus according to another exemplary embodiment of the present invention. For reference, FIG. 37 concretely illustrates a portion of the display apparatus corresponding to that of FIG. 6.

Referring to FIG. 37, the first fastening portion 321 formed at the first divided section 341a includes a curved part 321e and a first contact part 2321f. The second fastening portion 322 formed at the second divided section 342a includes a protrusion part 2322a and a second contact part 2322d. Each fastener 1320 according to this embodiment may further include fastening members 323 to fasten the first and second fastening portions 321 and 322.

In detail, the protrusion part 2322a of the second fastening portion 322 protrudes from one side of the second divided section 342a toward the display module 10. The second contact part 2322d of the second fastening portion 322 extends in a direction crossing the protrusion part 2322a after being bent from the protrusion part 2322a. In this case, the second contact portion 2322d may extend in a direction perpendicular to the protrusion part 2322a, to be parallel to the display module 10. Of course, the present invention is not limited to the above-described structures.

The curved part 2321e of the first fastening portion 321 extends from one side of the first divided section 341a adjacent to the second fastening portion 322 while having a curved shape. The first contact part 2321f of the first fastening portion 321 extends from the curved part 2321a while having a flat surface. The first contact part 2321f contacts the second contact part 2322d. The curved part 2321e is rounded while extending from one side of the first divided section 341a to the second contact part 2322d of the second divided section 342a such that the curved part 2321e is spaced from the protrusion part 2322a by a predetermined distance.

Fastening holes 2321d are formed through each of the first and second contact parts 2321f and 2322d. Fastening members 2323 (for example, screws) are fastened to the fastening holes 2321d, respectively, for fastening of the first and second fastening portions 321 and 322. Accordingly, the first and second contact parts 2321f and 2322d are fastened to each other.

Since the first fastening portion 321 and second fastening portion 322 are fastened only at the first and second contact parts 2321f and 2321d, the distance between the first divided section 341a and the second divided section 342a at the rear surfaces of the bodies of the first and second divided sections 341a and 342a is freely variable. In this case, since the curved part 2321e is round, it is possible to more easily vary the distance between the first divided section 341a and the second divided section 342a.

In this embodiment, it is possible to easily vary the distance between the first divided section 341a and the second divided section 342a by the curved part 2321e while stably fastening the first and second fastening portions 321 and 322 by the first and second contact parts 2321f and 2322d and the fastening members 2323. Fastening of the first and second fastening portions 321 and 322 can be easily and simply achieved by the fastening members 2323.

Figure 38:
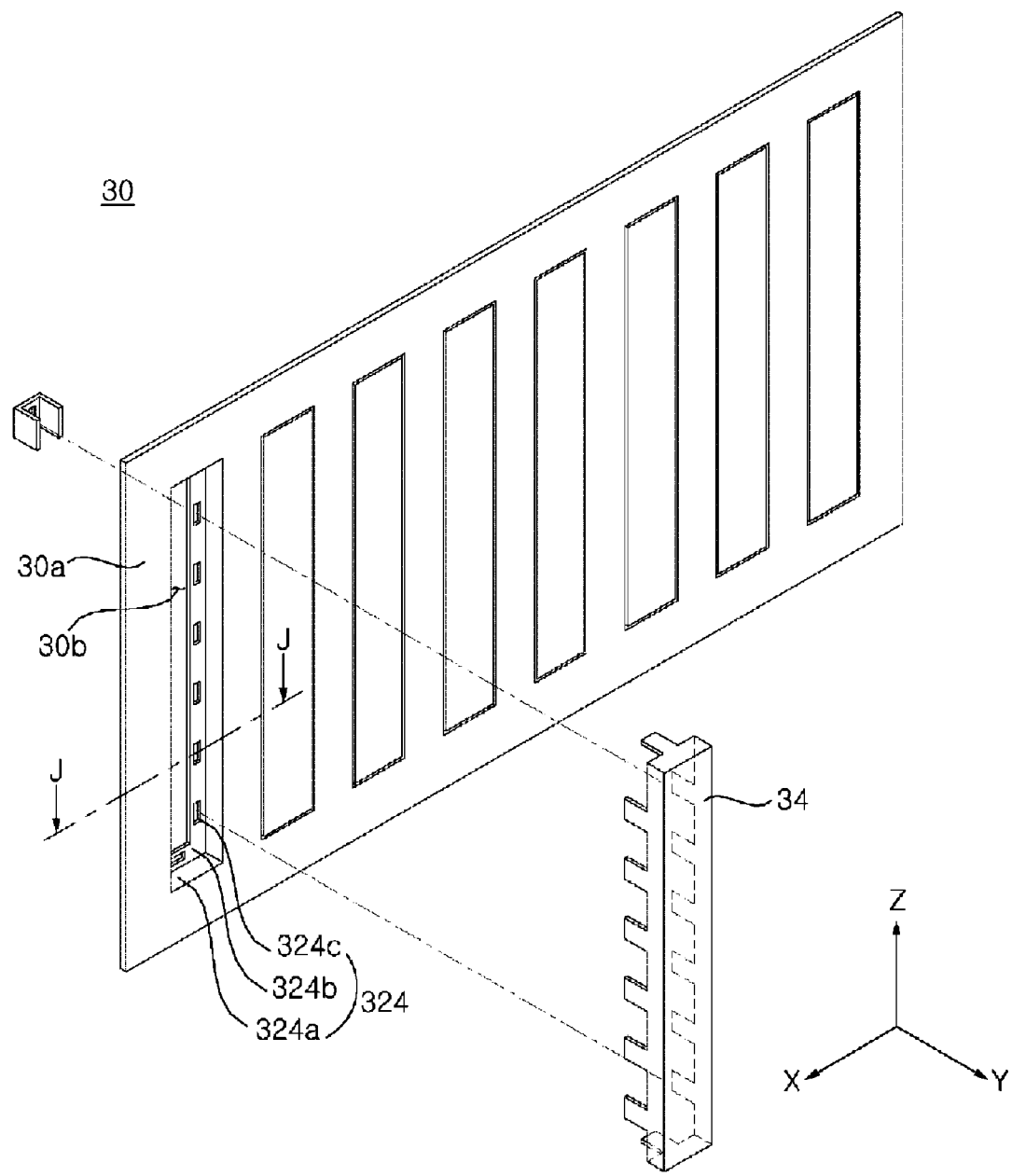
FIG. 38 is a perspective view partially illustrating a rear cover employed in a display apparatus according to another exemplary embodiment of the present invention.
Figure 39:
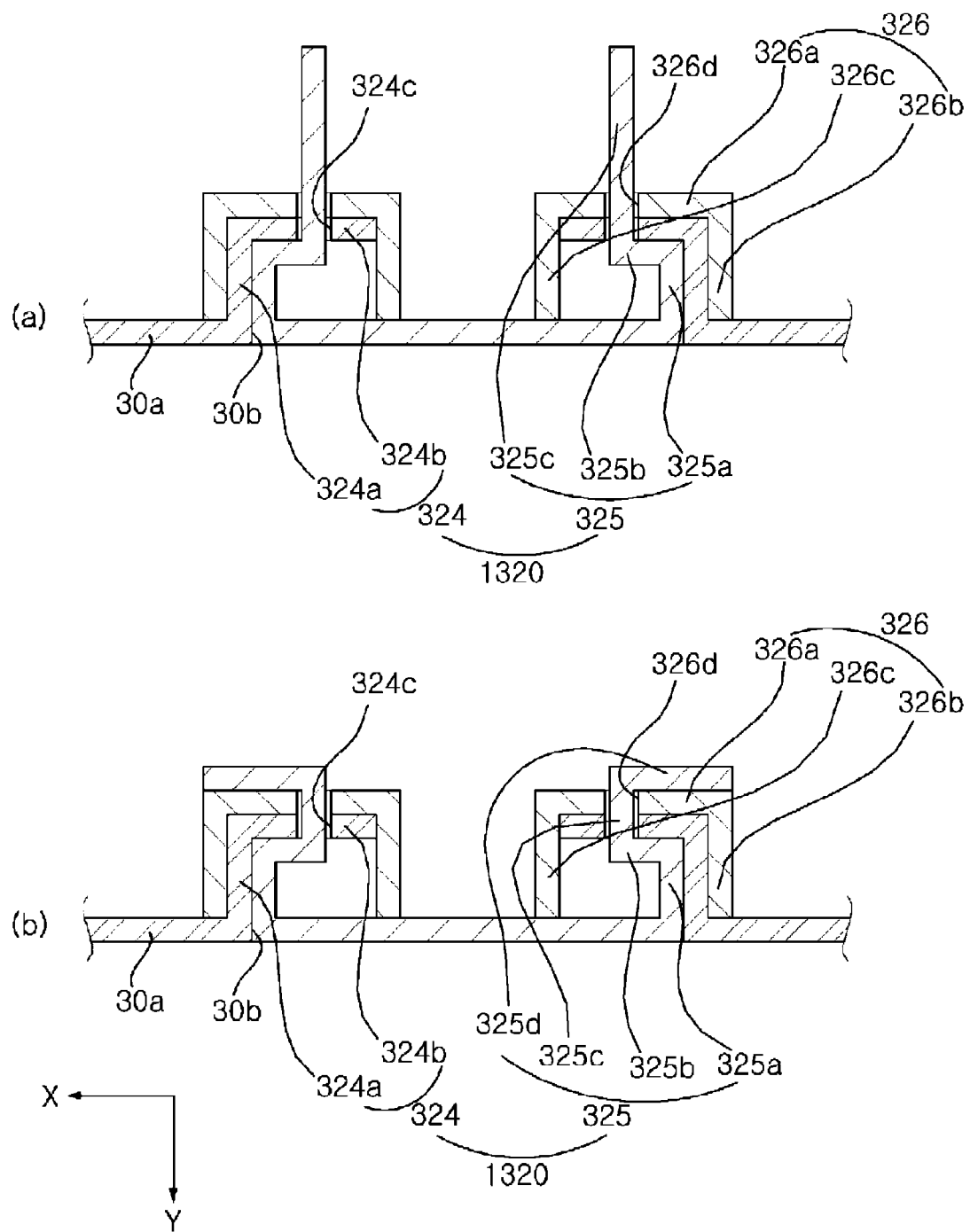
FIGS. 39(a) and 39(b) are cross-sectional views taken along line J-J of FIG. 38.

FIG. 38 is a perspective view partially illustrating a rear cover employed in a display apparatus according to another exemplary embodiment of the present invention. FIGS. 39(a) and 39(b) are cross-sectional views taken along line J-J of FIG. 38. For reference, FIG. 38 concretely illustrates a portion of the display apparatus corresponding to that of FIG. 6.

Referring to FIG. 38, the rear cover 30 includes a plate member 30a forming a basic outline of the rear cover 30 while including openings 30b corresponding to respective divided sections 34. The rear cover 30 also includes the divided sections 34, which cover respective openings 30b. The plate member 30a and divided sections 34 are fastened by fasteners 1320. The plural divided sections 34 are connected via the plate member 30a.

In more detail, each fastener 1320 includes first fastening portions 324 formed at the plate member 30a, and second fastening portions 325 formed at each divided section 34. Each fastener 1320 also includes third fastening portions 326 to fasten and lock the corresponding first and second fastening portions 324 and 325, for an enhancement in fastening stability of the first and second fastening portions 324 and 325.

Each first fastening portion 324 may include a first protrusion part 324a protruding toward the display module 10 at the corresponding opening 30b, and a first extension part 324b extending inward in the opening 30b after being bent from the first protrusion part 324a. The first extension part 324b is formed with a plurality of fastening holes 324c uniformly spaced apart from one another.

Each second fastening portion 325 may include a second protrusion part 325a protruding toward the display module 10 while contacting the corresponding first protrusion part 324a, a second extension part 325b extending inward in the opening 30b after being bent from the second protrusion part 325a, to contact the corresponding first extension part 324b, and insertion parts 325c bent from the second extension part 325b, and inserted into the corresponding fastening holes 324c, respectively. The second fastening portion 325 may further include locking parts 325d bent from respective insertion parts 325c in a finally fastened state, to extend in parallel to the first extension part 324b at the outside of the first extension part 324b, Each third fastening portion 326 has one end contacting the first fastening portion 324, and the other end having a bent shape, to contact the second fastening portion 325. The third fastening portion 326 may be in contact with the first fastening portion 324 and the locking parts 325d between the first fastening portion 324 and the locking parts 325d. In more detail, each third fastening portion 326 may include a horizontal part 326a to contact the extension part 324b of the corresponding first fastening portion 324, a first vertical part 326b extending from one side of the horizontal part 326a in a bent state, to contact the corresponding first fastening portion 324 at an end of the first vertical part 326b, and a second vertical part 326c extending from the other side of the horizontal part 326a in a bent state, to contact the corresponding second fastening portion 325 at an end of the second vertical part 326c. For example, each third fastening portion 326 may have a U-shaped cross-section. Each third fastening portion 326 may be bonded to the corresponding first fastening portion 324 and/or the corresponding second fastening portion 326 by an adhesive layer (not shown), to obtain enhanced structural stability.

The horizontal part 326a is formed with a fastening hole 326d corresponding to one fastening hole 324c of the corresponding first fastening portion 324, to receive one insertion part 325c of the corresponding second fastening portion 325. Each locking part 325d of each second fastening portion 325 may contact the outer surface of the horizontal part 326c of the corresponding third fastening portion 326. Thus, each divided section 34 may be fastened and locked to the plate member 30a by the corresponding locking parts 325d.

In this embodiment, the inner surface of each first vertical part 326b may contact an end of the first extension part 324b of the corresponding first fastening portion 324, and the inner surface of each second vertical part 326c may contact the first protrusion part 324a of the corresponding first fastening portion 324. Accordingly, fastening stability of the first and second fastening portions 324 and 325 is enhanced. For example, each third fastening portion 326 may be bonded to the corresponding first and second fastening portions 324 and 325 by an adhesive. Of course, the present invention is not limited to the above-described condition.

Hereinafter, fastening obtained by the first to third fastening portions 324, 325, and 326 will be described in more detail.

As illustrated in FIG. 39(a), the insertion parts 325c of the second fastening portion 325 are inserted into the fastening holes 324c and 326d under the condition that the third fastening portion 326 is in contact with the first fastening portion 324. Thereafter, a portion of each insertion part 325c protruding outwardly of the third fastening portion 326 is bent under the condition that the third fastening portion 326 is in contact with the first and second fastening portions 324 and 325, thereby forming the corresponding locking part 325d, as illustrated in FIG. 39(b). As a result, the first to third fastening portions 324, 325, and 326 are fastened.

In this embodiment, it is possible to easily vary the distance between the divided sections 34 at the outer surface side of the rear cover 30 because the first to third fastening portions 324, 325, and 326 are fastened in a position near the display module 10. Since the plate member 30a is employed in this embodiment, an integrated outer structure is provided and, as such, enhanced structural stability of the rear cover 30 is obtained. In addition, shape variation of the rear cover 30 can be easily carried out because the divided sections 34 are disposed at the openings 30b.

Figure 40:
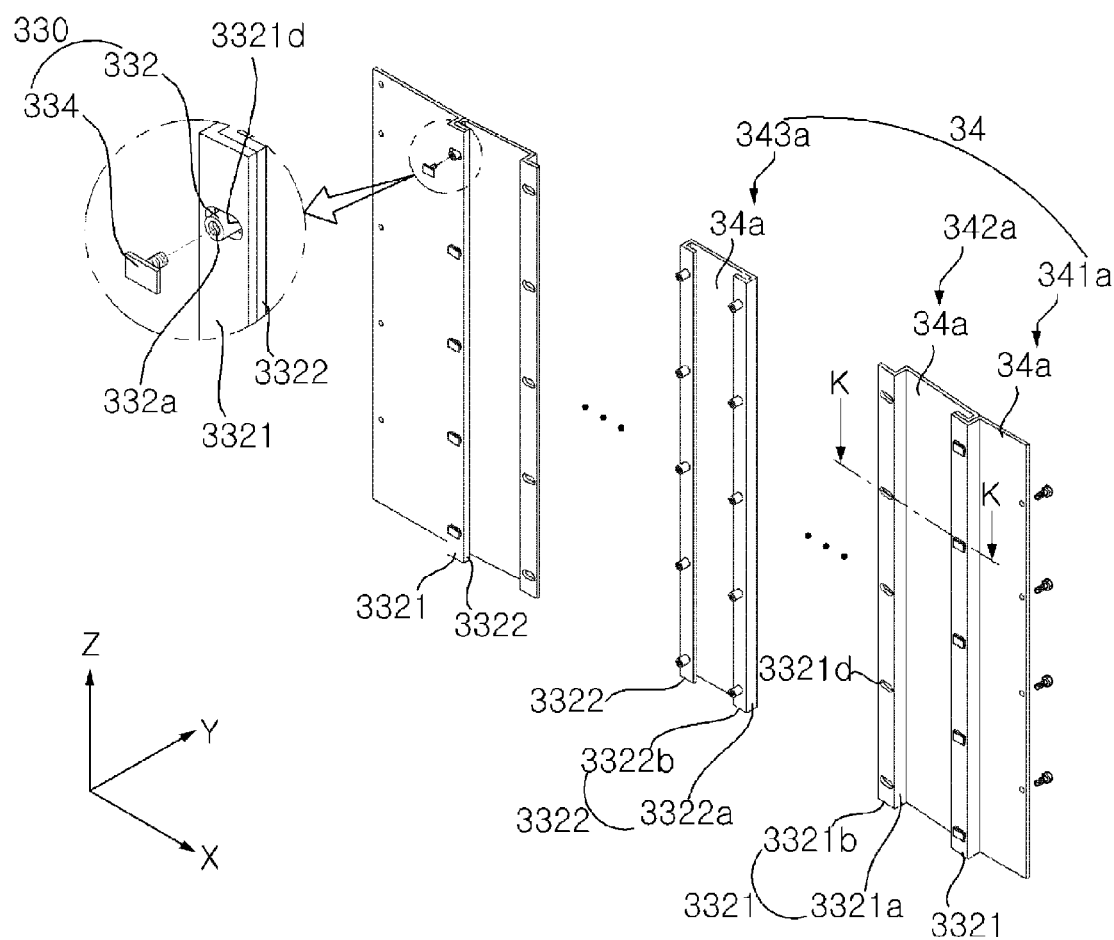
FIG. 40 is a perspective view illustrating bodies of divided sections according to another embodiment of the present invention.
Figure 41:
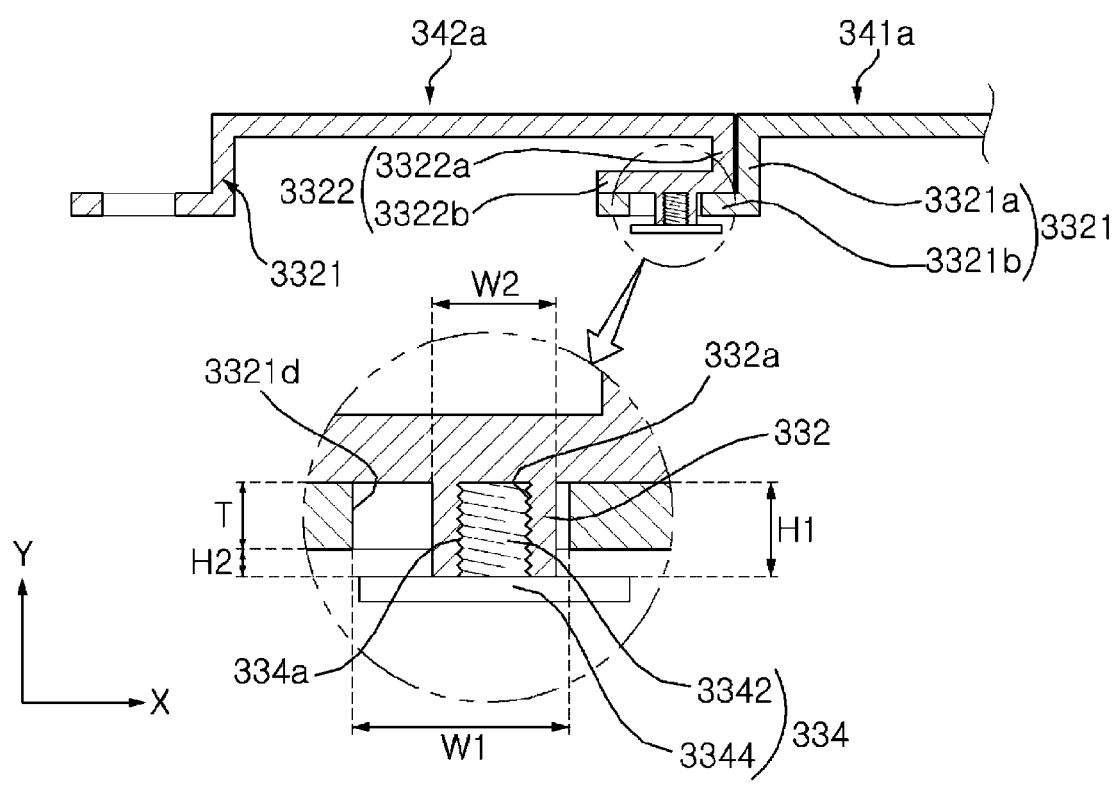
FIG. 41 is a cross-sectional view taken along line K-K of FIG. 40.
Figure 42:
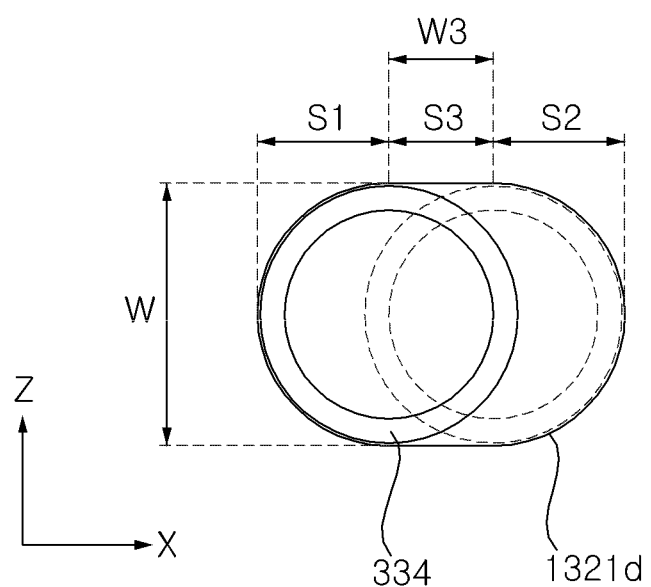
FIG. 42 is a plan view schematically illustrating fastening holes formed at each divided section illustrated in FIG. 40 and first fastening members.

FIG. 40 is a perspective view illustrating bodies of divided sections according to another embodiment of the present invention. FIG. 41 is a cross-sectional view taken along line K-K of FIG. 40. FIG. 42 is a plan view schematically illustrating fastening holes formed at each divided section illustrated in FIG. 40 and first fastening members.

Referring to FIGS. 40 and 41, each divided section 34 (in detail, the body 34a) includes fastening portions 3321 and 3322 to overlap with the neighboring divided sections 34, for fastening. Fastening members 330 are fastened to the fastening portions 3321 and 3322 of two neighboring divided sections 34, to movably fasten the two neighboring divided sections 34. For example, when it is assumed that two neighboring divided sections 34 are referred to as a first divided section 341a and a second divided section 342a, respectively, one first fastening portion 3321 is formed at the first divided section 341a, and one second fastening portion 3322 is formed at the second divided section 342a. Accordingly, the first divided section 341a and second divided section 342a may be movably fastened to each other by the fastening members 330 fastened to the first and second fastening portions 3321 and 3322.

In this embodiment, the first fastening portion 3321 may protrude from one side of the first divided section 341a toward the second divided section 342a, and may be provided with fastening holes 3321d. In more detail, the first fastening portion 3321 includes a first protrusion part 3321a protruding from one side of the first fastening portion 3321 adjacent to the second divided section 342a toward the display module 10, and a first overlap part 3321b extending from the first protrusion part 3321a in a bent state, to overlap with the second divided section 342a. A plurality of uniformly spaced fastening holes 3321d is formed at the overlap part 3321b. Although not shown, the first fastening portion 3321 may further include an extension part extending from an end of the overlap part 3321b in a rearward direction in a bent state or toward the second divided section 342a.

The first overlap part 3321b may extend while overlapping with the second divided section 342a by the first protrusion part 3321a, to cover a portion of the second divided section 342a. The fastening members 330 are fastened to the first overlap part 3321b through the fastening holes 3321d. The first overlap part 3321b also functions to hide the gap formed between the first divided section 341a and the second divided section 342a when the first and second divided sections 341a and 342a move away from each other, in order to prevent the gap from being recognized at the outside.

The second fastening portion 3322 may include a second protrusion part 3322a protruding from an end of the second fastening portion 3322 adjacent to the first divided section 341a toward the display module 10, and a second overlap part 3322b extending from the second protrusion part 3322a toward a central portion of the second divided section 342a, to overlap with the first overlap part 3322a. The second overlap part 3322b may be positioned to overlap with the first overlap part 3321b by the second protrusion part 3322a. For example, the second overlap part 3322b may overlap with the first overlap part 3321b, to be parallel to the first overlap part 3321b while contacting the first overlap part 3321b.

The fastening members 330 are fastened to the overlapping first and second overlap parts 3321b and 3322b. In more detail, each fastening member 330 may include a first fastening member 332 protruding from the second overlap part 3322b, to penetrate through a corresponding one of the fastening holes 3321d, and a second fastening member 334 to be inserted into the corresponding fastening hole 3321d from the side of the first fastening portion 3321, to be fastened to the first fastening member 332.

The first fastening member 332 may protrude from the second overlap part 3322b, to penetrate through the corresponding fastening hole 3321d of the first overlap part 3321b. In this case, the first fastening member 332 may be constituted by a nut formed with first threads 332a at an inner surface thereof. For example, the first fastening member 332 may be constituted by a pressing nut.

In FIGS. 40 and 41, the first fastening member 332 is illustrated as having a structure integrated with the second overlap part 3322b. When the first fastening member 332 is integrated with the second overlap part 3322b, it is possible to easily manufacture the second overlap part 3322b integrally formed with first fastening members 332 in the process of forming divided sections 34. When the first fastening member 332 is integrated with the second overlap part 3322b (that is, the fastening member 332 partially forming the second overlap part 3322b), as described above, fastening stability of the first fastening member 332 may be enhanced. Of course, the present invention is not limited to the above-described structure. The first fastening member 332 may be attached or assembled to the second overlap part 3322b after being manufactured separately from the second overlap part 3322b.

In this case, the first fastening member 332 may further protrude toward the display module 10 beyond the first overlap part 3321b of the first fastening portion 3321. That is, the height of the first fastening member 332, namely, a first height H1, is greater than the thickness T of the first overlap part 3321b. Here, the first height H1 may be a length measured between a surface of the second overlap part 3322b toward the display module 10 and an end of the first fastening member 332 toward the display module 10. Accordingly, the end of the first fastening member 332 toward the display module 10 is positioned closer to the display module than the surface of the first overlap part 3321b toward the display module 10. The first fastening member 332 protrudes from the first overlap part 3321b toward the display module 10 by a second height H2 corresponding to the difference between the first height H1 and the thickness T.

In this case, the second fastening member 334 fastened to the first fastening member 332 (in particular, a head 3344 of the second fastening member 334) may be positioned to form a certain gap between the first fastening member 332 and the second fastening member 334 (the gap corresponding to the second height H2) without contacting the first overlap part 3321b. Accordingly, the first fastening member 332 and first overlap part 3321b are positioned under the condition that no friction occurs between the first fastening member 332 and the first overlap part 3321b. Thus, when the spacing between the first divided section 341a and the second divided section 341b is increased or decreased during shape variation of the display module 10 (or the display panel 12) by the variable member 20, the first overlap part 3321b may be freely moved without being interfered by the second fastening member 334.

The ratio of the second height H2 of the portion of the first fastening member 322 protruding from the overlap part 3321b to the first height H1 of the first fastening member 332, namely, H2/H1, may be 0.2 to 0.4. When the ratio H2/H1 is less than 0.2, it may be difficult to prevent interference of the first fastening member 332 with the first overlap part 3321b because the second height H2 is relatively small. On the other hand, when the ratio H2/H1 is more than 0.4, structural stability of the rear cover may be degraded because the second height H2 is relatively great. In this case, noise may be generated due to vibrations when external impact is applied to the display apparatus. Alternatively, the second height H2 may be 0.1 to 1 mm. When the second height H2 is smaller than 0.1 mm, it may be difficult to prevent interference of the first fastening member 332 with the first overlap part 3321b because the second height H2 is relatively small. On the other hand, when the second height H2 is greater than 1 mm, structural stability of the rear cover may be degraded because the second height H2 is relatively great. In this case, noise may be generated due to vibrations when external impact is applied to the display apparatus.

Of course, the present invention is not limited to the above-described conditions. For example, the second height H2, and the ratio of the second height H2 to the first height H1 are diversely variable.

Fastening of the second fastening member 334 to the first fastening member 332 may be achieved by inserting the second fastening member 334 toward the first fastening member 332 from the side of the first overlap part 3321*b* of the first fastening portion 3321 or the side of display module 10, and then fastening the second fastening member 334 to the first fastening member 332. For example, the second fastening member 334 may be constituted by a bolt to be fastened to the first fastening member 332, which is a nut.

In more detail, the second fastening member 334 may include a threaded portion 3342 formed with second threads 334*a* to be engaged with the first threads 332*a*, which is formed at the first fastening member 332, and a head portion 3344 connected to the threaded portion 3342 while having a greater cross-sectional area than the threaded portion 3342. The threaded portion 3342 is a portion to be fastened to the first fastening member 332. The head portion 3344 has a greater vertical width and/or horizontal width than the fastening hole 3321*d* of the first overlap part 3321*b* and, as such, the first overlap part 3321*b* provided with the fastening hole 3321*d* may be fastened between the second overlap part 3322*b* and the head portion 3344.

In this embodiment, the width of the fastening hole 3321*d*, namely, a first width W1, may be greater than the width of the first fastening member 332, namely, a second width W2. Here, "width" means a length measured in a lateral direction of the display module 10. Since the first width W1 of the fastening hole 3321*d* is greater than the second width W2 of the first fastening member 332, the first fastening member 332 may be laterally moved within the fastening hole 1321*d*.

Referring to FIG. 42, the fastening hole 3321*d* may include a first hole portion S1 having a shape corresponding to one side of the first fastening member 334, a second hole portion S2 corresponding to the other side of the first fastening member 334, and a surplus hole portion S3 arranged between the first hole portion S1 and the second hole portion S2. The surplus hole portion S3 may have a vertical width corresponding to a vertical width of the first fastening member 334 while having a horizontal width corresponding to a movable distance of the first fastening member 334, namely, a third width W3. In this case, the difference between the first width W1 and the second width W2 corresponds to the third width W3. Since the fastening hole 3321*d* includes the surplus hole portion S3, the first fastening member 334 is laterally movable by a distance corresponding to the third width W3.

In FIG. 42, the first fastening member 334 is illustrated as having a circular planar shape. In this case, the first hole portion S1 may have a semicircular shape, the second hole portion S2 may have a semicircular shape, and the third hole portion S3 may have a quadrangular shape. Of course, the present invention is not limited to the above-described structures. For example, the shapes of the first to third hole portions S1, S2, and S3, and etc. are diversely variable, taking into consideration the shapes of the first fastening member 334.

For example, the ratio of the first width W1 of the fastening hole 3321*d* to the second width W2 of the first fastening member 334, namely, W1/W2, may be 1.2 to 1.8. When the ratio W1/W2 is less than 1.2, shape variation of the rear cover 30 may not be smoothly carried out during shape variation of the display module 10 because the lateral movement distance of the first fastening member 334 is insufficient. On the other hand, when the ratio W1/W2 is more than 1.8, structural stability is degraded because the fastening hole 3321*d* is unnecessarily great. In this case, the fastening hole 3321*d* may be externally exposed. For this reason, it may be necessary to increase the size of the head portion 3344. The value obtained by deducting the second width W2 of the first fastening member 334 from the first width W1 of the fastening hole 3321*d* (namely, the third width W3 of the third hole portion S3) may be 0.1 to 1.0 mm. When the third width W3 is smaller than 0.1 mm, shape variation of the rear cover 30 may not be smoothly carried out during shape variation of the display module 10 because the lateral movement distance of the first fastening member 334 is insufficient. On the other hand, when the third width W3 is greater than 10 mm, structural stability is degraded because the fastening hole 3321*d* is unnecessarily great. In this case, the fastening hole 3321*d* may be externally exposed. For this reason, it may be necessary to increase the size of the head portion 3344.

Of course, the present invention is not limited to the above-described conditions. The first width W1, second width W2, and third width W3, and the ratio thereof are diversely variable.

Since the first fastening member 334 is movable by a predetermined distance within the fastening hole 3321*d* after completion of fastening, the first and second divided sections 341*a* and 342*a* are movable with respect to each other to increase or decrease the distance therebetween while being stably fastened to each other. Accordingly, it is possible to effectively cope with a variation in the distance between the divided sections 34 and width variation of the divided portions.

The first and second fastening members 332 and 334 are fastened to each other, to fasten and connect plural divided sections 34, and, as such, the rear cover 30 may have an integrated structure. When a bolt and a nut are used as the first and second fastening members 332 and 334, respectively, a more simple and firm fastening structure may be obtained.

In this case, each of the divided sections 34 disposed at respective outermost lateral sides may be provided, at an outer edge thereof, with fixing parts (for example, screw holes) for fixing of the divided section 34 to the frame 160. The first fastening portion 3321 or second fastening portion 3322 may be provided at an inner edge of the outermost divided section 34. The divided section 34, which is centrally disposed, namely, a central divided section 343*a*, is provided, at each lateral edge thereof, with one of the first and second fastening portions 3321 and 3322. Each of the divided sections 34 disposed between the central divided section 343*a* and each outermost divided section 34 may be provided, at one lateral edge thereof, with the first fastening portion 3321 while being provided, at the other lateral edge thereof, with the second fastening portion 3322. In accordance with the above-described structures, it is possible to connect the plural divided sections 34 in order to form an integrated structure.

FIG. 40 illustrates that the first fastening portion 3321 is provided at the inner edge of each outermost divided section 34, the second fastening portion 3322 is provided at each lateral edge of the central divided section 343*a*, and each of the divided sections 34 disposed between the central divided section 343*a* and each outermost divided section 34 is provided, at outer edge thereof, with the second fastening portion 3322 while being provided, at the inner edge thereof, with the first fastening portion 3321. In this case, it is possible to assembly the rear cover 30 by sequentially fastening the divided sections 34, starting from each outermost divided section 34, and then fastening the central divided section 343*c* to the fastened structures. Accordingly, the manufacturing process is simplified. In addition, enhanced structural stability is obtained because the divided sections 34 have a symmetrical structure with respect to the central divided section 343c. Furthermore, it is possible to easily manufacture the rear cover 30 having the plural divided sections 34, using a family mold.

The divided sections 34 of the rear cover 30 should include a material having strength enabling the divided sections 34 to constitute the rear surface of the display apparatus 100 while being light in weight and easily shape-variable. The divided sections 34 may include various metals, resins or the like. As metals, aluminum or the like that is light in weight while being suitable for shape variation may be employed. As resins, rubber or the like may be employed. In this embodiment, the first and second fastening portions 3321 and 3322 may be formed to be integrated with the corresponding divided section 34, to constitute portions of the divided section 34. In this case, it is possible to simplify the structure and manufacturing process. Of course, the present invention is not limited to the above-described conditions. Various modifications may be possible. For example, the fastening portions 3321 and 332 are manufactured to be separate from the divided sections 34, and are subsequently fixed to the divided sections 34. The first and second overlap parts 3321b and 3322b, to which respective fastening members 332 and 334 are fastened, are formed to have certain steps by the first and second protrusion parts 3321 and 3322a so as to be spaced from the bodies 34a of the divided sections 34, respectively. Of course, the present invention is not limited to the above-described structures. Various modifications may be possible. For example, the first and second protrusion parts 3321a and 3322a may be eliminated and, as such, no step may be formed.

The above-described shape variation of the display apparatus 100 will be described in more detail with reference to FIGS. 43(a) and 43(b). FIGS. 43(a) and 43(b) are views explaining shape variation of the display apparatus according to an exemplary embodiment of the present invention.

The display module 10 is kept in a flat state, as shown in FIG. 43(a), under the condition that there is no force applied to the display module 10. When the user inputs a command for shape variation of the display module 10, the display module 10 is varied into a curved structure having a certain curvature (for example, a curved structure having a uniform radius of curvature R) in the lateral direction of the display module 10, as shown in FIG. 43(b). Thus, the display module 10 has a curved structure capable of providing an enhancement in sensory immersion of the user. In this case, the rear cover 30 fixed to the display module 10 is also varied in shape to have a curved surface. Since the divided sections 34 are connected by the fastening members 330 under the condition that the distance between the neighboring divided sections 34 or the distance between the adjacent divided portions 32 is easily adjustable, shape variation of the rear cover 30 can be easily achieved. When the user inputs a command to again vary the shape of the display apparatus 100 to return to its original shape, the varying section 22 is returned to its original state thereof, as shown in FIG. 43(a).

As described above, in this embodiment, plural divided sections 34 are fastened in a connected state by the fastening members 330 and, as such, the rear cover 30 has an integrated structure. Accordingly, it is possible to simplify the structure of the rear cover 30 while achieving easy handling of the rear cover 30. When a bolt and a nut are used as the first and second fastening members 332 and 334, respectively, a more simple and firm fastening structure may be obtained. When shape variation of the display module 10 occurs, it is also possible to correspondingly vary the shape of the rear cover 30 by limiting the widths and heights of the first and second fastening members 322 and 334 and fastening holes 1321d. In addition, the first and second fastening members 332 and 334 are positioned at the first and second overlap parts 3321 and 3322b of the first and second fastening portions 3321 and 3322 overlapping with each other at the inside of the outer surface of the rear cover 30 and, as such, the fastening holes 3321d are kept in a hidden state during shape variation of the rear cover 30.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
a display module including a display panel to display an image and; a support member disposed at a rear surface of the display panel;
a variable member to provide force capable of varying a shape of the support member; and
a rear cover located on a rear side of the support member, wherein the rear cover is fixed to at least one of edges of the display module,
the rear cover varies with a shape of the display module,
the rear cover provides a space between a middle portion of the display module and an inner surface of the rear cover, and
the variable member is fixed to the display module and is disposed in the space between the middle portion of the display module and the inner surface of the rear cover; and
the rear cover comprises a plurality of divided sections;
the plurality of divided sections comprises a first divided section and a second divided section that neighbor each other;
the first divided section comprises an outer portion forming an outer surface of the rear cover, and an overlap portion extending from a side of the outer portion neighboring the second divided section, to overlap with the second divided section; and
the overlap portion includes a step corresponding to a thickness of the second divided section and extending along an inner portion of the second divided section forming an inner surface of the rear cover; and
the display apparatus further comprises a covering member comprising fitting protrusions fitted in grooves formed at distal ends of the divided sections.

2. The display apparatus according to claim 1, wherein the plurality of divided sections are defined by divided portions, and each of the divided portions is a space between neighboring ones of the divided sections.

3. The display apparatus according to claim 1, wherein:
when the variable member bends the display panel in a first direction, the divided sections are elongated in a second direction crossing the first direction.

4. The display apparatus according to claim 1, further comprising a frame disposed along the at least one of edges of the support member, wherein the rear cover is fixed to the frame.

5. The display apparatus according to claim 4, wherein the variable member bends the display module in a first direction, and the frame includes first frames fixed to respective edges of the display module in a second direction crossing the first direction, wherein edges of the rear cover in the second direction are fixed to the respective first frames.

6. The display apparatus according to claim 4, wherein the variable member bends the display module in a first direction, and the frame includes second frames fixed to respective edges of the display in the first direction, wherein edges of the rear cover in the first direction are fixed to the respective second frames.

7. The display apparatus according to claim 1, wherein:

when the variable member bends the display panel in a first direction, the divided sections are elongated in a second direction crossing the first direction.

8. The display apparatus according to claim 7, wherein the plurality of divided sections have different widths.

9. The display apparatus according to claim 1, further comprising:

a fabric member for covering an outer surface of the rear cover.

10. The display apparatus according to claim 1, wherein the plurality of divided sections are fastened by fasteners.

11. The display apparatus according to claim 10, wherein:

each of the fasteners comprises a first fastening portion formed at a side of the first divided section adjacent the second divided section, and a second fastening portion formed at a side of the second divided section adjacent to the first divided section, to be fastened to the first fastening section, wherein:

the first fastening portion comprises a fastening hole; and the second fastening portion comprises a latch fitted in the fastening hole in a locked state.

12. The display apparatus according to claim 1, wherein:

the plurality of divided sections are connected by fastening members; and each of the fastening members comprises a first fastening member and a second fastening member.

13. The display apparatus according to claim 12, wherein:

the first divided section comprises a first fastening portion formed at a side of the first divided section adjacent the second divided section;

the second divided section comprises a second fastening portion formed at a side of the second divided section adjacent to the first divided section;

the first fastening portion comprises a fastening hole; and each of the fastening members comprises a first fastening member protruding from the second fastening portion, to penetrate through the fastening hole, and a second fastening member inserted into the fastening hole at a side of the first fastening portion, and fastened to the first fastening member.

* * * * *